US012183620B2

(12) United States Patent
Chew et al.

(10) Patent No.: US 12,183,620 B2
(45) Date of Patent: Dec. 31, 2024

(54) APPARATUS AND METHOD FOR BONDING A PLURALITY OF DIES TO A CARRIER PANEL

(71) Applicant: PYXIS CF PTE. LTD., Singapore (SG)

(72) Inventors: Hwee Seng Chew, Singapore (SG); Amlan Sen, Singapore (SG); Li Jiang Huang, Singapore (SG); Siew Wen Lee, Singapore (SG); Qing Feng Guan, Singapore (SG); Wai Hoe Lee, Singapore (SG); Kin Fei Chooi, Singapore (SG)

(73) Assignee: PYXIS CF PTE. LTD., Singapore (SG)

( * ) Notice: Subject to any disclaimer, the term of this patent is extended or adjusted under 35 U.S.C. 154(b) by 556 days.

(21) Appl. No.: 17/487,744

(22) Filed: Sep. 28, 2021

(65) Prior Publication Data
US 2022/0102189 A1    Mar. 31, 2022

(30) Foreign Application Priority Data
Sep. 28, 2020    (SG) .......................... 10202009617X

(51) Int. Cl.
*H01L 21/68*    (2006.01)
*H01L 21/67*    (2006.01)
*H01L 21/687*    (2006.01)

(52) U.S. Cl.
CPC .. *H01L 21/68764* (2013.01); *H01L 21/67132* (2013.01); *H01L 21/681* (2013.01); *H01L 21/682* (2013.01); *H01L 2221/68309* (2013.01)

(58) Field of Classification Search
CPC ......... H01L 21/67132; H01L 21/67144; H01L 21/68728; H01L 21/68764; H01L 2221/68309
See application file for complete search history.

(56) References Cited

U.S. PATENT DOCUMENTS

| 7,727,800 B2 | 6/2010 | Wan et al. |
|---|---|---|
| 8,633,441 B2 | 1/2014 | Wang et al. |

(Continued)

FOREIGN PATENT DOCUMENTS

| CN | 107887295 A | 4/2018 |
|---|---|---|
| JP | 2004-265952 A | 9/2004 |

(Continued)

OTHER PUBLICATIONS

Office Action and Search Report dated Mar. 27, 2023 in related Taiwan Application No. 110136119 filed Sep. 28, 2021 (21 pages) with Google machine translation of Office Action (11 pages).

(Continued)

*Primary Examiner* — Jaehwan Oh
(74) *Attorney, Agent, or Firm* — Daniel F. Nesbitt; Nesbitt IP LLC

(57) ABSTRACT

A die bonding apparatus having: a carrier support unit having at least one support element defining a supporting plane and a carrier holder operable to support the carrier panel on a side of the supporting plane with the carrier panel being parallel to the supporting plane, a wafer feed unit having a wafer holder operable to hold a diced wafer in a manner so as to space the diced wafer apart from the supporting plane defined by the at least one support element of the carrier support unit and orient the diced wafer with an exposed surface of the diced wafer facing the side of the supporting plane to which the carrier panel is supported, and a die transfer module disposed between the carrier support unit and the wafer feed unit, the die transfer module operable to transfer a die from the diced wafer to the carrier panel.

15 Claims, 23 Drawing Sheets

(56) References Cited

U.S. PATENT DOCUMENTS

| | | |
|---|---|---|
| 11,600,515 B2 * | 3/2023 | Jeong .................. H01L 21/6732 |
| 11,887,876 B2 * | 1/2024 | Han ..................... B65G 47/848 |
| 2003/0136523 A1 | 7/2003 | Takahashi |
| 2005/0072831 A1 | 4/2005 | Haji |
| 2006/0185157 A1 | 8/2006 | Shida et al. |
| 2014/0052289 A1 | 2/2014 | Oowada |
| 2014/0352141 A1 | 12/2014 | Yasuyoshi |
| 2015/0155254 A1 | 6/2015 | Schmidt-Lange et al. |
| 2020/0083193 A1 | 3/2020 | Sen |
| 2020/0144218 A1 | 5/2020 | Wang et al. |
| 2021/0060798 A1 * | 3/2021 | Jeong ................ H01L 21/67132 |
| 2022/0277980 A1 * | 9/2022 | Han .................... H01L 21/6838 |

FOREIGN PATENT DOCUMENTS

| | | |
|---|---|---|
| JP | 3569820 B2 | 9/2004 |
| JP | 2006196618 A | 7/2006 |
| JP | 4161747 B2 | 10/2008 |
| JP | 2009-283517 A | 12/2009 |
| KR | 10-0861050 B1 | 9/2008 |
| KR | 20210112737 A * | 9/2021 |
| TW | 538657 | 6/2003 |
| TW | 201740793 A | 11/2017 |
| TW | 201801208 A | 1/2018 |
| TW | 202014074 A | 4/2020 |
| TW | M594806 U | 5/2020 |
| WO | 98/58403 A1 | 12/1998 |
| WO | 2010024679 A1 | 3/2010 |
| WO | 2014157134 A1 | 10/2014 |

OTHER PUBLICATIONS

Non-final Office Action dated May 23, 2023 in related U.S. Appl. No. 16/565,589, filed Sep. 10, 2019 (13 pages).

* cited by examiner

APPARATUS AND METHOD FOR BONDING A PLURALITY OF DIES TO A CARRIER PANEL

CROSS REFERENCES TO RELATED APPLICATIONS

The present application claims the benefit of the Singapore Patent Application No. 10202009617X filed on Sep. 28, 2020, the entire contents of which are incorporated herein by reference for all purposes.

TECHNICAL FIELD

Various embodiments generally relate to a die bonding apparatus or a die bonder. In particular, various embodiments generally relate to a die bonding apparatus or a die bonder for bonding a plurality of semiconductor dies from a diced wafer to a carrier panel, for example, in a panel level packaging process for a panel-based semiconductor assembly. Various embodiments also generally relate to a method of bonding a plurality of dies to a carrier panel with a die bonding apparatus or a die bonder. In particular, various embodiments generally relate to a method of bonding a plurality of dies to a carrier panel with a die bonding apparatus or a die bonder, for example, in a panel level packaging process for a panel-based semiconductor assembly.

BACKGROUND

Panel level packaging (PLP) of devices have garnered significant interest in recent years. This is due to the larger volume of dies which can be packaged in parallel compared to conventional wafer level or substrate level packaging techniques. PLP typically involves attaching individual dies on a large Carrier for die bonding. This increases packaging throughput as well as reducing costs. However, with the added benefits comes along drawbacks, such as, dust management on the panel surface, ability to inspect the dies after being bonded, low through-put of the process of die bonding on panel, loss of total machine utilization time due to wafer changeover.

Accordingly, there is a need for a more effective and efficient apparatus and method to bond a plurality of dies on a carrier panel for a panel level packaging process.

SUMMARY

According to various embodiments, there is provided a die bonding apparatus including: a carrier support unit having at least one support element defining a supporting plane and a carrier holder operable to hold a carrier panel against the at least one support element to support the carrier panel on a side of the supporting plane with the carrier panel being parallel to the supporting plane; a wafer feed unit having a wafer holder operable to hold a diced wafer in a manner so as to space the diced wafer apart from the supporting plane defined by the at least one support element of the carrier support unit and orient the diced wafer with an exposed surface of the diced wafer facing the side of the supporting plane to which the carrier panel is supported; and a die transfer module disposed between the carrier support unit and the wafer feed unit, the die transfer module operable to pick up a die from the diced wafer held by the wafer feed unit and place the die on the carrier panel held by the carrier support unit for bonding the die to the carrier panel.

According to various embodiments, there is provided a die bonder for bonding a plurality of semiconductor dies from a diced wafer to a carrier panel, including: a support structure having a base support surface for resting on a surface to which the die bonder is supported; a wafer feed unit configured to erect the diced wafer with a wafer surface thereof substantially vertical with respect to the base support surface; a bond unit having a carrier holder configured to hold the carrier panel with a bonding surface thereof substantially vertical with respect to the base support surface; a die transfer module disposed between the wafer feed unit and the die bond unit, the die transfer module being configured to transfer the plurality of dies from the diced wafer to the carrier panel; and a vision system for observing operation of the die bonder to provide feedback for controlling the wafer feed unit, the die bond unit and the die transfer module.

According to various embodiments, there is provided a method of bonding a plurality of dies to a carrier panel with a die bonder, including: picking a die, via a die transfer module of the die bonder, from a diced wafer held by a wafer feed unit of the die bonder having a wafer holder holding the diced wafer in a manner so as to space the diced wafer apart from a carrier panel held by a carrier support unit of the die bonder and orient the diced wafer with an exposed surface of the diced wafer facing a bonding surface of the carrier panel; and placing the die, via the die transfer module, on the bonding surface of the carrier panel held by the carrier support unit for bonding the die to the bonding surface of the carrier panel, wherein the die transfer module is disposed between the carrier support unit and the wafer feed unit.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments are described with reference to the following drawings, in which.

DETAILED DESCRIPTION

Figure 1:
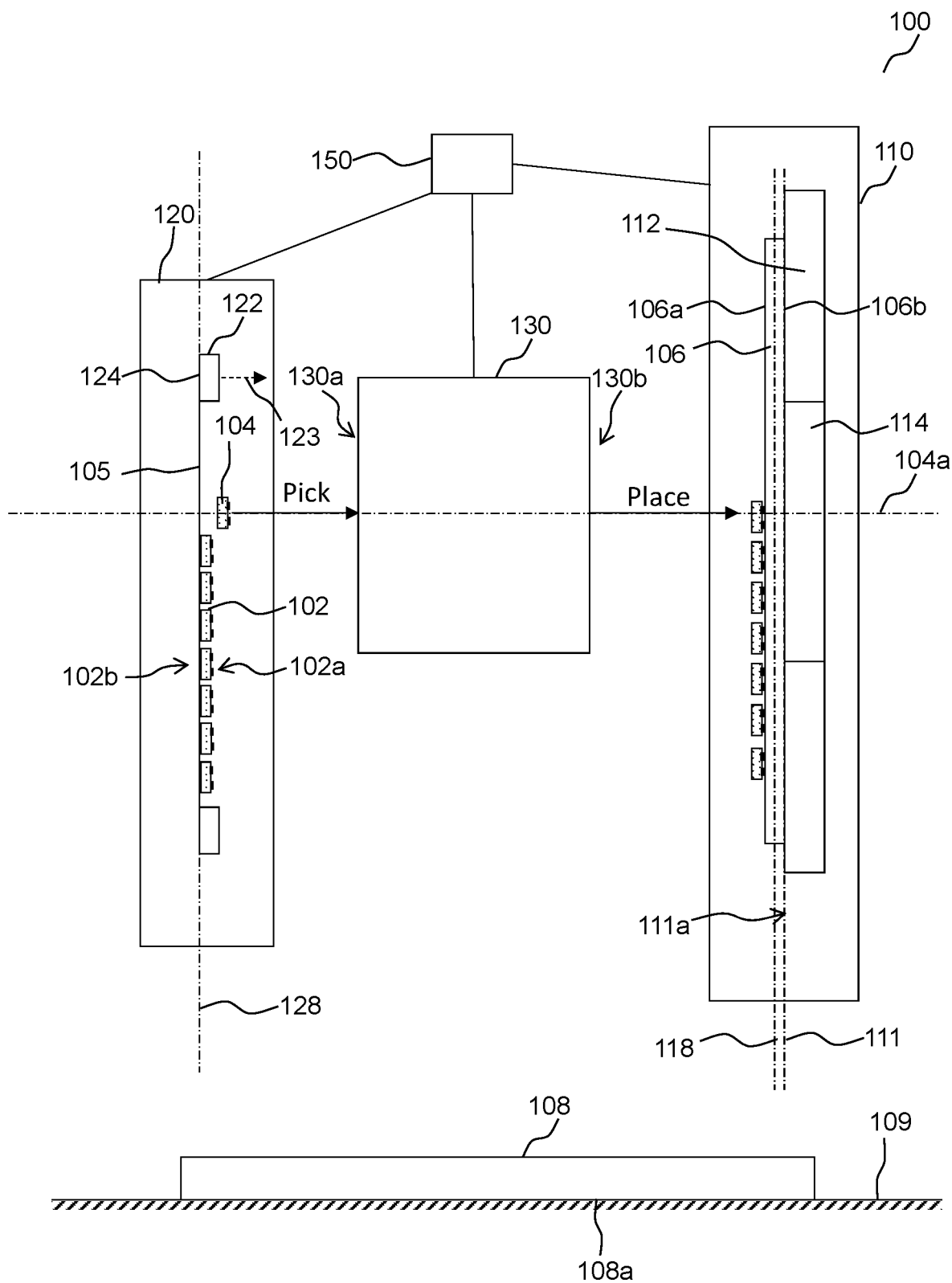
FIG. 1 shows a side view of a schematic diagram of a die bonding apparatus or a die bonder according to various embodiments.

Embodiments described below in the context of the apparatus are analogously valid for the respective methods, and vice versa. Furthermore, it will be understood that the embodiments described below may be combined, for example, a part of one embodiment may be combined with a part of another embodiment.

It should be understood that the terms "on", "over", "top", "bottom", "down", "side", "back", "left", "right", "front", "lateral", "side", "up", "down" etc., when used in the following description are used for convenience and to aid understanding of relative positions or directions, and not intended to limit the orientation of any device, or structure or any part of any device or structure. In addition, the singular terms "a", "an", and "the" include plural references unless context clearly indicates otherwise. Similarly, the word "or" is intended to include "and" unless the context clearly indicates otherwise.

Various embodiments seek to provide an efficient and effective die bonding apparatus and methods for bonding a plurality of semiconductor dies from a diced wafer to a carrier panel. Various embodiments may have the ability to induce less dust on the carrier panel (e.g. less dust stuck on the sticky tape on the carrier panel), less time loss during wafer changing, and/or increase the overall die bonding throughput (e.g. increase in the number of die being bonded per unit time).

Various embodiments seek to include a secondary inspection arrangement (e.g. a sensing arrangement) for inspecting the placement accuracy of the dies during the die bonding process in addition to the primary inspection conducted after die bonding on the entire carrier panel is completed. Accordingly, the inaccuracy of die placement for the entire panel may be detected in advance before die bonding of the entire carrier panel is completed. Thus, the risks and/or time wastage of continuing to complete the die bonding for the entire carrier panel may be reduced, minimized or eliminated.

Various embodiments seek to avoid silicon dust and/or other particles contaminating the carrier panel via gravity (e.g. silicon dust and/or particles falling by gravity on the carrier panel with sticky tape). Accordingly, various embodiments seek to provide a dust solution to avoid dust accumulation or collection during die bonding of the carrier panel. According to various embodiments, the carrier panel may be mounted on a vertical plane with respect to a ground. Further, the carrier panel may be movable along the X-axis (i.e. laterally) and the Z-axis (i.e. vertically). According to various embodiments, the carrier panel may use tape as a temporary adhesion for the bonding of die to the carrier panel. Hence, the usage of the tape may allow the carrier panel to be mounted vertically. Thus, in various embodiments, the occurrences of the fall of silicon dust and/or other particles by gravity to contact the sticky surface of the tape mounted on the carrier panel may be eliminated or minimized.

Various embodiments seek to reduce the travel distance for the die to move from the wafer to the carrier panel for die bonding so as to reduce the time for completing die bonding of the entire carrier panel and to reduce or minimize the inaccuracy positioning of die due to long travel distance/strokes in conventional method. According to various embodiments, the die may move perpendicularly between the wafer and the carrier panel. Accordingly, the die may move along a horizontal plane perpendicular to the wafer and the carrier panel. In this manner, the die may not be required to travel across or over a surface area of the wafer and/or a surface area of the carrier panel for die bonding. In particular, various embodiments seek to provide a shortest travel distance so as to enable a high throughput. According to various embodiments, the wafer and the carrier panel may be mounted vertically with respect to the ground to enable the shortest travel distance of the die (or chip) from the wafer to the carrier panel. According to various embodiments, the wafer and the carrier panel may face each other. Accordingly, a wafer surface of the wafer and a bonding surface of the carrier panel may be oriented towards each other so as to be respectively facing in the direction of each other. Hence, the die may travel transversely between the vertically mounted wafer and carrier panel without requiring the die to travel across or over the wafer surface of the wafer and/or the bonding surface of the carrier panel.

According to various embodiments, the layout and/or the vertical arrangements of the wafer and the carrier panel may enable the inspection and measurement of the bonding location of the die to be bonded (or pre-bond inspection). Further, it may also enable the inspection and measurement of the bonded die in relation to the bonding location (or post-bond inspection). Accordingly, various embodiments may seek to provide pre-bond and post-bond inspections. According to various embodiments, the pre-bond and post-bond inspections may be conducted concurrently during bonding of each die to the carrier panel, which enable all the dies (i.e. 100% of the dies) to be inspected, without losing cycle time.

Various embodiments seek to reduce or minimize the wafer changing (or exchanging) time so as to minimize the impact on the units per hour (UPH) of the die bonding apparatus and method. Conventionally, wafer changing (or exchanging) may take about 60 to 120 seconds or even longer per wafer. While it may not seem significant when only a few wafer changing (or exchanging) is required, the UPH may be affected when the number of wafer changes (or exchanges) is high.

Various embodiments seek to provide a dual wafer exchange station. According to various embodiments, the dual wafer exchange station may greatly reduce time loss during wafer exchange. According to various embodiments, while the first wafer station is working or in operation, the second wafer station may be prepared, for example, including but not limited to, loading with a new wafer, reading the wafer barcode, downloading the wafer map, stretching the wafer, searching the wafer center, locating the reference dies and the first die to be picked up. After the second wafer station is prepared, the second wafer station may be put on stand-by for swapping position with the first wafer station after all the dies are picked from the first wafer station. According to various embodiments, a camera system may be integrated on each wafer station for wafer mapping and pre-inspection of the wafer.

According to various embodiments, the die bonding apparatus or the die bonder may include a carrier support unit (or a die bond unit) for holding the carrier panel in the vertical orientation with respect to the ground.

According to various embodiments, the die bonding apparatus or the die bonder may include a dual wafer exchange station. According to various embodiments, the dual wafer exchange station may include two wafer modules (or two wafer feed units). When one wafer module (or one wafer feed unit) is working or in operation, the other wafer module (or the other wafer feed unit) may be undergoing preparation including, but not limited to, loading of a new wafer and calibration. According to various embodiments, the calibration may be automated and may start after the wafer is loaded.

According to various embodiments, the die bonding apparatus or the die bonder may include vision image capturing and processing. According to various embodiments, the die bonding apparatus or the die bonder may include a camera to pre-capture die image, for example, the die may be static or moving during die image capturing. According to various embodiments, the die bonding apparatus or the die bonder may also include a camera for the pre-bond and post-bond inspections. According to various embodiments, the die bonding apparatus or the die bonder may include a single camera or multiple cameras to capture the carrier panel fiducial image.

FIG. 1 shows a side view of a schematic diagram of a die bonding apparatus 100 or a die bonder according to various embodiments. According to various embodiments, the die bonding apparatus 100 or the die bonder may be for bonding a plurality of semiconductor dies 104 from a diced wafer 102 to a carrier panel 106, for example, in a panel level packaging process for a panel based semiconductor assembly. According to various embodiments, the die bonding apparatus 100 or the die bonder may be configured to hold the diced wafer 102 and the carrier panel 106 in a manner such that a wafer side 102a of the diced wafer 102 and a bonding surface 106a of the carrier panel 106 may face each other. Accordingly, the wafer side 102a of the diced wafer 102 and the bonding surface 106a of the carrier panel 106 may be oriented towards each other so as to be respectively facing in the direction of each other. According to various embodiments, the wafer side 102a of the diced wafer 102 and the bonding surface 106a of the carrier panel 106 may be substantially parallel to each other in an opposing manner so as to face each other (for example, see FIG. 4B and FIG. 5B), or the wafer side 102a of the diced wafer 102 and the bonding surface 106a of the carrier panel 106 may be at an angle with respect to each other (for example, see FIG. 4C and FIG. 5C) in a manner so as to generally face each other. According to various embodiments, when the wafer side 102a of the diced wafer 102 and the bonding surface 106a of the carrier panel 106 are facing each other at an angle with respect to each other, the wafer side 102a of the diced wafer 102 and the bonding surface 106a of the carrier panel 106 may form an angle less than 180°, or less than 90°, or less than 45°, or less than 30°, or less than 20°, or less than 10°. Accordingly, when the wafer side 102a of the diced wafer 102 and the bonding surface 106a of the carrier panel 106 are facing each other at an angle with respect to each other, a normal vector of the wafer side 102a of the diced wafer 102 and a normal vector of the bonding surface 106a of the carrier panel 106 may intersect each other.

According to various embodiments, for example, the diced wafer 102 may include the plurality of singulated semiconductor dies 104 on a dicing tape 105. Accordingly, a single wafer may be stuck on the dicing tape 105 and then singulated into a plurality of small pieces such that the plurality of small pieces form the plurality of singulated semiconductor dies 104 on the dicing tape 105. According to various embodiments, the wafer side 102a of the diced wafer 102 may be a side or a face of the diced wafer 102 opposite the dicing tape 105. Accordingly, the wafer side 102a of the diced wafer 102 may be corresponding to the exposed surfaces of the plurality of semiconductor dies 104 directed away from the dicing tape 105. Hence, the wafer side 102a of the diced wafer 102 may be corresponding to an exposed surface of the diced wafer 102 free of the dicing tape 105 such that each of the plurality of semiconductor dies 104 may be picked from the wafer side 102a of the diced wafer 102. Thus, the wafer side 102a of the diced wafer 102 and a tape side 102b of the diced wafer 102 may be two opposite sides of the diced wafer 102. According to various embodiments, for example, the bonding surface 106a of the carrier panel 106 may be the side of the carrier panel 106 to which the plurality of semiconductor dies 104 may be bonded. According to various embodiments, the bonding surface 106a of the carrier panel 106 may be the side of the carrier panel 106 on which a layer of adhesive is applied. According to various embodiments, the layer of adhesive may include, but not limited to, an adhesive tape, an adhesive film, an adhesive sheet, an adhesive paste, or an adhesive glue. Accordingly, the bonding surface 106a of the carrier panel 106 may include the layer of adhesive or may be a sticky side of the carrier panel 106.

According to various embodiments, the die bonding apparatus 100 or the die bonder may include a carrier support unit 110 (or a die bond unit). According to various embodiments, the carrier support unit 110 may be configured to hold the carrier panel 106 in a manner such that the bonding surface 106a of the carrier panel 106 may face the wafer side 102a of the diced wafer 102.

According to various embodiments, the carrier support unit 110 may include at least one support element 112 defining a supporting plane 111 (represented by a dash-dot line in the figures). According to various embodiments, the carrier support unit 110 may include a carrier holder 114 operable to hold the carrier panel 106 against the at least one support element 112. Accordingly, the carrier panel 106 may be supported by the at least one support element 112. According to various embodiments, the carrier panel 106 may be supported on a side 111a of the supporting plane 111 defined by the at least one support element 112. According to various embodiments, the carrier panel 106 may be supported by the at least one support element 112 such that the carrier panel 106 may be parallel to the supporting plane 111. According to various embodiments, the carrier panel 106 may lie flatly on the side 111a of the supporting plane 111 so as to be parallel to the supporting plane 111. According to various embodiments, the at least one support element 112 may provide backing support to the carrier panel 106 along the supporting plane 111. Accordingly, the supporting plane 111 may be an interfacing plane between the at least one support element 112 and the carrier panel 106 when the carrier panel 106 is supported on the at least one support element 112. According to various embodiments, the at least one support element 112 may be abutting the carrier panel 106 along the supporting plane 111 in a manner so as to back or support the carrier panel 106 when the die 104 is bonded to the carrier panel 106. Accordingly, the at least one support element 112 may serve to act against a bonding force pushing the die 104 against the carrier panel 106 for supporting the carrier panel 106 along the supporting plane 111 when the die 104 is being bonded to the carrier panel 106. Hence, a predetermined bonding direction along which the die 104 is bonded to the carrier panel 106 held by the carrier support unit 110 may be perpendicular towards the side 111a of the supporting plane 111 to which the carrier panel 106 may be supported.

According to various embodiments, a back surface 106b of the carrier panel 106 may be rested on the at least one support element 112 of the carrier support unit 110 such that the back surface 106b of the carrier panel 106 interface with the side 111a of the supporting plane 111 to which the carrier panel 106 may be supported. The back surface 106b of the carrier panel 106 may be opposite the bonding surface 106a of the carrier panel 106. Accordingly, the at least one support element 112 of the carrier support unit 110 may provide backing support to the carrier panel 106 via contacting the back surface 106b of the carrier panel 106 along the supporting plane 111. According to various embodiments, the at least one support element 112 of the carrier support unit 110 may be configured to contact an entire back surface 106b of the carrier panel 106 or at least a portion of the back surface 106b of the carrier panel 106. For example, according to various embodiments, the at least one support element 112 of the carrier support unit 110 may be a continuous surface having an area or footprint equal to or larger than the entire back surface 106b of the carrier panel 106 such that the entire back surface 106b of the carrier panel 106 may flatly lie on the at least one support element 112 of the carrier support unit 110. Accordingly, in such an embodiment, the at least one support element 112 may include, but not limited to, a panel, a stage, a table. As another example, according to various embodiments, the carrier support unit 110 may include a plurality of support elements 112, each having a contact point or a small contact area for abutting a point or a portion of the back surface 106b of the carrier panel 106. The plurality of support elements 112 may be distributed so as define the supporting plane 111 whereby the back surface 106a of the carrier panel 106 may be supported via a plurality of contact points or area distributed along the supporting plane 111. Accordingly, in such an embodiment, the at least one support element 112 may include, but not limited to, a point support, a roller support, a wheel support, a ball support, a bearing support, a finger support, etc.

According to various embodiments, the carrier holder 114 of the carrier support unit 110 may include an attachment mechanism including, but not limited to, vacuum suction mechanism such as vacuum holes or vacuum cups or vacuum ports, or gripping mechanism such as grippers or clamps, or magnetic mechanism such as electro-magnet. According to various embodiments, when the carrier holder 114 of the carrier support unit 110 includes the vacuum suction mechanism or the magnetic mechanism, the carrier holder 114 may provide a suction force or a magnetic attraction force to hold the carrier panel 106 against the at least one support element 112 along the supporting plane 111. According to various embodiments, when the carrier holder 114 of the carrier support unit 110 includes the gripping mechanism, the gripping mechanism may provide a gripping or clamping force directly on carrier panel 106 to push the carrier panel 106 against the at least one support element 112 along the supporting plane 111, or the gripping mechanism may grip or clamp the carrier panel 106 and hold the carrier panel 106 against the at least one support element 112 along the supporting plane 111

According to various embodiments, the die bonding apparatus 100 or the die bonder may include a wafer feed unit 120. According to various embodiments, the wafer feed unit 120 may be configured to hold the diced wafer 102 in a manner such that the wafer side 102a of the diced wafer 102 may face the bonding surface 106a of the carrier panel 106. Accordingly, since the back surface 106a of the carrier panel 106 is rested against the at least one support element 112 of the carrier support unit 110 along the supporting plane 111, the wafer feed unit 120 may hold the diced wafer 102 in a manner such that the wafer side 102a of the diced wafer 102 may face the at least one support element 112 of the carrier support unit 110 or the side 111a of the supporting plane 111 to which the carrier panel 106 is supported. According to various embodiments, the wafer side 102a of the diced wafer 102 and the side 111a of the supporting plane 111 to which the carrier panel 106 may be supported may be substantially parallel to each other in an opposing manner so as to face each other, or the wafer side 102a of the diced wafer 102 and the side 111a of the supporting plane 111 to which the carrier panel 106 may be supported may be at an angle with respect to each other in a manner so as to be generally facing each other. According to various embodiments, when the wafer side 102a of the diced wafer 102 and the side 111a of the supporting plane 111 to which the carrier panel 106 may be supported are facing each other at an angle with respect to each other, the wafer side 102a of the diced wafer 102 and the side 111a of the supporting plane 111 to which the carrier panel 106 may be supported may form an angle less than 180°, or less than 90°, or less than 45°, or less than 30°, or less than 20°, or less than 10°. Accordingly, when the wafer side 102a of the diced wafer 102 and side 111a of the supporting plane 111 to which the carrier panel 106 may be supported are facing each other at an angle with respect to each other, a normal vector of the wafer side 102a of the diced wafer 102 and a normal vector of the side 111a of the supporting plane 111 to which the carrier panel 106 may be supported may intersect each other.

According to various embodiments, the wafer feed unit 120 may include a wafer holder 122. According to various embodiments, the wafer holder 122 may be operable to hold the diced wafer 102 in a manner so as to space the diced wafer 102 apart from the supporting plane 111 defined by the at least one support element 112 of the carrier support unit 110 and orient the diced wafer 102 with the wafer side 102a of the diced wafer 102 (i.e. the exposed surface of the diced wafer 102, or the side of the diced wafer 102 opposite the dicing tape 105, or the surfaces of the plurality of semiconductor dies 104 directed away from the dicing tape 105 of the diced wafer 102) facing the side 111a of the supporting plane 111 to which the carrier panel 106 is supported. Accordingly, the wafer holder 122 may be spaced apart from the carrier support unit 110 in a direction away from the side 111a of the supporting plane 111 to which the carrier panel 106 may be supported. Further, the wafer holder 122 may be oriented with respect to the side 111a of the supporting plane 111 to which the carrier panel 106 may be supported in a manner such that the diced wafer 102 held by the wafer holder 122 may be oriented with the wafer side 102a of the diced wafer 102 facing the side 111a of the supporting plane 111 to which the carrier panel 106 may be supported. According to various embodiments, the wafer holder 122 of the wafer feed unit 120 may be operable to hold the diced wafer 102 with the wafer side 102a of the diced wafer 102 substantially parallel to the side 111a of the supporting plane 111 to which the carrier panel 106 may be supported or with the wafer side 102a of the diced wafer 102 and the side 111a of the supporting plane 111 to which the carrier panel 106 may be supported at an angle with respect to each other such that the wafer side 102a of the diced wafer 102 and the side 111a of the supporting plane 111 of the carrier support unit 110 to which the carrier panel 106 may be supported may face each other.

According to various embodiments, the wafer holder 122 may have a predetermined front-loading direction 123 which the wafer side 102a of the diced wafer 102 may face when the diced wafer 102 is correctly loaded or held by the wafer holder 122. Regardless of whether the active surfaces of the plurality of dies 104 of the diced wafer 102 face away from the dicing tape 105 of the diced wafer 102 or face towards the dicing tape 105 of the diced wafer 102, the diced wafer 102 may have to be oriented with wafer side 102a of the diced wafer 102 in front of the dicing tape 105 along the predetermined front-loading direction 123 in order for the diced wafer 102 to be correctly loaded or held by the wafer holder 102. Accordingly, the wafer side 102a of the diced wafer 102 may face in the predetermined front-loading direction 123 of the wafer holder 122 when the diced wafer 102 is correctly loaded or held by the wafer holder 122. Hence, the predetermined front-loading direction 123 of the wafer holder 122 may be extending perpendicularly away from the wafer side 102a of the diced wafer 102 when the diced wafer 102 is correctly loaded or held by the wafer holder 122. Thus, the wafer side 102a of the diced wafer 102 may serve as the frontal face of the diced wafer which may face in the predetermined front-loading direction 123 when the diced wafer is correctly loaded to the wafer holder 122. According to various embodiments, the wafer holder 122 may be oriented with respect to the side 111a of the supporting plane 111 of the carrier support unit 110 to which the carrier panel 106 is supported in a manner such that the predetermined front-loading direction 123 of the wafer holder 122 is directed towards or pointing towards the side 111a of the supporting plane 111 of the carrier support unit 110 to which the carrier panel 106 may be supported.

According to various embodiments, the wafer holder 122 may include an attachment mechanism including, but not limited to, vacuum suction mechanism such as vacuum holes or vacuum cups or vacuum ports, or gripping mechanism such as grippers or clamps, or magnetic mechanism such as electro-magnet.

According to various embodiments, the die bonding apparatus 100 or the die bonder may include a die transfer module 130. According to various embodiments, the die transfer module 130 may be disposed between the carrier support unit 110 and the wafer feed unit 120. Accordingly, the die transfer module 130 may be between the wafer side 102a of the diced wafer 102 and the bonding surface 106a of the carrier panel 106 that are facing each other when the diced wafer 102 and the carrier panel 106 are respectively held by the wafer feed unit 120 and the carrier support unit 110. Hence, the wafer side 102a of the diced wafer 102 may face towards the die transfer module 130 and the bonding surface 106a of the carrier panel 106 may face the die transfer module 130. Thus, the wafer holder 122 may be oriented with respect to the die transfer module 130 in a manner such that the predetermined front-loading direction 123 of the wafer holder 122 is directed towards or pointing towards the die transfer module 130, and the side 111a of the supporting plane 111 of the carrier support unit 110 to which the carrier panel 106 is supported may face or directed towards the die transfer module 130.

According to various embodiments, the carrier support unit 110 and the wafer feed unit 120 may be on different sides of the die transfer module 130. For example, when the wafer side 102a of the diced wafer 102 and the bonding surface 106a of the carrier panel 106 are substantially parallel to each other, the carrier support unit 110 and the wafer feed unit 120 may be on opposite sides of the die transfer module 130. As another example, when the wafer side 102a of the diced wafer 102 and the bonding surface 106a of the carrier panel 106 are at an angle with respect to each other in a manner so as to generally face each other, the carrier support unit 110 and the wafer feed unit 120 may be at a corresponding angular displacement from each other with respect to the die transfer module 130.

According to various embodiments, the die transfer module 130 may be operable to pick up the die 104 from the diced wafer 102 held by the wafer feed unit 120 and place the die 104 on the carrier panel 106 held by the carrier support unit 110 for bonding the die 104 to the carrier panel 106. Accordingly, the die transfer module 130 may serve as a transfer mechanism operable between the carrier support unit 110 and the wafer feed unit 120 to interact with the wafer feed unit 120 for picking up the die 104 from the diced wafer 102 held by the wafer feed unit 120 and to interact with the carrier support unit 110 for placing and/or bonding the die 104 to the carrier panel 106 held by the carrier support unit 110. According to various embodiments, the die transfer module 130 may interact with the wafer feed unit 120 on a first side 130a of the die transfer module 130 to pick up the die 104 from the diced wafer 102 held by the wafer feed unit 120, transfer the die 104 from the first side 130a of the die transfer module 130 to a second side 130b of the die transfer module 130, and interact with the carrier support unit 110 on the second side 130b of the die transfer module 130 to place the die 104 on the carrier panel 106 held by the carrier support unit 110 for bonding the die 104 to the carrier panel 106.

According to various embodiments, the die transfer module 130 may include one or more pickup heads 134a, 134b (for example, see FIG. 4A to FIG. 5B) movable with respect to the wafer feed unit 120 and the carrier support unit 110 for interacting with the wafer feed unit 120 to pick up the die 104 from the diced wafer 102 held by the wafer feed unit 120, transferring the die 104 from the first side 130a of the die transfer module 130 to the second side 130b of the die transfer module 130, and interacting with the carrier support unit 110 to place the die 104 on the carrier panel 106 held by the carrier support unit 110 for bonding the die 104 to the carrier panel 106. For example, according to various embodiments, the die transfer module 130 may include at least one pickup heads 134a (for example see FIG. 4A and FIG. 4B) movable with respect to the wafer feed unit 120 and the carrier support unit 110 for interacting with the wafer feed unit 120 to pick up the die 104 from the diced wafer 102 held by the wafer feed unit 120, transferring the die 104 held via the same pickup head 134a from the first side 130a of the die transfer module 130 to the second side 130b of the die transfer module 130, and interacting with the carrier support unit 110 via the same pickup head 134a to place the die 104 on the carrier panel 106 held by the carrier support unit 110 for bonding the die 104 to the carrier panel 106. As another example, according to various embodiments, the die transfer module 130 may include at least two pickup heads 134a, 134b (for example see FIG. 5A and FIG. 5B) independently movable with respect to the wafer feed unit 120 and the carrier support unit 110, and a first pickup head 134a of the at least two pickup heads interacts with the wafer feed unit 120 to pick up the die 104 from the diced wafer 102 held by the wafer feed unit 120, moves the die 104 via the same first pickup head 134a from the first side 130a of the die transfer module 130 to an intermediate location within the die transfer module 130, and transfers the die 104 from the first pickup head 134a of the at least two pickup heads to a second pickup head 134b of the at least two pickup heads, and the same second pickup head 134b moves the die to the second side of the die transfer module 130 and interacts with the carrier support unit 110 via the same second pickup head 134b to place the die 104 on the carrier panel 106 held by the carrier support unit 110 for bonding the die 104 to the carrier panel 106.

According to various embodiments, the die transfer module 130 may be operable to transfer the die 104 along a die-movement-plane 104a intersecting the wafer side 102a of the diced wafer 102 and the bonding surface 106a of the carrier panel 106. Accordingly, the one or more pickup heads 134a, 134b may be movable along the die-movement-plane 104a for interacting with the wafer feed unit 120 to pick up the die 104 from the diced wafer 102 held by the wafer feed unit 120, transferring the die 104 from the first side of the die transfer module 130 to the second side of the die transfer module 130, and interacting with the carrier support unit 110 to place the die 104 on the carrier panel 106 held by the carrier support unit 110 for bonding the die 104 to the carrier panel 106. According to various embodiments, the die-movement-plane 104a may be substantially perpendicular to wafer side 102a of the diced wafer 102 and the bonding surface 106a of the carrier panel 106. According to various embodiments, the die-movement-plane 104a may be substantially parallel to a plane substantially perpendicular to the supporting plane 111 of the carrier panel 106.

According to various embodiments, with the wafer feed unit 120 and the carrier support unit 110 respectively holding the diced wafer 102 and the carrier panel 106 in a manner such that the wafer side 102a of the diced wafer 102 and the bonding surface 106a of the carrier panel 106 may face each other and with the die transfer module 130 disposed between the wafer feed unit 120 and the carrier support unit 110, the die transfer module 130 may move the die 104 across a short travel distance to transfer the die 104 from the diced wafer 102 to the carrier panel 106 for bonding the die 104 to the carrier panel 106 so as to enable a high throughput. Accordingly, the die transfer module 130 may move the die 104 transversely between the wafer side 102a of the diced wafer 102 and the bonding surface 106a of the carrier panel 106, which face each other, without requiring the die 104 to travel across or over an area of the wafer side 102a of the diced wafer 102 and/or the bonding surface 106a of the carrier panel 106. Hence, the time required to transfer the die 104 may be significantly reduced, as compared to conventional methods whereby dies have to be moved across or over an area of the wafer and/or the bonding surface of the carrier panel, leading to a higher throughput.

According to various embodiments, the die bonding apparatus 100 or the die bonder may include a support structure 108. The support structure 108 may provide a framework for holding various components, including but not limited to the carrier support unit 110 and/or the wafer feed unit 120 and/or the die transfer module 130, of the die bonding apparatus 100 or the die bonder together. Accordingly, the support structure 108 may interconnect the various components in a predetermined configuration, arrangement, or disposition for the various components to be cooperatively operable or interoperable to pick the plurality of dies 104 from the diced wafer 102, transfer the plurality of dies 104 from the diced wafer 102 to the carrier panel 106, and bond the plurality of dies 104 to the carrier panel 106 in the manner as described in the various embodiments. According to various embodiments, the support structure 108 may include a base support surface 108a for resting on a surface 109 to which the die bonding apparatus 100 or the die bonder may be supported. For example, the surface 109 may include a ground or a tabletop on which the base support surface 108a may be rested and the die bonding apparatus 100 or the die bonder may be placed. According to various embodiments, the carrier support unit 110 and/or the wafer feed unit 120 and/or the die transfer module 130 may be supported by or mounted to or coupled to the support structure 108.

According to various embodiments, the wafer feed unit 120 may be configured to hold the diced wafer 102 with the wafer side 102a of the diced wafer 102 substantially vertical with respect to the base support surface 108a. Accordingly, the wafer feed unit 120 may hold the diced wafer 102 in an orientation such that the wafer side 102a of the diced wafer 102 may be substantially perpendicular to the base support surface 108a. Hence, the diced wafer 102 may be held by the wafer holder 122 of the wafer feed unit 120 in a manner such that the wafer side 102a of the diced wafer 102 may be substantially perpendicular to the base support surface 108a.

According to various embodiments, the carrier holder 114 of the carrier support unit 110 may be configured to hold the carrier panel 106 with the bonding surface 106a of the carrier panel 106 substantially vertical with respect to the base support surface 108a. Accordingly, the carrier holder 114 of the carrier support unit 110 may hold the carrier panel 106 in an orientation such that the bonding surface 106a of the carrier panel 106 may be substantially perpendicular to the base support surface 108a. Hence, the carrier panel 106 may be held by the carrier holder 114 of the carrier support unit 110 in a manner such that the bonding surface 106a of the carrier panel 106 may be substantially perpendicular to the base support surface 108a. Thus, the supporting plane 111 defined by the at least one support element 112 of the carrier support unit 110 abutting the back surface 106b of the carrier panel 106 may be substantially perpendicular to the base support surface 108a when the carrier panel 106 is held by the carrier holder 114 of the carrier support unit 110.

According to various embodiments, the die transfer module 130, which is disposed between the wafer feed unit 120 and the carrier support unit 110, may be configured to transfer the plurality of dies 104 from the diced wafer 102 to the carrier panel 106. Accordingly, the die transfer module 130 may pick up the plurality of dies 104 from the diced wafer 102 held by the wafer feed unit 120, transfer the plurality of dies 104 to the carrier panel 106 held by the carrier support unit 110, and bond the plurality of dies 104 to the carrier panel 106 held by the carrier support unit 110. According to various embodiments, the die transfer module 130 may transfer the plurality of dies 104 along the die-movement-plane intersecting the wafer side 102a of the diced wafer 102 and the bonding surface 106a of the carrier panel 106. As an example, according to various embodiments, the die-movement-plane may be substantially parallel to the base support surface 108a.

According to various embodiments, with the wafer feed unit 120 and the carrier support unit 110 respectively holding the diced wafer 102 and the carrier panel 106 vertical with respect to the ground (or surface 109), dust contamination of the carrier panel 106 via gravity (e.g. silicon dust and/or particles falling by gravity on the carrier panel with sticky tape) may be reduced or eliminated. Accordingly, various embodiments may avoid dust accumulation or collection during die bonding of the carrier panel 106. According to various embodiments, with the carrier panel 106 being held vertical with respect to the ground (or surface 109), the carrier panel 106 may use tape as a temporary adhesion for the bonding of the die 104 to the carrier panel 106, whereby the occurrences of the fall of silicon dust and/or other particles by gravity to contact the sticky surface of the tape mounted on the carrier panel 106 may be eliminated or minimized.

According to various embodiments, the die bonding apparatus 100 or the die bonder may include a sensing arrangement 150, for example in the form of a vision system, for observing operation of the die bonding apparatus 100 or the die bonder so as to provide feedback for controlling the wafer unit 120, the carrier support unit 110 and the die transfer module 130. Accordingly, the sensing arrangement 150 may be part of a feedback control for automated operation of the die bonding process from picking up of the plurality of dies 104, to transferring of the plurality of dies 104, and to bonding of the plurality of dies 104. Hence, the sensing arrangement 150 may provide the feedback and guidance for the wafer unit 120, the carrier support unit 110 and the die transfer module 130 to cooperatively operate or interoperate in a manner as described herein.

According to various embodiments, the wafer feed unit 120 may be movable along a wafer-movement plane 128 (represented by a dash-dot line in the figures) parallel to the supporting plane 111 defined by the at least one support element 112 of the carrier support unit 110. According to various embodiments, the wafer feed unit 120 may be movable to translate linearly along two orthogonal axes for moving along the wafer-movement plane 128. According to various embodiments, the wafer feed unit 120 may move between different positions along the wafer-movement plane 128 by translating linearly along the two orthogonal axes lying in the wafer-movement plane 128.

Figure 2:
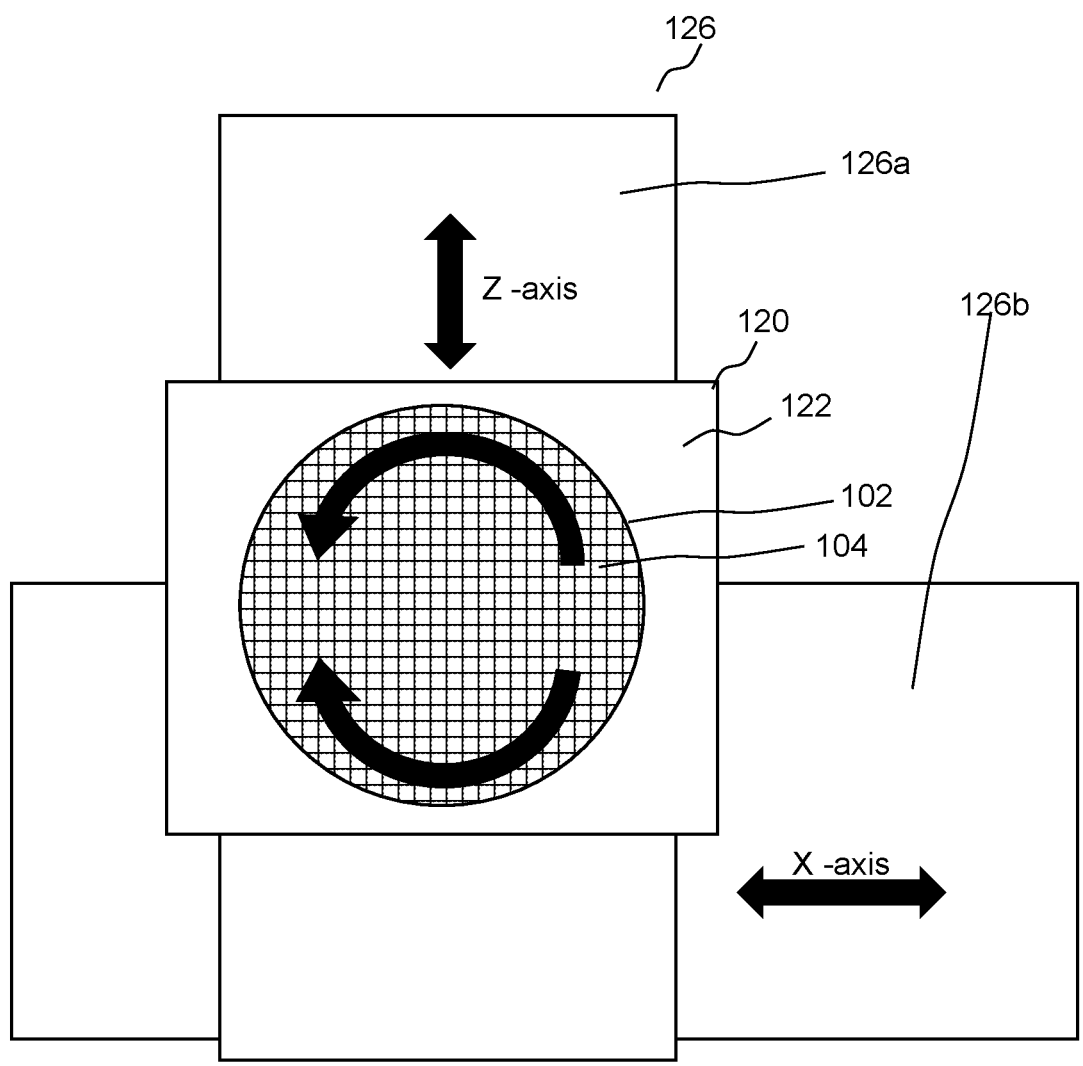
FIG. 2 shows a front view of an example configuration for moving a wafer feed unit of the die bonding apparatus or the die bonder along a wafer-movement plane according to various embodiments.

FIG. 2 shows a front view of an example configuration for moving the wafer feed unit 120 along the wafer-movement plane 128 according to various embodiments. According to various embodiments, the wafer feed unit 120 may be mounted or fitted to a two-axes Cartesian movement mechanism 126. According to various embodiments, the two axes Cartesian movement mechanism 126 may include two links 126a, 126b (or beams) arranged perpendicular to each other. According to various embodiments, a linear actuator may be coupled to each links 126a, 126b in a manner so as to actuate the wafer feed unit 120 for moving linearly along a longitudinal axis of a first link 126a and to actuate the first link 126a for moving linearly along a longitudinal axis of a second link 126b. Accordingly, in this manner, the wafer feed unit 120 may be movable along the two orthogonal axes for moving along the wafer-movement plane 128.

According to various embodiments, the wafer holder 122 of the wafer feed unit 120 may also be operable to rotate the diced wafer 102 about a center of the diced wafer 102. Accordingly, the wafer holder 122 of the wafer feed unit 120 may rotate the diced wafer 102 about a rotational axis passing through the center of the diced wafer 102 and perpendicular to the diced wafer 102. According to various embodiments, the rotational axis may be perpendicular to the wafer-movement plane 128 of the wafer feed unit 120. Accordingly, in addition to translating linearly along the two orthogonal axes along the wafer-movement plane 128, the diced wafer 102 may also be rotatable about the rotational axis perpendicular to the wafer-movement plane 128.

According to various embodiments, when the diced wafer 102 held by the wafer holder 122 of the wafer feed unit 120 is substantially vertical with respect to the base support surface 108a or the ground (or surface 109), the two orthogonal axes may be a Z-axis for moving along a height direction and a X-axis for moving sideways.

According to various embodiments, the carrier support unit 110 may be movable along a carrier-movement plane 118 (represented by a dash-dot line in the figures) parallel to the supporting plane 111 defined by the at least one support element 112 of the carrier support unit 110. According to various embodiments, the carrier support unit 110 may be movable to translate linearly along two orthogonal axes for moving along the carrier-movement plane 118. According to various embodiments, the carrier support unit 110 may move between different positions along the carrier-movement plane 118 by translating linearly along the two orthogonal axes lying in the carrier-movement plane 118.

Figure 3:
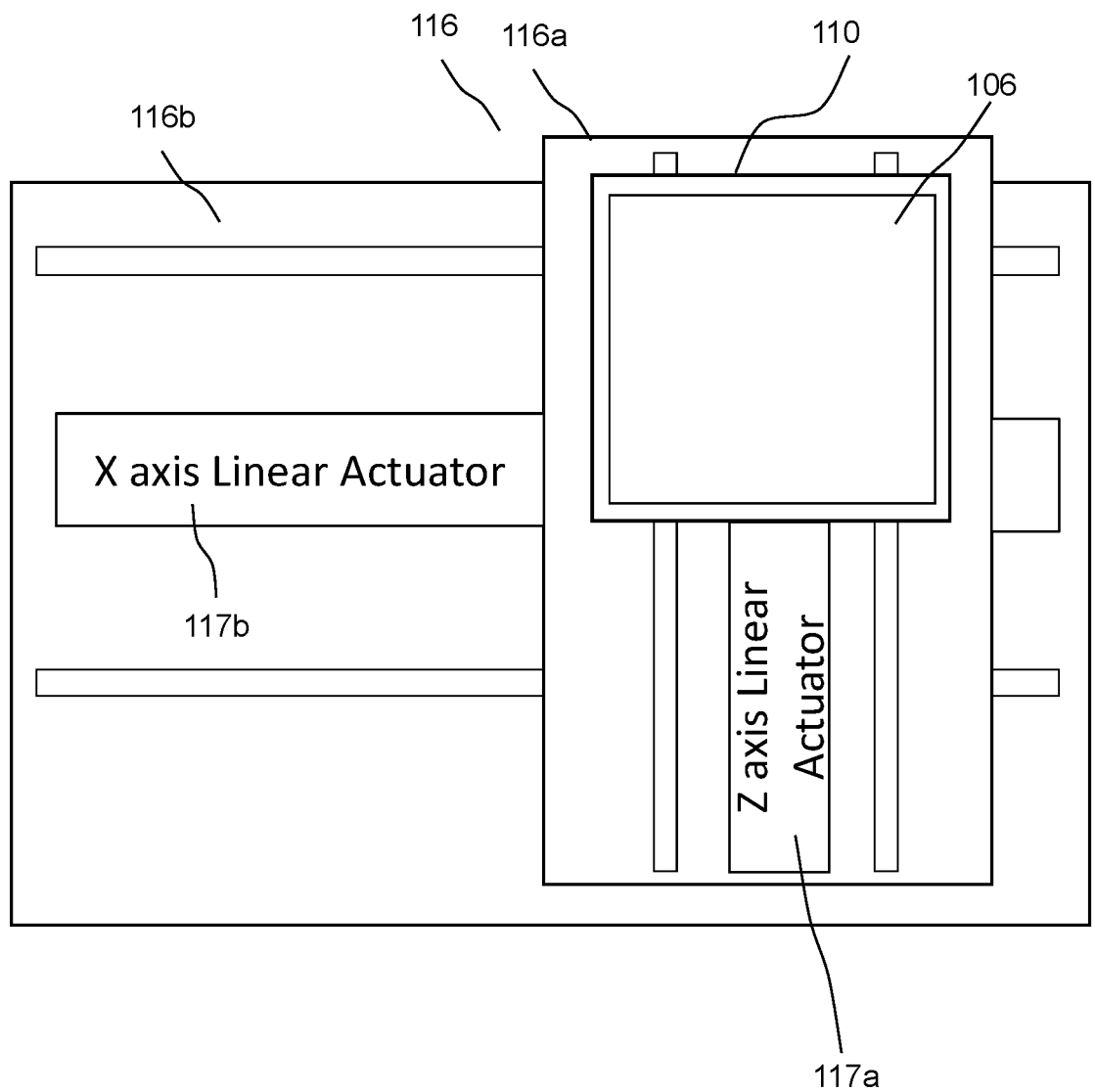
FIG. 3 shows a rear view of an example configuration for moving a carrier support unit of the die bonding apparatus or the die bonder along a carrier-movement plane according to various embodiments.

FIG. 3 shows a rear view of an example configuration for moving the carrier support unit 110 along the carrier-movement plane 118 according to various embodiments. According to various embodiments, the carrier support unit 110 may be mounted or fitted to a two-axes Cartesian movement mechanism 116. According to various embodiments, the two axes Cartesian movement mechanism 116 may include two links 116a, 116b (or beams) arranged perpendicular to each other. According to various embodiments, a linear actuator 117a, 117b may be coupled to each links 116a, 116b in a manner so as to actuate the carrier support unit 110 for moving linearly along a longitudinal axis of a first link 116a and to actuate the first link 116a for moving linearly along a longitudinal axis of a second link 116b. Accordingly, in this manner, the carrier support unit 110 may be movable along the two orthogonal axes for moving along the carrier-movement plane 118.

According to various embodiments, when the carrier panel 106 held by the wafer holder 122 of the wafer feed unit 120 is substantially vertical with respect to the base support surface 108a or the ground (or the surface 109), the two orthogonal axes may be a Z-axis for moving along a height direction and a X-axis for moving sideways.

Figure 4A:
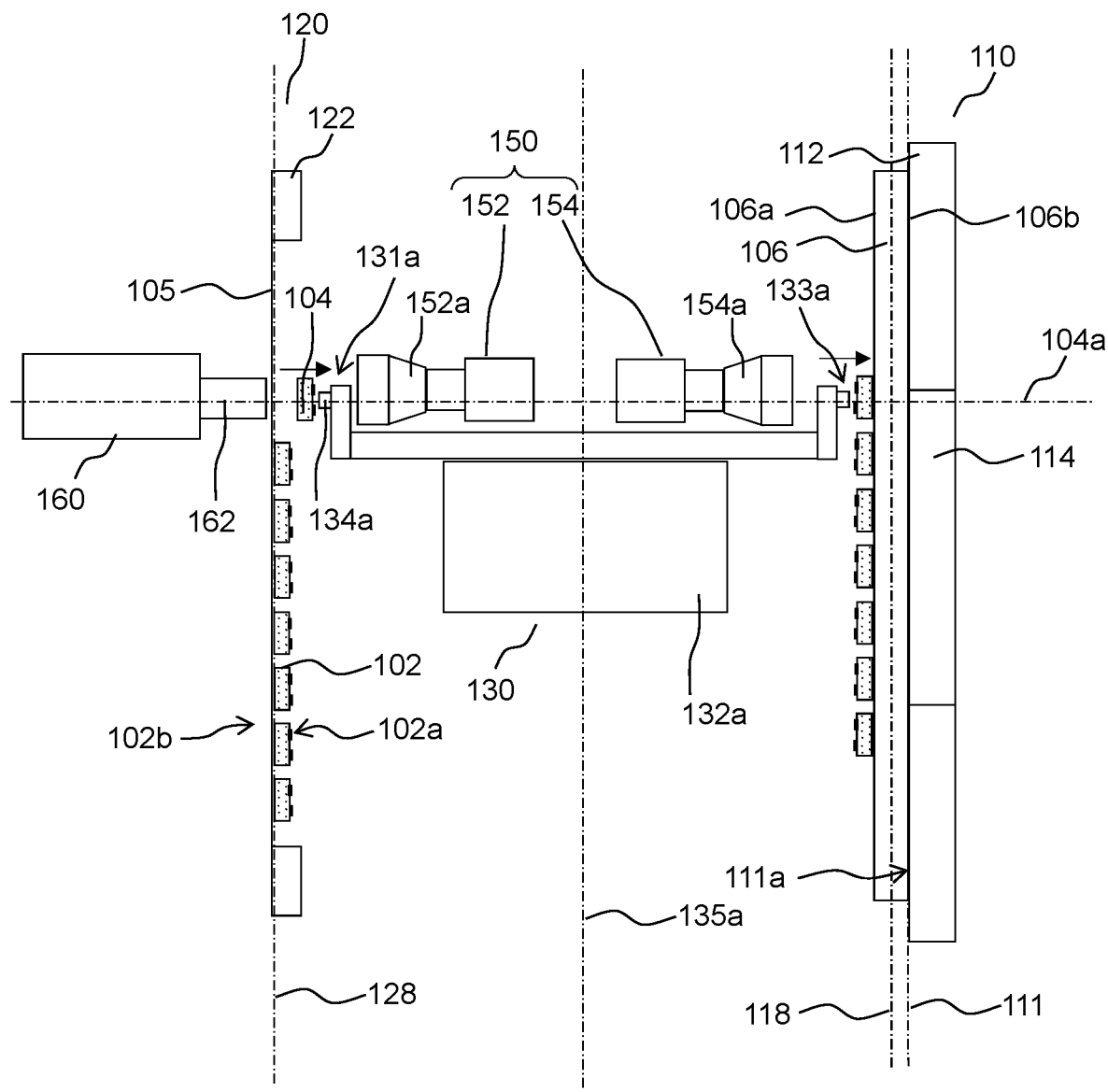
FIG. 4A shows a schematic side view of the die bonding apparatus or the die bonder being configured for same-side transfer according to various embodiments.
Figure 4B:
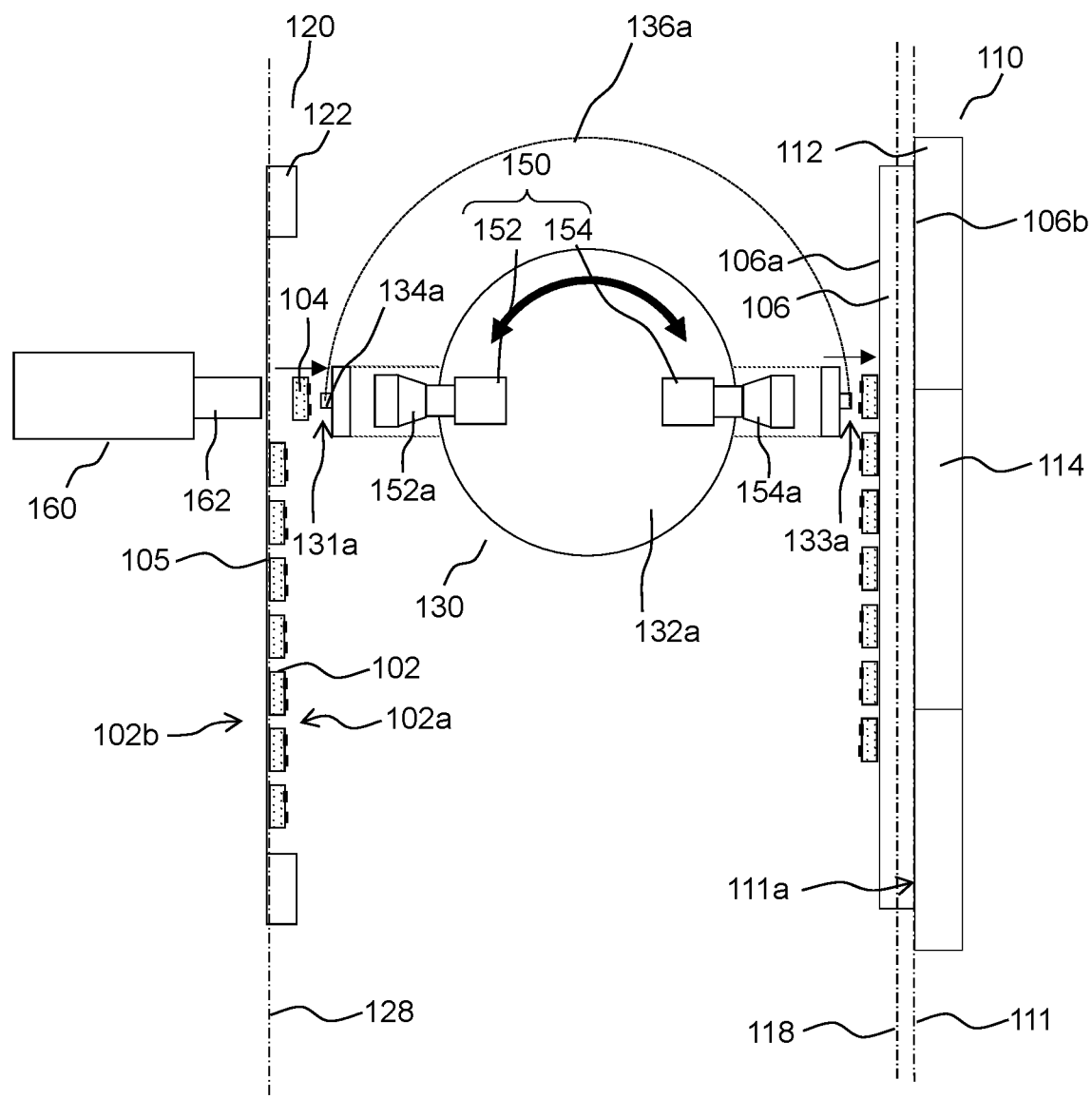
FIG. 4B shows a schematic top view of the die bonding apparatus or the die bonder of FIG. 4A according to various embodiments.
Figure 4C:
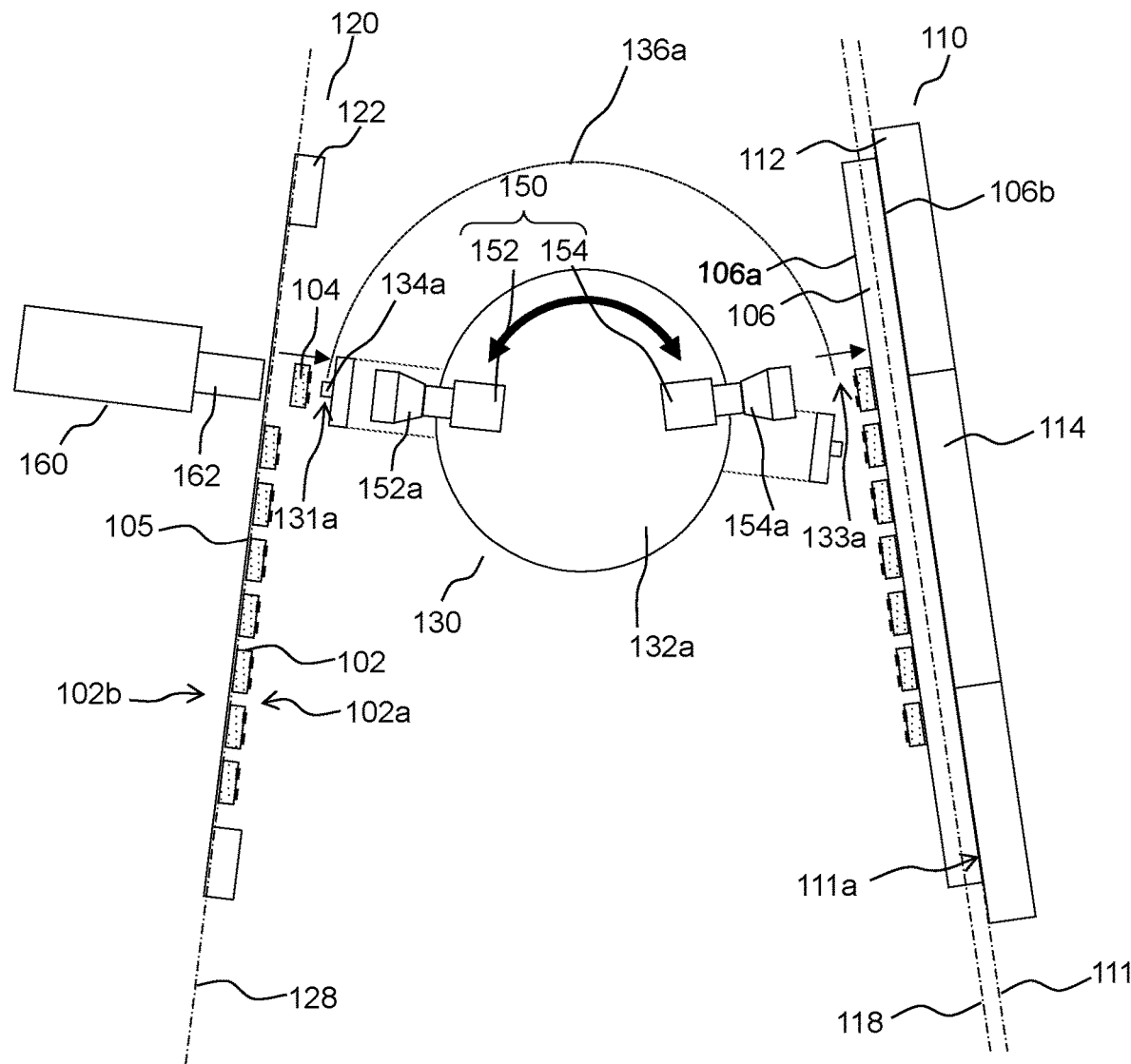
FIG. 4C shows a schematic top view of the die bonding apparatus or the die bonder of FIG. 4A with a diced wafer and a carrier panel held at an angle with respect to each other according to various embodiments.
Figure 5A:
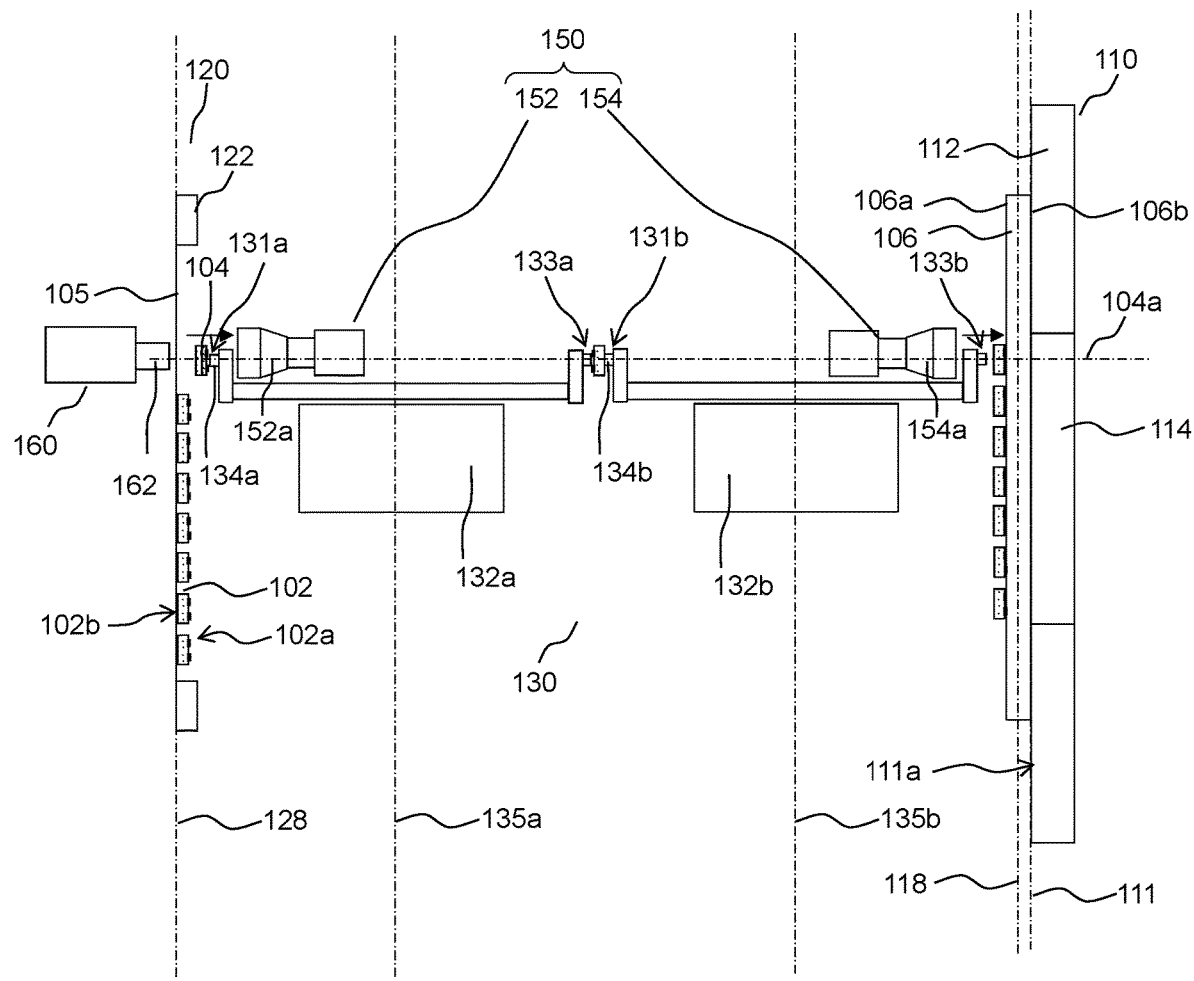
FIG. 5A shows a schematic side view of the die bonding apparatus or the die bonder being configured for opposite-sides transfer according to various embodiments.
Figure 5B:
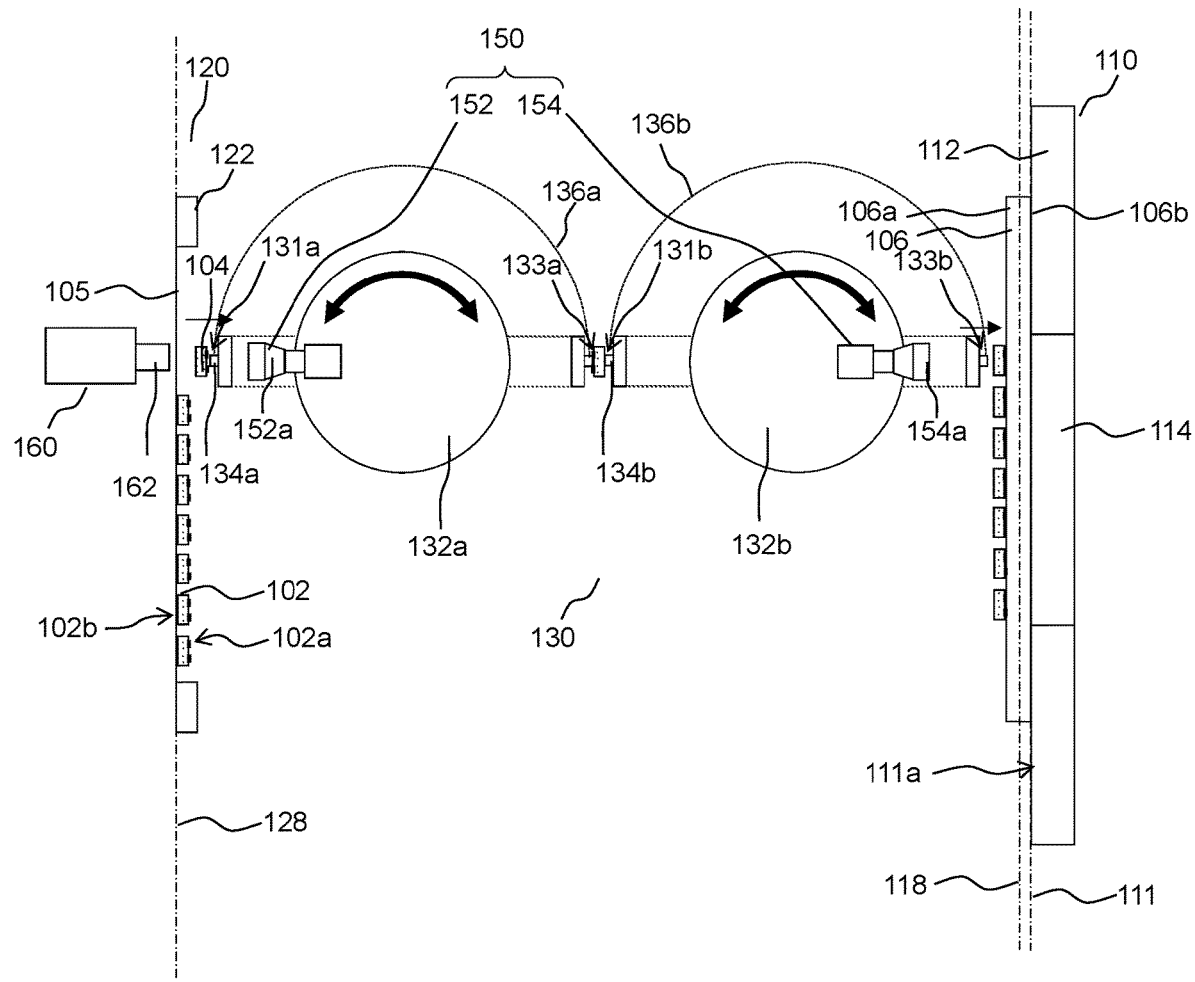
FIG. 5B shows a schematic top view of the die bonding apparatus or the die bonder of FIG. 5A according to various embodiments.
Figure 5C:
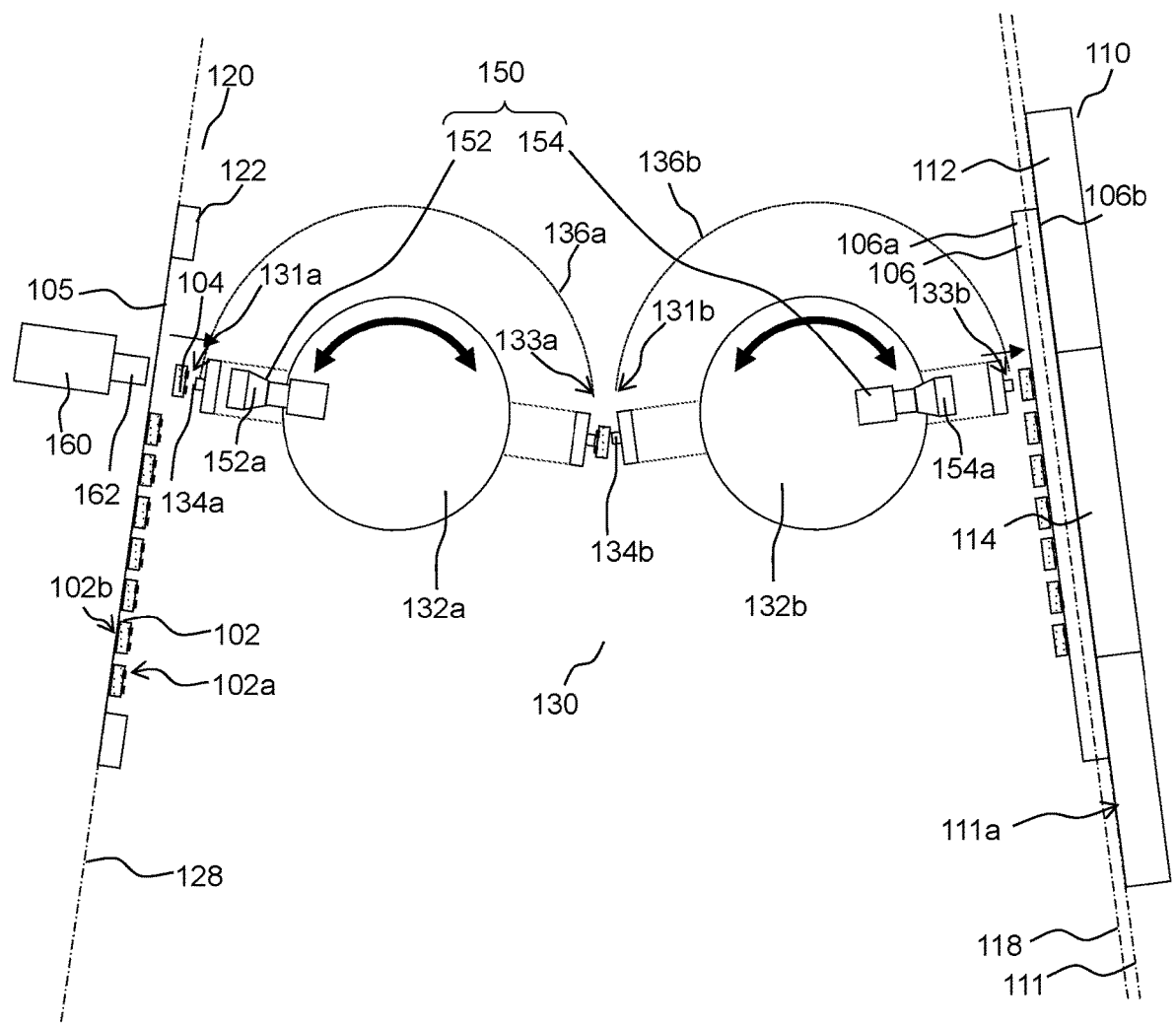
FIG. 5C shows a schematic top view of the die bonding apparatus or the die bonder of FIG. 5A with a diced wafer and a carrier panel held at an angle with respect to each other according to various embodiments.

FIG. 4A shows a schematic side view of the die bonding apparatus 100 or the die bonder being configured for same-side transfer according to various embodiments. FIG. 4B shows a schematic top view of the die bonding apparatus 100 or the die bonder of FIG. 4A according to various embodiments. FIG. 4C shows a schematic top view of the die bonding apparatus 100 or the die bonder of FIG. 4A with the diced wafer 102 and the carrier panel 106 held at an angle with respect to each other according to various embodiments. According to various embodiments, the same-side transfer may refer to the die 104 being transferred from the diced wafer 102 to the carrier panel 106 in a manner such that a side of the die 104 in contact with the dicing tape 105 of the diced wafer 102 may be in contact with the carrier panel 106 after the transfer. Accordingly, the side of the die 104 in contact with the carrier panel 106 after the transfer may be the same side of the die 104 stuck to the dicing tape 105 of the diced wafer 102 before the transfer. FIG. 5A shows a schematic side view of the die bonding apparatus 100 or the die bonder being configured for opposite-sides transfer according to various embodiments. FIG. 5B shows a schematic top view of the die bonding apparatus 100 or the die bonder of FIG. 5A according to various embodiments. FIG. 5C shows a schematic top view of the die bonding apparatus 100 or the die bonder of FIG. 5A with the diced wafer 102 and the carrier panel 106 held at an angle with respect to each other according to various embodiments. According to various embodiments, the opposite-sides transfer may refer to may refer to the die 104 being transferred from the diced wafer 102 to the carrier panel 106 in a manner such that a first side of the die 104 in contact with the dicing tape 105 of the diced wafer 102 may be opposite to a second side of the die 104 in contact with the carrier panel 106 after the transfer. Accordingly, the second side of the die 104 in contact with the carrier panel 106 after the transfer may be the opposite to first side of the die 104 stuck to the dicing tape 105 of the diced wafer 102 before the transfer. As shown, according to various embodiments, the die bonding apparatus 100 or the die bonder configured for same-side transfer and the die bonding apparatus 100 or the die bonder configured for opposite-sides transfer may differ in the configuration of the die transfer module 130.

According to various embodiments, the die transfer module 130 of the die bonding apparatus 100 or the die bonder configured for same-side transfer may include a pick-and-move unit 132a. According to various embodiments, the pick-and-move unit 132a may include at least one pickup head 134a movable between a pickup position 131a and a release position 133a. According to various embodiments, the pickup position 131a and the release position 133a may be on different sides of the pick-and-move unit 132a. For example, according to various embodiments, when the wafer side 102a of the diced wafer 102 and the bonding surface 106a of the carrier panel 106 are substantially parallel to each other, the pickup position 131a and the release position 133a may be on opposite sides of the pick-and-move unit 132a. As another example, when the wafer side 102a of the diced wafer 102 and the bonding surface 106a of the carrier panel 106 are at an angle with respect to each other in a manner so as to generally face each other, the pickup position 131a and the release position 133a may be at a corresponding angular displacement from each other with respect to the die transfer module 130.

According to various embodiments, when the at least one pickup head 134a is in the pickup position 131a, the at least one pickup head 134a may be directed towards the diced wafer 102 held by the wafer feed unit 120 and aligned to the die 104 for picking up the die 104 from the diced wafer 102 held by the wafer feed unit 120. Accordingly, the at least one pickup head 134a may point towards the die 104 on the diced wafer 102 for picking up the die 104 from the diced wafer 102 held by the wafer feed unit 120 when the at least one pickup head 134a is at the pickup position 131a. Hence, the at least one pickup head 134a may be directed or pointed away from the carrier support unit 110 and in a direction towards the wafer feed unit 120 when the at least one pickup head 134a is at the pickup position 131a.

According to various embodiments, when the at least one pickup head 134a is in the release position 133a, the at least one pickup head 134a may be directed away from the diced wafer 102a held by the wafer feed unit 120 and directed towards the carrier panel 106 held by the carrier support unit 110. Accordingly, the at least one pickup head 134a may point towards the carrier panel 106 held by the carrier support unit 110 when the at least one pickup head 134a is at the release position 133a. Hence, the at least one pickup head 134a may be directed or pointed away from the wafer feed unit 120 and in a direction towards the carrier support unit 110 when the at least one pickup head 134a is at the release position 133a.

According to various embodiments, when the at least one pickup head 134a is in the release position 133a for the die bonding apparatus 100 or the die bonder configured for same-side transfer, the at least one pickup head 134a may place the die 104 on the carrier panel 106 for bonding the die 104 to the carrier panel 106. According to various embodiments, the die bonding apparatus 100 or the die bonder configured for same-side transfer may include a single pick-and-move unit 132a, and the at least one pickup head 134a of the single pick-and-move unit 132a may pick up the die 104 from the diced wafer 102 held by the wafer feed unit 120 when the at least one pickup head 134a is at the pickup position 131a, move the die from the pickup position 131a to the release position 133a, and place the die 104 on the carrier panel 106 for bonding the die 104 to the carrier panel 106 when the at least one pickup head 134a is at the release position 133a. Accordingly, the single pick-and-move unit 132a may directly pick up the die 104, move the die 104, and place the die 104 for bonding.

According to various embodiments, the at least one pickup head 134a may turn over the die 104 with respect to an original orientation of the die 104 on the diced wafer 102 held by the wafer feed unit 120 when the at least one pickup head 134a is moved from the pickup position 131a to the release position 133a. Since the wafer side 102a of the diced wafer 102 and the bonding surface 106a of the carrier panel 106 are facing each other, by turning over the die 104 with respect to the original orientation of the die 104 on the diced wafer 102 as the die 104 is moved from the pickup position 131a to the release position 133a, the die 104 may be placed and bonded to the carrier panel 106 such that a disposition of the die 104 with respect to the carrier panel 106 may be the same as a disposition of the die 104 with respect to the diced wafer when the die 104 was on the diced wafer 102. According to various embodiments, the orientation of the die 104 with respect to the at least one pickup head 134a may remain the same when the at least one pickup head 134a is moved from the pickup position 131a to the release position 133a. However, the orientation of the die 104 may be turned over with respect to the original orientation of the die 104 on the diced wafer 102 such that the side of the die 104 previously in contact with the dicing tape 105 of the diced wafer 102 may be turned and directed towards the bonding surface 106a of the carrier panel 106, which faces the wafer side 102a of the diced wafer 102, when the die 104 is moved to the release position 133a by the at least one pickup head 134a. For example, when the die 104 is in an orientation with an active surface of the die 104 facing upwards with respect to the diced wafer 102, by turning over the die 104 with respect to the diced wafer 102 as the die 104 is moved via the at least one pickup head 134a of the single pick-and-move unit 132a of the die transfer module 130, an inactive surface of the die 104 may be directed towards the bonding surface 106a of the carrier panel 106 when the die 104 is moved into position for bonding to the carrier panel 106, and the die 104 may be placed and bonded to the carrier panel 106 with the inactive surface of the die 104 in contact with the bonding surface 106a of the carrier panel 106 and with the active surface of the die 104 facing upwards with respect to the carrier panel 106. Accordingly, by turning over the die 104 via the die transfer module 130 as the die 104 is transferred from the wafer side 102a of the diced wafer 102 to the bonding surface 106a of the carrier panel 106, whereby the wafer side 102a of the diced wafer 102 and the bonding surface 106a of the carrier panel 106 are facing each other, the die 104 may be placed and bonded to the carrier panel 106 such that the disposition of the die 104 with respect to the carrier panel 106 when the die 104 is bonded to the carrier panel 106 may correspond to the disposition of the die 104 with respect to the diced wafer 102 when the die 104 was on the diced wafer 102.

According to various embodiments, the at least one pickup head 134a may be rotatable about a rotational axis 135a (represented by a dash-dot line in the figures) parallel to the supporting plane 111 defined by the at least one support element 112 of the carrier support unit 110 so as to move the at least one pickup head 134a along a curved path 136a (represented by a dotted line in the figures) from the pickup position 131a to the release position 133a as the at least one pickup head 134a is rotated about the rotational axis 135a. Accordingly, by moving the at least one pickup head 134a along the curved path 136a, the die 104 held by the at least one pickup head 134a may be moved from the pickup position 131a to the release position 133a and simultaneously be turned over with respect to the diced wafer 102 as the at least one pickup head 134a is rotated about the rotational axis 135a. Hence, the die 104 may be moved and turned over concurrently by a single rotation motion of the at least one pickup head 134a about the rotational axis 135a.

According to various embodiments, a radial distance of the pickup position 131a on the curved path 136a with respect to the rotational axis 135a may be equal to a radial distance of the release position 133a on the curved path 136a with respect to the rotational axis 135a. Accordingly, the pickup position 131a and the release position 133a may be equidistance from the rotational axis 135a.

According to various embodiments, the pickup position 131a and the release position 133a may be angularly spaced apart with respect to the rotational axis 135a of the pick-and-move unit 132a. For example, according to various embodiments, when the wafer side 102a of the diced wafer 102 and the bonding surface 106a of the carrier panel 106 are substantially parallel to each other, the pickup position 131a and the release position 133a may be 180° apart from each other with respect to the rotational axis 135a of the pick-and-move unit 132a. As another example, when the wafer side 102a of the diced wafer 102 and the bonding surface 106a of the carrier panel 106 are at an angle with respect to each other in a manner so as to generally face each other, the pickup position 131a and the release position 133a may be at a corresponding angle from each other with respect to the rotational axis 135a of the pick-and-move unit 132a.

According to various embodiments, when at least one pickup head 134a of the single pick-and-move unit 132a of the die transfer module 130 of the die bonding apparatus 100 configured for same-side transfer is in the release position 133a, the at least one pickup head 134a may be operable to urge the die 104 towards the carrier panel 106 held by the carrier support unit 110 so as to apply a bonding force to bond the die 104 to the carrier panel 106. Accordingly, the at least one pickup head 134a may urge the die 104 towards the bonding surface 106a of the carrier panel 106. According to various embodiments, the at least one pickup head 134a may be extendable towards the carrier panel 106 held by the carrier support unit 110 for pushing the die 104 towards the carrier panel 106 to bond the die 104 to the carrier panel 106. Accordingly, the at least one pickup head 134a may be extendable towards the bonding surface 106a of the carrier panel 106. According to various embodiments, the at least one pickup head 134a may be extendable substantially perpendicular towards the bonding surface 106a of the carrier panel 106 to urge the die 104 onto the carrier panel 106 for bonding the die 104 to the carrier panel 106.

According to various embodiments, the die transfer module 130 of the die bonding apparatus 100 or the die bonder configured for opposite-sides transfer may include a first pick-and-move unit 132a and a second pick-and-move unit 132b. According to various embodiments, the first pick-and-move unit 132a may include at least one pickup head 134a movable between a pickup position 131a and a release position 133a. According to various embodiments, the pickup position 131a and the release position 133a may be on different sides of the first pick-and-move unit 132a. For example, according to various embodiments, when the wafer side 102a of the diced wafer 102 and the bonding surface 106a of the carrier panel 106 are substantially parallel to each other, the pickup position 131a and the release position 133a may be on opposite sides of the first pick-and-move unit 132a. As another example, when the wafer side 102a of the diced wafer 102 and the bonding surface 106a of the carrier panel 106 are at an angle with respect to each other in a manner so as to generally face each other, the pickup position 131a and the release position 133a may be at a corresponding angular displacement from each other with respect to the first pick-and-move unit 132a. According to various embodiments, the second pick-and-move unit 132b may include at least one pickup head 134b movable between a pickup position 131b and a release position 133b. According to various embodiments, the pickup position 131b and the release position 133*b* may be on different sides of the second pick-and-move unit 132*b*. For example, according to various embodiments, when the wafer side 102*a* of the diced wafer 102 and the bonding surface 106*a* of the carrier panel 106 are substantially parallel to each other, the pickup position 131*b* and the release position 133*b* may be on opposite sides of the second pick-and-move unit 132*b*. As another example, when the wafer side 102*a* of the diced wafer 102 and the bonding surface 106*a* of the carrier panel 106 are at an angle with respect to each other in a manner so as to generally face each other, the pickup position 131*b* and the release position 133*b* may be at a corresponding angular displacement from each other with respect to the second pick-and-move unit 132*b*.

According to various embodiments, the first pick-and-move unit 132*a* and the second pick-and-move unit 132*b* may be arranged in series. According to various embodiments, the first pick-and-move unit 132*a* may pick up the die 104 at the pickup position 131*a* of the first pick-and-move unit 132*a* from the diced wafer 102 held by the wafer feed unit 120 and move the die 104 to the release position 133*a* of the first pick-and-move unit 132*a* for transferring to the second pick-and-move unit 132*b*. According to various embodiments, the second pick-and-move unit 132*b* may receive the die 104 at the pickup position 131*b* of the second pick-and-move unit 132*b* from the first pick-and-move unit 132*a* and move the die to the release position 133*b* of the second pick-and-move unit 132*b* for placing the die 104 on the carrier panel 106 in order to bond the die 104 to the carrier panel 106. Accordingly, the die transfer module 130 with the first pick-and-move unit 132*a* and the second pick-and-move unit 132*b* arranged in series may pick up the die 104 from the diced wafer 102 held by the wafer feed unit 120 via the first pick-and-move unit 132*a*, transfer the die 104 from the first pick-and-move unit 132*a* to the second pick-and-move unit 132*b*, and place the die 104 on the carrier panel 106 for bonding the die 104 to the carrier panel 106 via the second pick-and-move unit 132*b*.

According to various embodiments, when the at least one pickup head 134*a* of the first pick-and-move unit 132*a* is in the pickup position 131*a*, the at least one pickup head 134*a* of the first pick-and-move unit 132*a* may be directed towards the diced wafer 102 held by the wafer feed unit 120 and aligned to the die 104 for picking up the die 104 from the diced wafer 102 held by the wafer feed unit 120. Accordingly, the at least one pickup head 134*a* of the first pick-and-move unit 132*a* may point towards the die 104 on the diced wafer 102 for picking up the die 104 from the diced wafer 102 held by the wafer feed unit 120 when the at least one pickup head 134*a* is at the pickup position 131*a*. Hence, the at least one pickup head 134*a* of the first pick-and-move unit 132*a* may be directed or pointed away from the carrier support unit 110 and in a direction towards the wafer feed unit 120 when the at least one pickup head 134*a* is at the pickup position 131*a*.

According to various embodiments, when the at least one pickup head 134*a* of the first pick-and-move unit 132*a* is in the release position 133*a*, the at least one pickup head 134*a* may be directed away from the diced wafer 102*a* held by the wafer feed unit 120 and directed towards the carrier panel 106 held by the carrier support unit 110. Accordingly, the at least one pickup head 134*a* of the first pick-and-move unit 132*a* may point towards the carrier panel 106 held by the carrier support unit 110 when the at least one pickup head 134*a* is at the release position 133*a*. Hence, the at least one pickup head 134*a* of the first pick-and-move unit 132*a* may be directed or pointed away from the wafer feed unit 120 and in a direction towards the carrier support unit 110 when the at least one pickup head 134*a* is at the release position 133*a*.

According to various embodiments, when the at least one pickup head 134*b* of the second pick-and-move unit 132*b* is in the pickup position 131*b*, the at least one pickup head 134*b* of the second pick-and-move unit 132*b* may be directed towards the diced wafer 102 held by the wafer feed unit 120. Accordingly, the at least one pickup head 134*b* of the second pick-and-move unit 132*b* may be directed or pointed away from the carrier support unit 110 and in a direction towards the wafer feed unit 120 when the at least one pickup head 134*b* is at the pickup position 131*b*. According to various embodiments, when the at least one pickup head 134*b* of the second pick-and-move unit 132*b* is in the pickup position 131*b* and the at least one pickup head 134*a* of the first pick-and-move unit 132*a* is in the release position 133*a*, the at least one pickup head 134*b* of the second pick-and-move unit 132*b* may be directed or pointed towards the at least one pickup head 134*a* of the first pick-and-move unit 132*a* and may be aligned to the at least one pickup head 134*a* of the first pick-and-move unit 132*a* in a manner such that the die 104 may transfer from the at least one pickup head 134*a* of the first pick-and-move unit 132*a* to the at least one pickup head 134*b* of the second pick-and-move unit 132*b*.

According to various embodiments, when the at least one pickup head 134*b* of the second pick-and-move unit 132*b* is in the release position 133*b*, the at least one pickup head 134*b* may be directed away from the diced wafer 102*a* held by the wafer feed unit 120 and directed towards the carrier panel 106 held by the carrier support unit 110. Accordingly, the at least one pickup head 134*b* of the second pick-and-move unit 132*b* may point towards the carrier panel 106 held by the carrier support unit 110 when the at least one pickup head 134*b* is at the release position 133*b*. Hence, the at least one pickup head 134*b* of the second pick-and-move unit 132*b* may be directed or pointed away from the wafer feed unit 120 and in a direction towards the carrier support unit 110 when the at least one pickup head 134*b* is at the release position 133*b*.

According to various embodiments, when the at least one pickup head 134*b* of the second pick-and-move unit 132*b* is in the release position 133*b* for the die bonding apparatus 100 or the die bonder configured for opposite-sides transfer, the at least one pickup head 134*b* of the second pick-and-move unit 132*b* may place the die 104 on the carrier panel 106 for bonding the die 104 to the carrier panel 106. According to various embodiments, the die bonding apparatus 100 or the die bonder configured for opposite-sides transfer may include two pick-and-move units 132*a*, 132*b* for picking up the die 104 from the diced wafer 102 held by the wafer feed unit 120 via the first pick-and-move unit 132*a*, transferring the die 104 from the first pick-and-move unit 132*a* to the second pick-and-move unit 132*b*, and placing the die 104 on the carrier panel 106 for bonding the die 104 to the carrier panel 106 via the second pick-and-move unit 132*b*. Accordingly, the two pick-and-move units 132*a*, 132*b* may be cooperatively operated to pick up the die 104, move the die 104, and place the die 104 for bonding.

According to various embodiments, the at least one pickup head 134*a* of the first pick-and-move unit 132*a* may turn over the die 104 (for a first time) with respect to an original orientation of the die 104 on the diced wafer 102 held by the wafer feed unit 120 when the at least one pickup head 134*a* of the first pick-and-move unit 132*a* is moved from the pickup position 131*a* to the release position 133*a*. According to various embodiments, the at least one pickup head 134*b* of the second pick-and-move unit 132*b* may turn over the die 104 again (or for a second time) when the at least one pickup head 134*b* of the second pick-and-move unit 132*b* is moved from the pickup position 131*b* to the release position 133*b* in a manner so as to return the die 104 back with respect to the diced wafer 102 such that the orientation of the die 104 at the release position 133*b* of the second pick-and-move unit 132*b* with respect to the diced wafer correspond to the original orientation of the die 104 when the die 104 was on the diced wafer 102 held by the wafer feed unit 120. Since the wafer side 102*a* of the diced wafer 102 and the bonding surface 106*a* of the carrier panel 106 are facing each other, by turning over the die 104 with respect to the original orientation of the die 104 on the diced wafer 102 as the die 104 is moved from the pickup position 131*a* of the first pick-and-move unit 132*a* to the release position 133*a* of the first pick-and-move unit 132*a* and turning over the die 104 again as the die 104 is moved from the pickup position 131*b* of the second pick-and-move unit 132*b* to the release position 133*b* of the second pick-and-move unit 132*b*, the die 104 may be placed and bonded to the carrier panel 106 such that orientation disposition of the die 104 with respect to the carrier panel 106 may be opposite to the disposition of the die 104 with respect to the diced wafer 102 when the die 104 was on the diced wafer 102. According to various embodiments, the orientation of the die 104 with respect to the at least one pickup head 134*a* of the first pick-and-move unit 132*a* may remain the same when the at least one pickup head 134*a* of the first pick-and-move unit 132*a* is moved from the pickup position 131*a* of the first pick-and-move unit 132*a* to the release position 133*a* of the first pick-and-move unit 132*a*. However, the orientation of the die 104 may be turned over with respect to the original orientation of the die 104 on the diced wafer 102 such that the side of the die 104 previously in contact with the dicing tape 105 of the diced wafer 102 (or directed towards the diced wafer 102 when held by the at least one pickup head 134*a* of the first pick-and-move unit 132*a* at the pickup position 131*a* of the first pick-and-move unit 132*a*) then may be turned and directed away from the diced wafer 102 when the die 104 is moved to the release position 133*a* of the first pick-and-move unit 132*a* by the at least one pickup head 134*a* of the first pick-and-move unit 132*a*. According to various embodiments, the orientation of the die 104 with respect to the at least one pickup head 134*b* of the second pick-and-move unit 132*b* may remain the same when the at least one pickup head 134*b* of the second pick-and-move unit 132*b* is moved from the pickup position 131*b* of the second pick-and-move unit 132*b* to the release position 133*b* of the second pick-and-move unit 132*b*. However, the orientation of the die 104 may be turned over again with respect to the diced wafer 102 such that the side of the die 104 directed away from the diced wafer 102 when held by the at least one pickup head 134*b* of the second pick-and-move unit 132*b* at the pickup position 131*b* of the second pick-and-move unit 132*b* may be turned and directed towards the diced wafer 102 when the die 104 is moved to the release position 133*b* of the second pick-and-move unit 132*b* by the at least one pickup head 134*b* of the second pick-and-move unit 132*b*. For example, when the die 104 is in an orientation with an active surface of the die 104 facing upwards with respect to the diced wafer 102, by turning over the die 104 (for the first time) with respect to the diced wafer 102 as the die 104 is moved via the at least one pickup head 134*a* of the first pick-and-move unit 132*a* and turning over the die 104 again (for the second time) with respect to the diced wafer 102 as the die 104 is moved via the at least one pickup head 134*b* of the second pick-and-move unit 132*b*, the active surface of the die 104 may be directed towards the bonding surface 106*a* of the carrier panel 106 when the die 104 is moved into position for bonding to the carrier panel 106, and the die 104 may be placed and bonded to the carrier panel 106 with the active surface of the die 104 facing downwards with respect to the carrier panel 106. In other words, the die 104 may be bonded with the active surface facing downward with respect to the carrier panel 106 in contrast to the active surface facing upward when the die 104 was on the diced wafer 102. Accordingly, by turning over the die 104 via the first pick-and-move unit 132*a* and turning over the die 104 again via the second pick-and-move unit 132*b* as the die 104 is transferred from the wafer side 102*a* of the diced wafer 102 to the bonding surface 106*a* of the carrier panel 106, whereby the wafer side 102*a* of the diced wafer 102 and the bonding surface 106*a* of the carrier panel 106 are facing each other, the die 104 may be placed and bonded to the carrier panel 106 such that the disposition of the die 104 with respect to the carrier panel 106 when the die 104 is bonded to the carrier panel 106 may be opposite to the disposition of the die 104 with respect to the diced wafer 102 when the die 104 was on the diced wafer 102.

According to various embodiments, the at least one pickup head 134*a* of the first pick-and-move unit 132*a* may be rotatable about a rotational axis 135*a* parallel to the supporting plane 111 defined by the at least one support element 112 of the carrier support unit 110 so as to move the at least one pickup head 134*a* of the first pick-and-move unit 132*a* along a curved path 136*a* from the pickup position 131*a* of the first pick-and-move unit 132*a* to the release position 133*a* of the first pick-and-move unit 132*a* as the at least one pickup head 134*a* of the first pick-and-move unit 132*a* rotates about the rotational axis 135 of the first pick-and-move unit 132*a*. Accordingly, by moving the at least one pickup head 134*a* of the first pick-and-move unit 132*a* along the curved path 136*a* of the first pick-and-move unit 132*a*, the die 104 held by the at least one pickup head 134*a* may be moved from the pickup position 131*a* of the first pick-and-move unit 132*a* to the release position 133*a* of the first pick-and-move unit 132*a* and simultaneously be turned over with respect to the diced wafer 102 as the at least one pickup head 134*a* of the first pick-and-move unit 132*a* is rotated about the rotational axis 135*a* of the first pick-and-move unit 132*a*. Hence, the die 104 may be moved and turned over with respect to the diced wafer 102 concurrently by a single rotation motion of the at least one pickup head 134*a* of the first pick-and-move unit 132*a* about the rotational axis 135*a* of the first pick-and-move unit 132*a*.

According to various embodiments, a radial distance of the pickup position 131*a* of the first pick-and-move unit 132*a* on the curved path 136*a* of the first pick-and-move unit 132*a* with respect to the rotational axis 135*a* of the first pick-and-move unit 132*a* may be equal to a radial distance of the release position 133*a* of the first pick-and-move unit 132*a* on the curved path 136*a* of the first pick-and-move unit 132*a* with respect to the rotational axis 135*a* of the first pick-and-move unit 132*a*. Accordingly, the pickup position 131*a* of the first pick-and-move unit 132*a* and the release position 133*a* of the first pick-and-move unit 132*a* may be equidistance from the rotational axis 135*a* of the first pick-and-move unit 132*a*.

According to various embodiments, the pickup position 131*a* and the release position 133*a* may be angularly spaced apart with respect to the rotational axis 135*a* of the first pick-and-move unit 132*a*. For example, according to various embodiments, when the wafer side 102*a* of the diced wafer 102 and the bonding surface 106a of the carrier panel 106 are substantially parallel to each other, the pickup position 131a and the release position 133a may be 180° apart from each other with respect to the rotational axis 135a of the first pick-and-move unit 132a. As another example, when the wafer side 102a of the diced wafer 102 and the bonding surface 106a of the carrier panel 106 are at an angle with respect to each other in a manner so as to generally face each other, the pickup position 131a and the release position 133a may be at a corresponding angle from each other with respect to the rotational axis 135a of the first pick-and-move unit 132a.

According to various embodiments, the at least one pickup head 134b of the second pick-and-move unit 132b may be rotatable about a rotational axis 135b (represented by a dash-dot line in the figures) parallel to the supporting plane 111 defined by the at least one support element 112 of the carrier support unit 110 so as to move the at least one pickup head 134b of the second pick-and-move unit 132b along a curved path 136b (represented by a dotted line in the figures) from the pickup position 131b of the second pick-and-move unit 132b to the release position 133b of the second pick-and-move unit 132b as the at least one pickup head 134b of the second pick-and-move unit 132b rotates about the rotational axis 135 of the second pick-and-move unit 132b. Accordingly, by moving the at least one pickup head 134b of the second pick-and-move unit 132b along the curved path 136b of the second pick-and-move unit 132b, the die 104 held by the at least one pickup head 134b may be moved from the pickup position 131b of the second pick-and-move unit 132b to the release position 133b of the second pick-and-move unit 132b and simultaneously be turned over with respect to the diced wafer 102 as the at least one pickup head 134b of the second pick-and-move unit 132b is rotated about the rotational axis 135b of the second pick-and-move unit 132b. Hence, the die 104 may be moved and turned over with respect to the diced wafer 102 concurrently by a single rotation motion of the at least one pickup head 134b of the second pick-and-move unit 132b about the rotational axis 135b of the second pick-and-move unit 132b.

According to various embodiments, a radial distance of the pickup position 131b of the second pick-and-move unit 132b on the curved path 136b of the second pick-and-move unit 132b with respect to the rotational axis 135b of the second pick-and-move unit 132b may be equal to a radial distance of the release position 133b of the second pick-and-move unit 132b on the curved path 136b of the second pick-and-move unit 132b with respect to the rotational axis 135b of the second pick-and-move unit 132b. Accordingly, the pickup position 131b of the second pick-and-move unit 132b and the release position 133b of the second pick-and-move unit 132b may be equidistance from the rotational axis 135b of the second pick-and-move unit 132b.

According to various embodiments, the pickup position 131b and the release position 133b may be angularly spaced apart with respect to the rotational axis 135b of the second pick-and-move unit 132b. For example, according to various embodiments, when the wafer side 102a of the diced wafer 102 and the bonding surface 106a of the carrier panel 106 are substantially parallel to each other, the pickup position 131b and the release position 133b may be 180° apart from each other with respect to the rotational axis 135b of the second pick-and-move unit 132b. As another example, when the wafer side 102a of the diced wafer 102 and the bonding surface 106a of the carrier panel 106 are at an angle with respect to each other in a manner so as to generally face each other, the pickup position 131b and the release position 133b may be at a corresponding angle from each other with respect to the rotational axis 135b of the second pick-and-move unit 132b.

According to various embodiments, when at least one pickup head 134b of the second pick-and-move unit 132b of the die transfer module 130 of the die bonding apparatus 100 configured for opposite-sides transfer is in the release position 133b, the at least one pickup head 134b of the second pick-and-move unit 132b may be operable to urge the die 104 towards the carrier panel 106 held by the carrier support unit 110 so as to apply a bonding force to bond the die 104 to the carrier panel 106. Accordingly, the at least one pickup head 134b of the second pick-and-move unit 132b may urge the die 104 towards the bonding surface 106a of the carrier panel 106. According to various embodiments, the at least one pickup head 134b of the second pick-and-move unit 132b may be extendable towards the carrier panel 106 held by the carrier support unit 110 for pushing the die 104 towards the carrier panel 106 to bond the die 104 to the carrier panel 106. Accordingly, the at least one pickup head 134b of the second pick-and-move unit 132b may be extendable towards the bonding surface 106a of the carrier panel 106. According to various embodiments, the at least one pickup head 134b of the second pick-and-move unit 132b may be extendable substantially perpendicular towards the bonding surface 106a of the carrier panel 106 to urge the die 104 onto the carrier panel 106 for bonding the die 104 to the carrier panel 106.

Referring to FIG. 4A, FIG. 4B, FIG. 5A and FIG. 5B, according to various embodiments, each pick-and-move unit 132a, 132b may include two or more pickup heads 134a, 134b. According to various embodiments, the two or more pickup heads 134a, 134b of each pick-and-move unit 132a, 132b may be distributed around the rotational axis 135a, 135b thereof. For example, according to various embodiments, the two or more pickup heads 134a, 134b of each pick-and-move unit 132a, 132b may be equally distributed around the rotational axis 135a, 135b thereof. According to various embodiments, the two or more pickup heads 134a, 134b of each pick-and-move unit 132a, 132b may be rotatable about the rotational axis 135a, 135b thereof for sequentially picking up of the plurality of dies 104 from the diced wafer 102, transferring the plurality of dies 104, and bonding the plurality of dies 104 on the carrier panel 106.

According to various embodiments, each pickup head 134a, 134b may include an attachment element for engaging and holding the die 104. According to various embodiments, the attachment element may include, but not limited to, vacuum suction element such as vacuum holes or vacuum cups or vacuum ports, or gripping elements such as grippers or clamps, or magnetic element such as electro-magnet.

According to various embodiments, when the at least one pickup head 134a (FIG. 4A & FIG. 4B), 134b (FIG. 5A & FIG. 5B) of the pick-and-move unit 132a (FIG. 4A & FIG. 4B), 132b (FIG. 5A & FIG. 5B) is capable of urging the die 104 towards the carrier panel 106, the at least one pickup head 134a, 134b may be considered as a type of bonding head for bonding the die 104 to the carrier panel 106 and such pick-and-move unit 132a, 132b may be referred to as a die attach unit so as to differentiate from the pick-and-move unit 132a which is for mere picking and transferring of die 104 without the ability to apply the urging force for bonding the die 104. According to various embodiments, the pick-and-move unit 132a (FIG. 5A & FIG. 5B) which is for mere picking and transferring of die 104 may be referred to as a flip unit so as to differentiate from the pick-and-move unit 132a, 132b that has the ability for applying the urging force. Accordingly, the die transfer module 130 of the die bonding apparatus 100 configured for same-side transfer may include only the die attach unit (FIG. 4A & FIG. 4B), whereas the die transfer module 130 of the die bonding apparatus 100 configured for opposite-sides transfer may include the flip unit and the die attach unit (FIG. 5A & FIG. 5B).

According to various embodiments, in the die transfer module 130 of the die bonding apparatus 100 configured for same-side transfer (FIG. 4A & FIG. 4B), the die transfer module 130 may include the die attach unit, wherein the die attach unit may include two or more bonding heads distributed around the rotational axis 135a of the die attach unit in a manner so as to be rotatable about the rotational axis 135a of the die attach unit for sequentially bonding the plurality of dies 104 to the carrier panel 106, respectively, as the two or more bonding heads rotate about the rotational axis 135a of the die attach unit.

According to various embodiments, in the die transfer module 130 of the die bonding apparatus 100 configured for opposite-sides transfer (FIG. 5A & FIG. 5B), the flip unit and the die attach unit may be arranged in series from the wafer feed unit 120 to the carrier support unit 110, whereby the flip unit may be between the wafer feed unit 120 and the die attach unit while the die attach unit may be between the flip unit and the carrier support unit 110. Accordingly, in the die transfer module 130 of the die bonding apparatus 100 configured for opposite-sides transfer, the die transfer module 130 may include the flip unit, and the flip unit include two or more pickup heads 134a distributed around the rotational axis 135a of the flip unit in a manner so as to be rotatable about the rotational axis 135a of the flip unit for sequentially picking up the plurality of dies 104 from the diced wafer 102 and then transferring the plurality of dies 104 to the two or more bonding heads of the die attach unit, respectively, as the two or more pickup heads 134a rotate about the rotational axis 135a of the flip unit. Further, the die transfer module 130 may include the die attach unit, and the die attach unit may include two or more bonding heads distributed around the rotational axis 135b of the die attach unit in a manner so as to be rotatable about the rotational axis 135b of the die attach unit for sequentially bonding the plurality of dies 104 to the carrier panel 106, respectively, as the two or more bonding heads rotate about the rotational axis 135b of the die attach unit Referring to FIG. 4A to FIG. 5B, according to various embodiments, the sensing arrangement 150 may include a die picking sensing arrangement 152 and a die placement sensing arrangement 154. According to various embodiments, the die picking sensing arrangement 152 may include at least one sensor 152a to determine a position of the die 104 with respect to a predetermined pick-up location for controlling the movement of the wafer feed unit 120 along the wafer movement plane 128 to align the die 104 to the predetermined pick-up location. According to various embodiments, the predetermined pick-up location may coincide or overlap with the pickup position 131a of the pickup head 134a of the pick-and-move unit 132a of the die transfer module 130. Accordingly, the die picking sensing arrangement 152 may provide feedback for moving the wafer feed unit 120 in order to move the die to the predetermined pick-up location for picking up by the die transfer module 130. According to various embodiments, the die placement sensing arrangement 154 may include at least one sensor 154a to determine a position of the die 104 picked up by the die transfer module 130 with respect to a target placement location on the carrier panel 106 held by the carrier support unit 110 for controlling a movement of the carrier support unit 110 to move the carrier panel 106 and a movement of the die transfer module 130 in order to move the die 104 and the carrier panel 106 relative to each other in a manner so as to align the target placement location on the carrier panel 106 and the die 104 for the die transfer module 130 to place the die 104 on the carrier panel 106 for bonding the die to the carrier panel 106. Accordingly, the die placement sensing arrangement 154 may provide feedback for moving the die 104 via the die transfer module 130 and the carrier panel 106 via the carrier support unit 110 to align the die 104 and the target placement location on the carrier panel 106 for placing and bonding the die 104 to the carrier panel 106. According to various embodiments, the sensor 152a, 154a may include, but not limited to, vision sensors, cameras, photoelectric sensor, laser sensor, line sensor, displacement sensor, profile sensor, etc.

Referring to FIG. 4A to FIG. 5B, according to various embodiments, the die bonding apparatus 100 or the die bonder may include an ejector 160. According to various embodiments, the ejector 160 may be disposed on a side of the wafer feed unit 120 away from the die transfer module 130. Accordingly, the wafer feed unit 120 may be between the ejector 160 and the die transfer module 130. According to various embodiments, the ejector 160 may be on the tape side 102b of the diced wafer 102. Accordingly, the ejector 160 may be for quick ejecting and touching the dicing tape 105 of the diced wafer 102 from the tape side 102b of the diced wafer 102 in order to push the die 104 out of the dicing tape 105. According to various embodiments, the ejector 160 may include an ejector head 162. According to various embodiments, the ejector head 162 may be extendable in an extension direction substantially perpendicular to the dicing tape 105 of the diced wafer 102. According to various embodiments, the ejector head 162 of the ejector 160 may be extendable into the predetermined pick-up location of the die 104. Accordingly, since the pickup position 131a of the pick-and-move unit 132a is aligned to the predetermined pick-up location of the die 104, the ejector head 162 of the ejector 160 may be aligned to the pickup position 131a of the pick-and-move unit 132a. According to various embodiments, the ejector head 162 of the ejector 160 may be operable to contact the dicing tape 105 of the diced wafer 102 from the tape side 102b of the diced wafer 102 in a manner so as to push the die 104 on the wafer side 102a of the diced wafer 102 at the predetermined pick-up location towards the pickup head 134a at the pickup position 131a for the die 104 to be picked up by the pickup head 134a of the pick-and-move unit 132a. Accordingly, the ejector head 162 of the ejector 160 and the pickup head 134a of the pick-and-move unit 132a may be cooperatively operable to pick up the die 104 from the wafer side 102a of the diced wafer 102.

FIG. 6A to FIG. 6F shows a die bonding process using the die bonding apparatus 100 or the die bonder according to various embodiments. In FIG. 6A to FIG. 6F, the die transfer module 130 of the die bonding apparatus 100 is illustrated with the first pick-and-move unit 132a and the second pick-and-move unit 132b. Each of the first pick-and-move unit 132a and the second pick-and-move unit 132b is illustrated with two pick-up heads 134a, 134a-1, 134b, 134b-1 directly opposite each other. Further, the sensing arrangement 150 is illustrated with the die picking sensing arrangement 152 having one sensor 152a and the die placement sensing arrangement 154 having a first sensor 154a, a second sensor 154b, and a third sensor 154c.

Figure 6A:
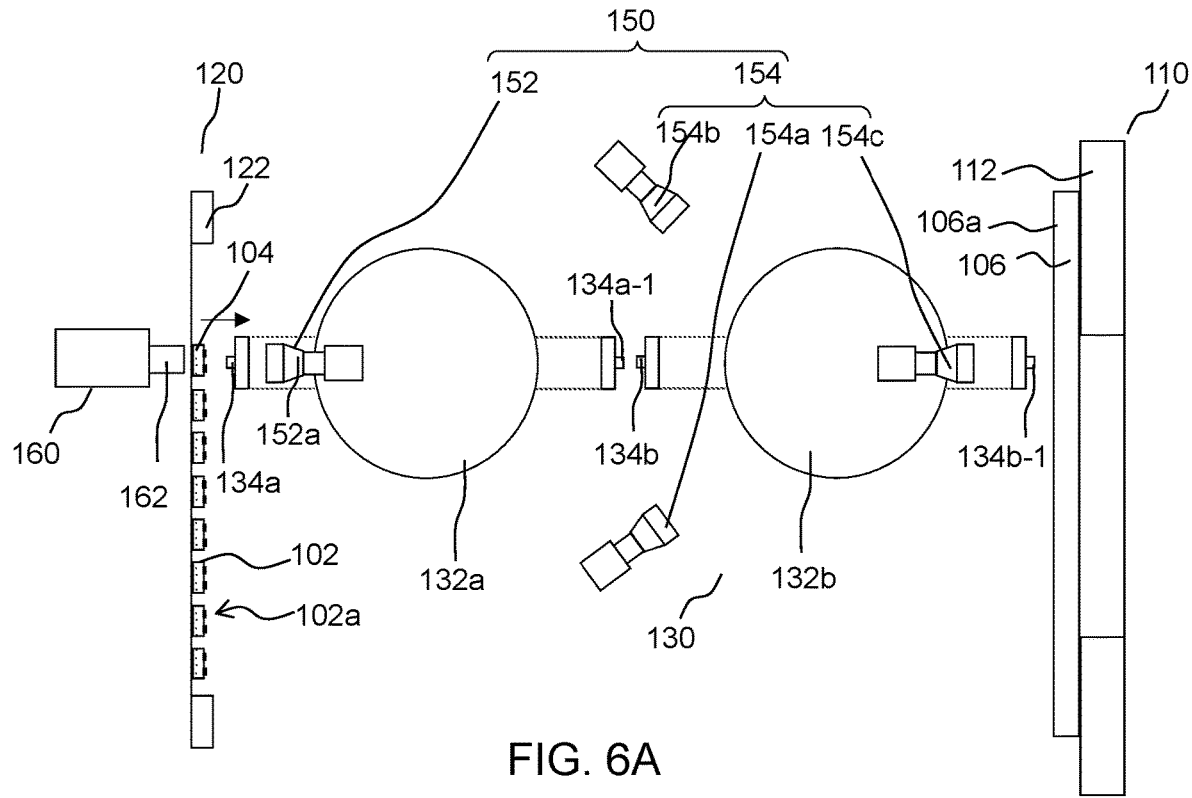
FIG. 6A to FIG. 6F shows a die bonding process using the die bonding apparatus or the die bonder according to various embodiments.

Referring to FIG. 6A, according to various embodiments, the die bonding process may start with material loading. During material loading, the diced wafer 102 may be loaded to the wafer feed unit 120, a bar code of the diced wafer 102 may be checked, a wafer map of the diced wafer 102 may be downloaded, and referencing of a wafer centre and the first die 104 may be conducted. Subsequently, the wafer feed unit 120 may be moved so as to move the diced wafer 102 for aligning the first die 104 to the pre-determined pickup location so as to be in alignment with the ejector head 162 of the ejector 160. Accordingly, a centre of the first die 104 may be aligned to meet or coincide with a centre of the ejector head 162 of the ejector 160. Further, the carrier panel 106 may be moved into position to standby for the bonding of the first die 104 onto the bonding surface 106a of the carrier panel 106.

Figure 6B:
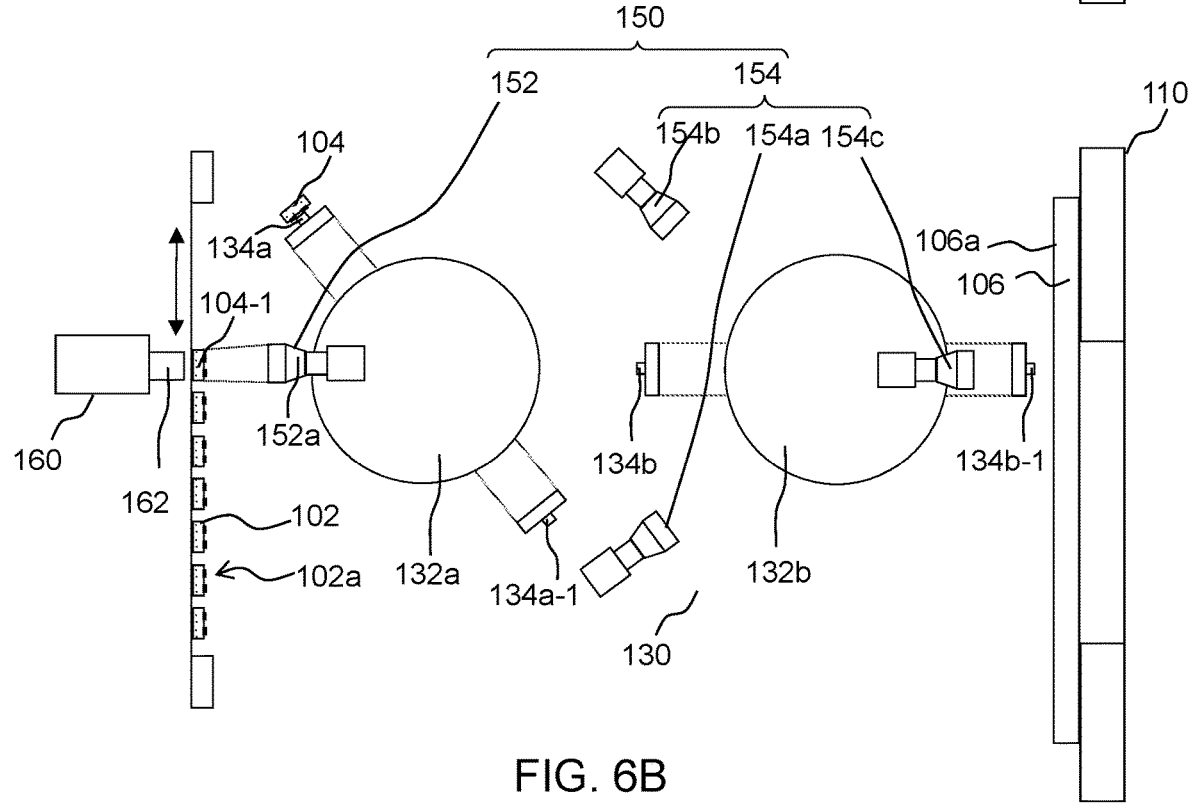

Referring to FIG. 6B, according to various embodiments, the die bonding process may proceed with the ejection of the first die 104 by the ejector head 162 of the ejector 160 and the picking up of the first die 104 by the pickup head 134a of the first pick-and-move unit 132a (or the flip unit or also known as a flipper). The pickup head 134a of the first pick-and-move unit 132a may be rotated about the rotational axis 135a so as to move the pickup head 134a with the first die 104 along the curved path 136a. According to various embodiments, the sensor 152a of the die picking sensing arrangement 152 may be directed towards the wafer side 102a of the diced wafer 102 for detecting the dies 104 on the diced wafer 102. According to various embodiments, the sensor 152a of the die picking sensing arrangement 152 may be a camera (or called a wafer camera). Accordingly, the camera (i.e. the sensor 152a) may be directed towards the wafer side 102a of the diced wafer 102 for capturing images of the diced wafer 102 at the pre-determined pickup location. According to various embodiments, when the pickup head 134a of the first pick-and-move unit 132a is rotated such that the pickup head 134a clears a field of view of the camera (i.e. the sensor 152a), the wafer feed unit 120 may be moved so as to move the diced wafer 102 for aligning the next die 104-1 to the pre-determined pickup location. The camera (i.e. the sensor 152a) may then capture the image the next die 104-1 and verify the position of the next die 104-1 before being picked up (for example, see the fine-dotted lines projecting from the sensor 152a). If the position of the next die 104-1 is missed aligned or out of alignment with the pre-determined pickup location (or the centre of the ejector head 162 of the ejector 160), the wafer feed unit 120 may be moved so as to move the diced wafer 102 for corrective movement to adjust the next die 104-1 for alignment with the pre-determined pickup location.

Figure 6C:
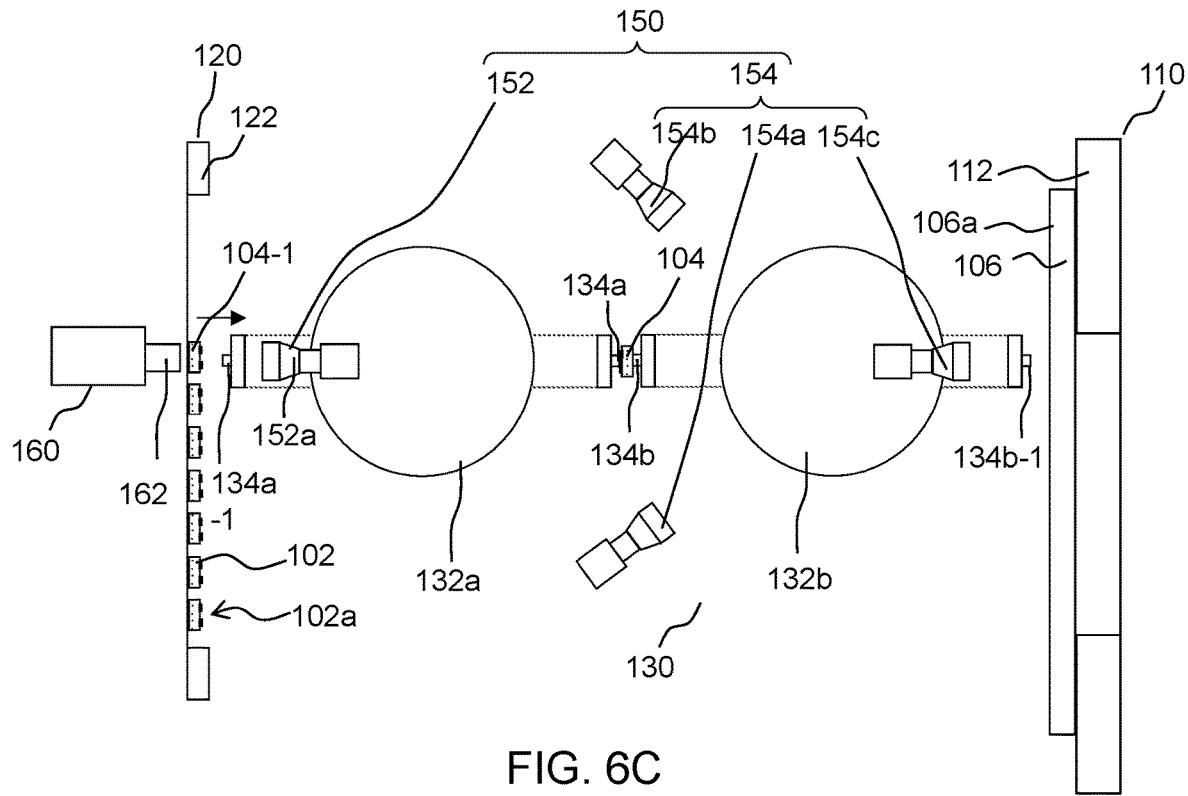

Referring to FIG. 6C, according to various embodiments, the die bonding process may continue with the first die 104 being transferred or handed over to the pickup head 134b of the second pick-and-move unit 132b (or the die attach unit or also known as a unflip module). When the pickup head 134a of the first pick-and-move unit 132a transfers the first die 104 to the pickup head 134b of the second pick-and-move unit 132b, the other pickup head 134a-1 of the first pick-and-move unit 132a may pick up the next die 104-1. Similarly, the ejector head 162 of the ejector 160 may eject the next die 104-1 as the other pickup head 134a-1 of the first pick-and-move unit 132a picks up the next die 104-1.

Figure 6D:
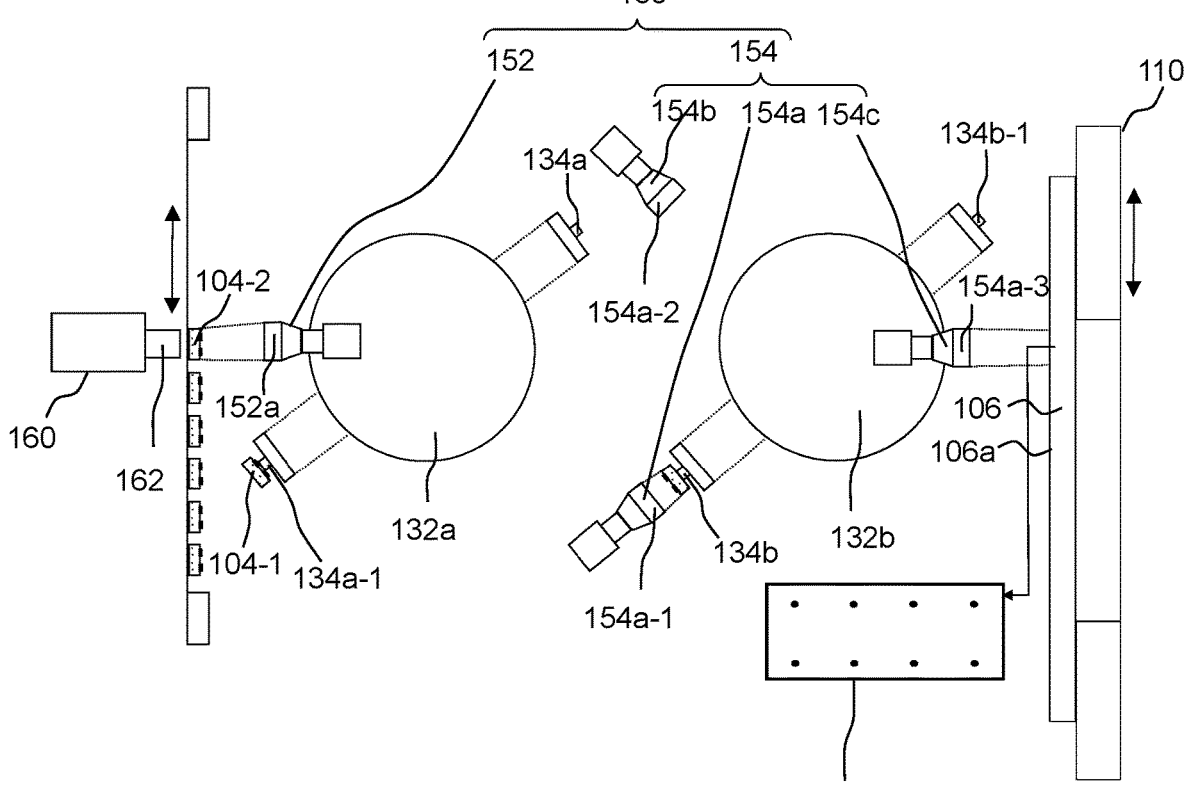

Referring to FIG. 6D, according to various embodiments, after the next die 104-1 is picked up by the other pickup head 134a-1 of the first pick-and-move unit 132a, the first pick-and-move unit 132a may repeat rotating the first pick-and-move unit 132a for rotating the other pickup head 134a-1 of the first pick-and-move unit 132a to clear the field of view of the camera (i.e. the sensor 152a). The wafer feed unit 120 may be then be moved again so as to move the diced wafer 102 for aligning the further die 104-2 to the pre-determined pickup location. The camera (i.e. the sensor 152a) may then capture the image the further die 104-2 and verify the position of the further die 104-2 before being picked up. If the position of the further die 104-2 is missed aligned or out of alignment with the pre-determined pickup location (or the centre of the ejector head 162 of the ejector 160), the wafer feed unit 120 may be moved again so as to move the diced wafer 102 for corrective movement to adjust the further die 104-2 for alignment with the pre-determined pickup location.

At the same time, according to various embodiments, the pickup head 134b of the second pick-and-move unit 132b with the first die 104 may be rotated about the rotational axis 135b. According to various embodiments, the first sensor 154a of the die placement sensing arrangement 154 may be a first camera (or a first die camera 154a-1), the second sensor 154b of the die placement sensing arrangement 154 may be a second camera (or a second die camera 154a-2) and the third sensor 154c may be a third camera (or a panel camera 154a-3). The pickup head 134b of the second pick-and-move unit 132b with the first die 104 may be rotated to a pre-set angle for aligning with the first camera (i.e. the first sensor 154a). The first camera may capture the image of the first die 104 at a dynamic or static position (for example, see the fine-dotted lines projecting from the first sensor 154a to the first die 104). While the first camera is capturing image of the first die 104, the third camera (i.e. the third sensor 154c) may capture image of the bonding surface 106a of the carrier panel 106 to capture the target placement location on the carrier panel 106 for the first die 104 (for example, see the fine-dotted lines projecting from the third sensor 154c to the carrier panel 106). A sample image capture by the third camera is show as 199 in FIG. 6D. According to various embodiments, the target placement location (or bonding position) may be marked or represented by a set of four points (or holes). According to various embodiments, the carrier panel position data captured by the third camera (i.e. the third sensor 154c) and the die position data captured by the first camera (i.e. the first sensor 154a) may be processed by a controller to calculate the relative offset. According to various embodiments, corrective motion may be performed to achieve position and orientating the first die 104 to the target placement location. According to various embodiments, the corrective motion may be performed on the carrier panel 106 via the carrier support unit 110, or the first die 104 via the pickup head 134b of the second pick-and-move unit 132b, or a combination of both. For example, according to various embodiments, an orientation or angle correction of the first die 104 may be performed by the pickup head 134b of the second pick-and-move unit 132b, and the position correction may be performed by moving the carrier panel 106 via the carrier support unit 110.

Figure 6E:
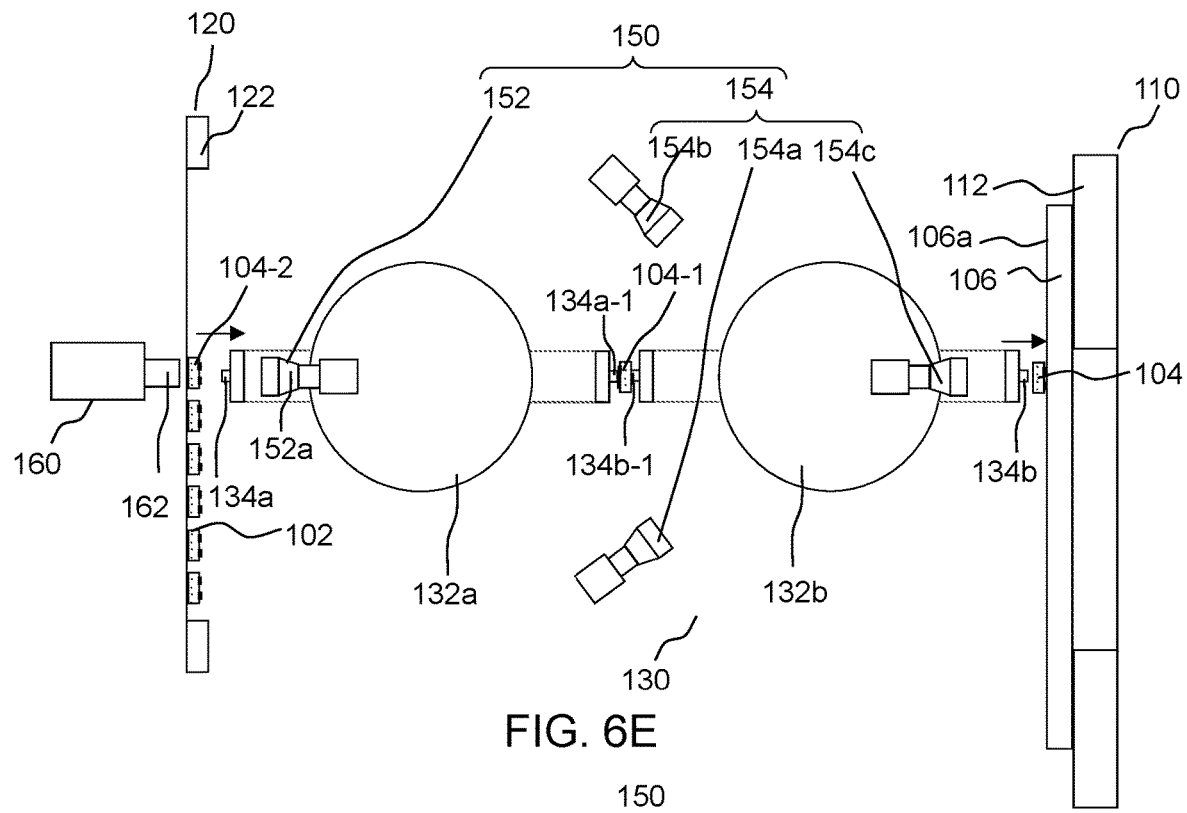

Referring to FIG. 6E, according to various embodiments, the pickup head 134b of the second pick-and-move unit 132b may then be rotated to align the first die 104 to the target placement location. Subsequently, the pickup head 134b of the second pick-and-move unit 132b may place the first die 104 on the bonding surface 106a of the carrier panel 106 and urge the first die 104 towards the bonding surface 106a of the carrier panel 106 for bonding the first die 104 to the carrier panel 106. Concurrently, the first pick-and-move unit 132a may be rotated such that the other pickup head 134a-1 of the first pick-and-move unit 132a holding the next die 104-1 may be aligned to the other pickup head 134b-a of the second pick-and-move unit 132b. Accordingly, the next die 104-1 may be transferred from the other pickup head 134a-1 of the first pick-and-move unit 132a to the other pickup head 134b-a of the second pick-and-move unit 132b. At the same time, the pickup head 134a of the first pick-and-move unit 132a may pick up the further die 104-2 from the diced wafer 102.

Figure 6F:
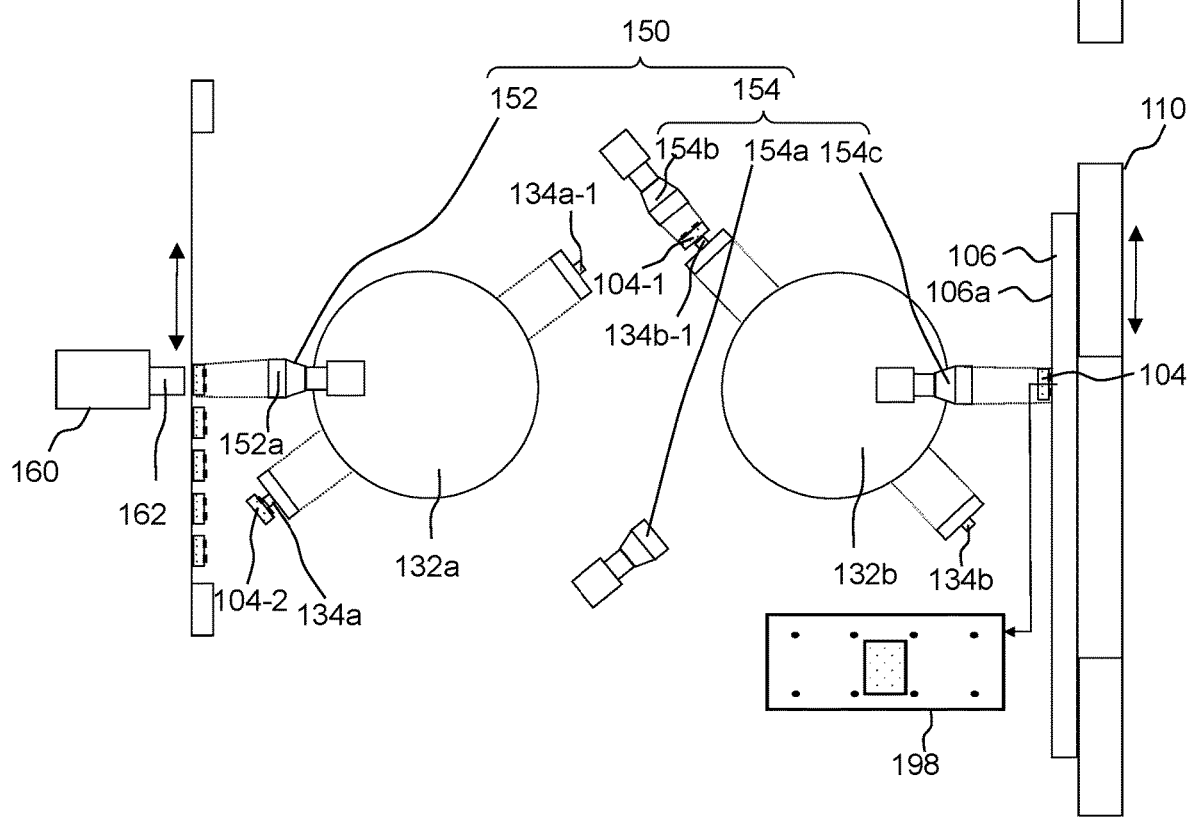

Referring to FIG. 6F, according to various embodiments, after the first die 104 is bonded to the carrier panel 106, the next die 104-1 is transferred to the other pickup head 134b-1 of the second pick-and-move unit 132b and the further die 104-2 is picked up by the pickup head 134a of the first pick-and-move unit 132a, the first pick-and-move unit 132a may repeat rotation for the pickup head 134 of the first pick-and-move unit 132a to clear the field of view of the camera (i.e. the sensor 152a) and the second pick-and-move unit 132b may repeat rotation for the other pickup head 134b-1 of the second pick-and-move unit 132b to align with the second camera (i.e. the second sensor 154b). While the first pick-and-move unit 132a and the second pick-and-move unit 132b are rotated, the third camera (i.e. the third sensor 154c) may capture the image of the first die 104 bonded on the carrier panel 106 to perform post-bond inspection for measuring the bonded position of the first die 104 relative to the target placement position on the carrier panel 106. A sample image capture by the third camera for post-bond inspection is show as 198 in FIG. 6F. According to various embodiments, the post-bond inspection may be carried out as the plurality of dies 104 are being bonded to the carrier panel 106. Accordingly, the post-bond inspection may be carried out before die bonding is completed for the entire carrier panel 106. Hence, inaccuracy or any other defects may be detected before die bonding is completed for the entire carrier panel 106 as compared to conventional method whereby post-bond inspection is only conducted after die bonding is completed for the entire carrier panel 106.

According to various embodiments, the two pick-up heads 134a, 134a-1, 134b, 134b-1 of each of the first pick-and-move unit 132a and the second pick-and-move unit 132b may provide the advantage of a reciprocating configuration. According to various embodiments, each of the first pick-and-move unit 132a and the second pick-and-move unit 132b may alternate between clockwise and anti-clockwise rotation. In this manner, electrical cables (or wires) and/or vacuum tubes for the pick-up heads 134a, 134a-1, 134b, 134b-1 of each of the first pick-and-move unit 132a and the second pick-and-move unit 132b may not be continuously turn. Further, the management and data tracking of the pick-up heads 134a, 134a-1, 134b, 134b-1 may be simpler. According to various embodiments, higher throughput may be achieved with higher number of pick-up heads 134a, 134a-1, 134b, 134b-1. According to various embodiments, higher number of pick-up heads 134a, 134a-1, 134b, 134b-1 may also allow the image of the die 104 be captured at a stationary position.

According to various embodiments, after the first die 104 is successfully bonded to the carrier panel 106 and the second pick-and-move unit 132b is rotated to move the pickup head 134b of the second pick-and-move unit 132b to clear from the field of view of the third camera (i.e. the third sensor 154c), the carrier support unit 110 may be moved to start moving the target placement location for the next die 104-1 into position immediately after the third camera (i.e. the third sensor 154c) captures the image of the target placement location for the next die 104-1 and sends the data for computation of the offset relative to the next die 104-1, while the offset value may be updated dynamically to the carrier support unit 110 such that carrier support unit 110 may continuously move for offset correction as the carrier support unit 110 is moving the target placement location for the next die 104-1 into position, whereby the carrier panel 106 may be moved into the target placement location for the next die 104-1 and moved for offset correction in one single movement.

According to various embodiments, after the first die 104 is successfully bonded to the carrier panel 106 and the second pick-and-move unit 132b is rotated to move the pickup head 134b of the second pick-and-move unit 132b to clear from the field of view of the third camera (i.e. the third sensor 154c), the third camera (i.e. the third sensor 154c) may capture the image of the target placement location for the next die 104-1 and send the data for computation of the offset relative to the next die 104-1. The carrier support unit 110 may wait for the correction information to be received before moving the carrier panel 106 to move the target placement location for the next die 104-1 into position and including the offset correction into the movement.

According to various embodiments, after the first die 104 is successfully bonded to the carrier panel 106 and the second pick-and-move unit 132b is rotated to move the pickup head 134b of the second pick-and-move unit 132b to clear from the field of view of the third camera (i.e. the third sensor 154c), the carrier support unit 110 may be moved to start moving the target placement location for the next die 104-1 into position. Upon completion of the movement by the carrier support unit 110, the third camera (i.e. the third sensor 154c) may capture the image of the target placement location for the next die 104-1 and send the data for computation of the offset relative to the next die 104-1. The carrier support unit 110 may wait for the correction information to be received before moving the carrier panel 106 one more time to perform the offset. Hence, moving the carrier panel 106 to move target placement location for the next die 104-1 into position and moving the carrier panel 106 for offset correction may be two distinct movements.

According to various embodiments, the first pick-and-move unit 132a may include more than two pickup heads 134a. Similarly, according to various embodiments, the second pick-and-move unit 132b may include more than two pickup heads 134b. For example, the first pick-and-move unit 132a may include four or six or eight pickup heads 134a and/or the second pick-and-move unit 132b may include four or six or eight pickup heads 134b.

According to various embodiments, when the second pick-and-move unit 132b has four pickup heads 134a angularly spaced apart equally, the first camera (i.e. the first sensor 154a) and the second camera (i.e. the second sensor 154b) of the die placement sensing arrangement 154 may be spaced angularly 90° apart with respect to the second pick-and-move unit 132b from the bonding position of the second pick-and-move unit 132b. Accordingly, the first camera (i.e. the first sensor 154a) and the second camera (i.e. the second sensor 154b) of the die placement sensing arrangement 154 may capture the image of the next die 104-1 when the first die 104 is being bonded to the carrier panel 106. At the same time, while the third camera (i.e. the third sensor 154c) of the die placement sensing arrangement 154 is capturing the image of the first die 104 for post-bond inspection, the target placement location for the next die 104-1 may also be visible and, thus, may be imaged and measured (for pre-bond inspection). With both the die and panel positions data available, the offset calculation may be performed for the next die 104-1 while the first die 104 is being bonded to the carrier panel 106.

According to various embodiments, as a variation, if the subsequent dies are not yet visible for capturing the respective die position data, the third camera (i.e. the third sensor 154c) of the die placement sensing arrangement 154 may look ahead a few target placement location and stores the information in memory for subsequently offset calculation. According to various embodiments, the post-bond inspection may be performed after the carrier support unit 110 has moved the carrier panel 106 to move the target placement location for the next die 104-1 into position if the bonded first die 104 may be still visible by the third camera (i.e. the third sensor 154c) of the die placement sensing arrangement 154. According to various embodiments, the post-bond inspection may be performed after the carrier support unit 110 has moved the carrier panel 106 a few times until a clear view of the bonded first die 104 is visible by the third camera (i.e. the third sensor 154c) of the die placement sensing arrangement 154.

Figure 7A:
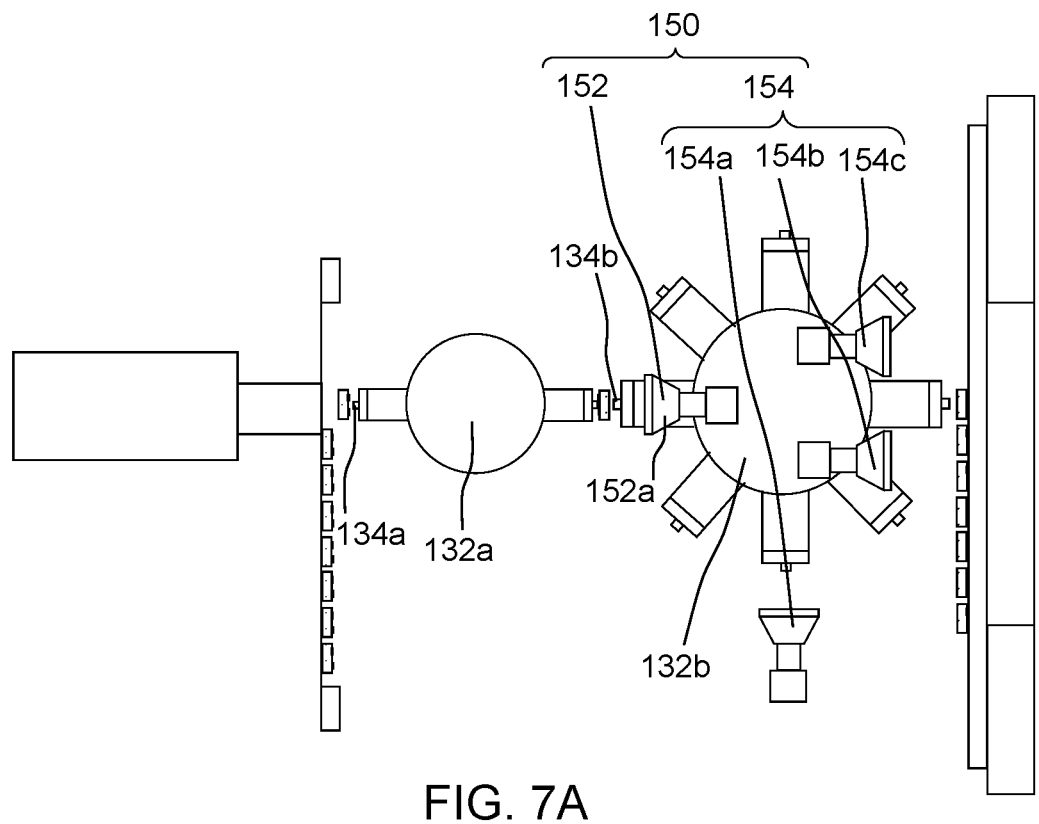
FIG. 7A shows a top view of a schematic diagram of the die bonding apparatus or the die bonder according to various embodiments.
Figure 7B:
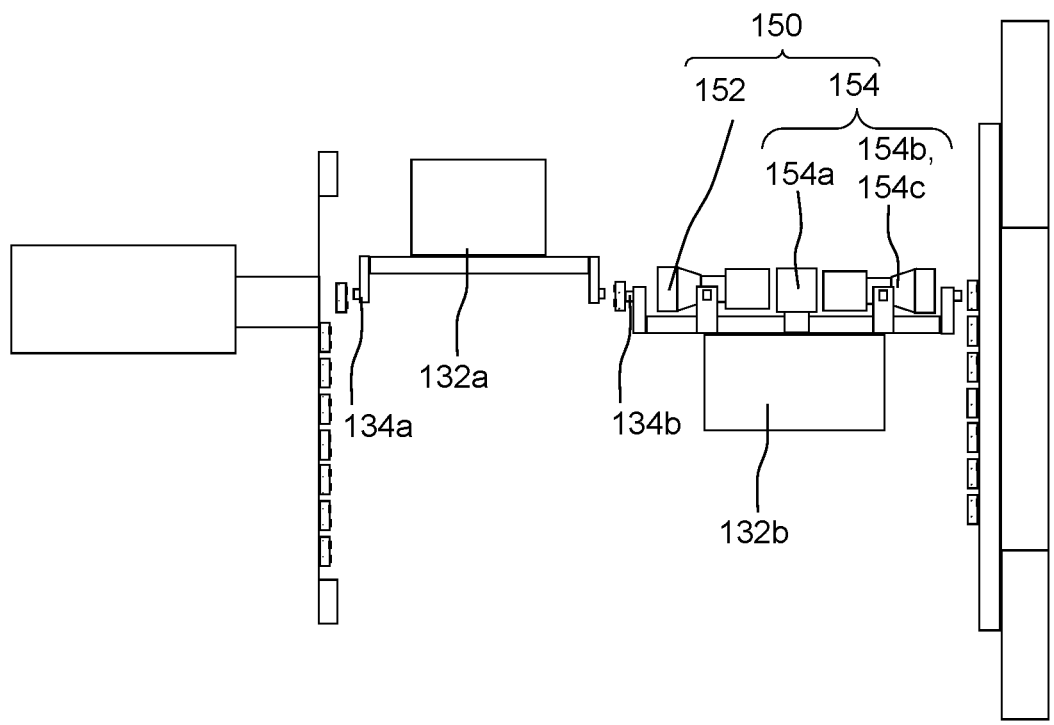
FIG. 7B shows a side view of the die bonding apparatus or the die bonder of FIG. 7A according to various embodiments.

FIG. 7A shows a top view of a schematic diagram of the die bonding apparatus 100 or the die bonder according to various embodiments. FIG. 7B shows a side view of the die bonding apparatus 100 of FIG. 7A according to various embodiments. In FIG. 7A and FIG. 7B, the die transfer module 130 of the die bonding apparatus 100 is illustrated with the first pick-and-move unit 132a having two pick-up heads 134a and the second pick-and-move unit 132b having eight pick-up heads 134b equally distributed around the second pick-and-move unit 132b. Further, the sensing arrangement 150 is illustrated with the die picking sensing arrangement 152 having one sensor 152a and the die placement sensing arrangement 154 having a first sensor 154a, a second sensor 154b, and a third sensor 154c. As shown in FIG. 7A and FIG. 7B, the sensing arrangement 150 is shown to be in an arrangement different from that as shown in FIG. 6A to FIG. 6F. According to various embodiments, the sensor 152a of the die picking sensing arrangement 152 may be a camera (or a wafer camera). Accordingly, the camera (i.e. the sensor 152a) may be directed towards the wafer side 102a of the diced wafer 102 for capturing images of the diced wafer 102 at the pre-determined pickup location. According to various embodiments, the first sensor 154a of the die placement sensing arrangement 154 may be a first camera (or a first die camera), the second sensor 154b of the die placement sensing arrangement 154 may be a second camera (or a first panel camera) and the third sensor 154c may be a third camera (or a second panel camera). The first camera (i.e. the first sensor 154a) may be for capturing an image of the die 104. The second camera (i.e. the second sensor 154b) and the third camera (i.e. the third sensor 154c) may be for capturing images of the bonding surface 106a of the carrier panel 106 to capture the target placement locations. As shown in FIG. 7A and FIG. 7B, the second camera (i.e. the second sensor 154b) and the third camera (i.e. the third sensor 154c) may be in a side-by-side arrangement. As shown in FIG. 7B, according to various embodiments, the camera (i.e. the sensor 152a) of the die picking sensing arrangement 152 as well as the first camera (i.e. the first sensor 154a), the second camera (i.e. the second sensor 154b) and the third camera (i.e. the third sensor 154c) may be disposed above the second pick-and-move unit 132b. Further, according to various embodiments, the first pick-and-move unit 132a may be suspended downwards and the second pick-and-move unit 132b may be supported upwards.

Figure 8A:
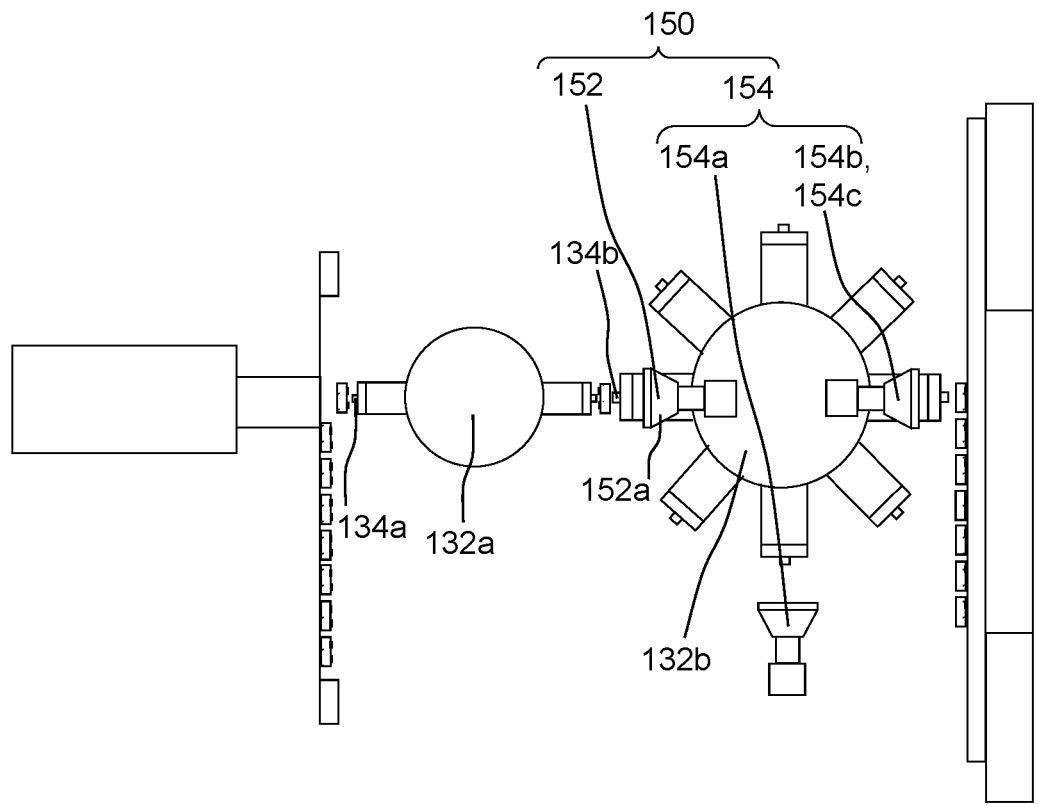
FIG. 8A shows a top view of a schematic diagram of the die bonding apparatus or the die bonder according to various embodiments.
Figure 8B:
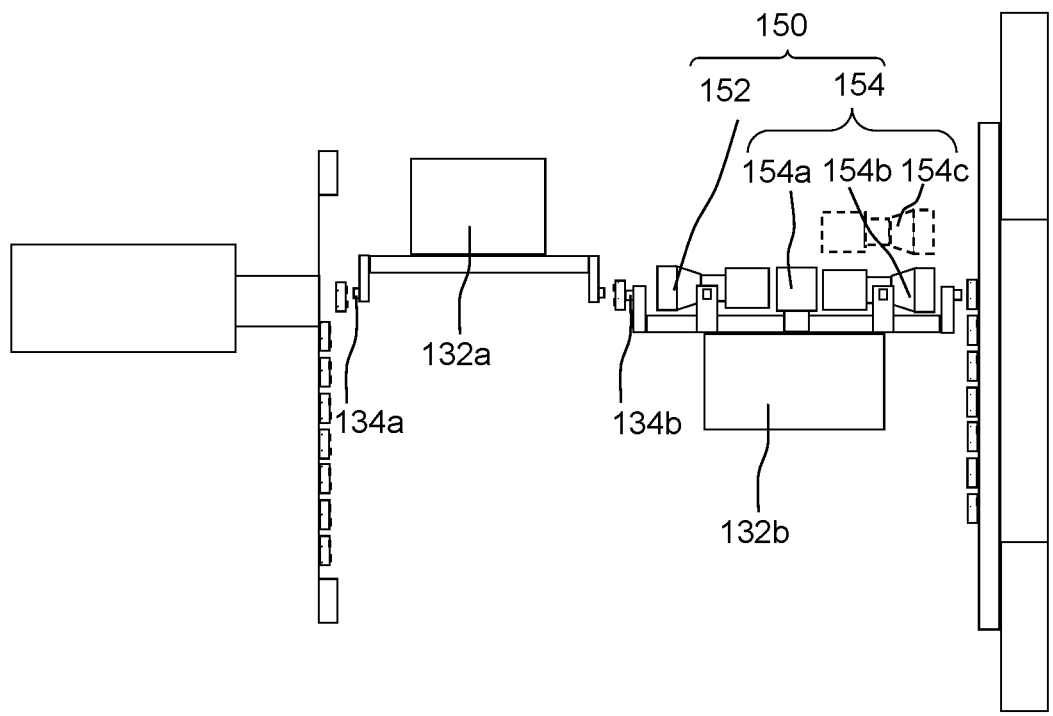
FIG. 8B shows a side view of the die bonding apparatus or the die bonder of FIG. 8A according to various embodiments.

FIG. 8A shows a top view of a schematic diagram of the die bonding apparatus 100 or the die bonder according to various embodiments. FIG. 8B shows a side view of the die bonding apparatus 100 of FIG. 8A according to various embodiments. In FIG. 8A and FIG. 8B, the die placement sensing arrangement 154 is illustrated differently from that as shown in FIG. 7A and FIG. 7B in that the second camera (i.e. the second sensor 154b) and the third camera (i.e. the third sensor 154c) of the die placement sensing arrangement 154 may arranged in a stacked arrangement, whereby the one is on top of another.

FIG. 9A to FIG. 9E shows a top view of a die bonding process using the die bonding apparatus 100 or the die bonder as illustrated in FIG. 7A and FIG. 7B according to various embodiments.

Figure 9A:
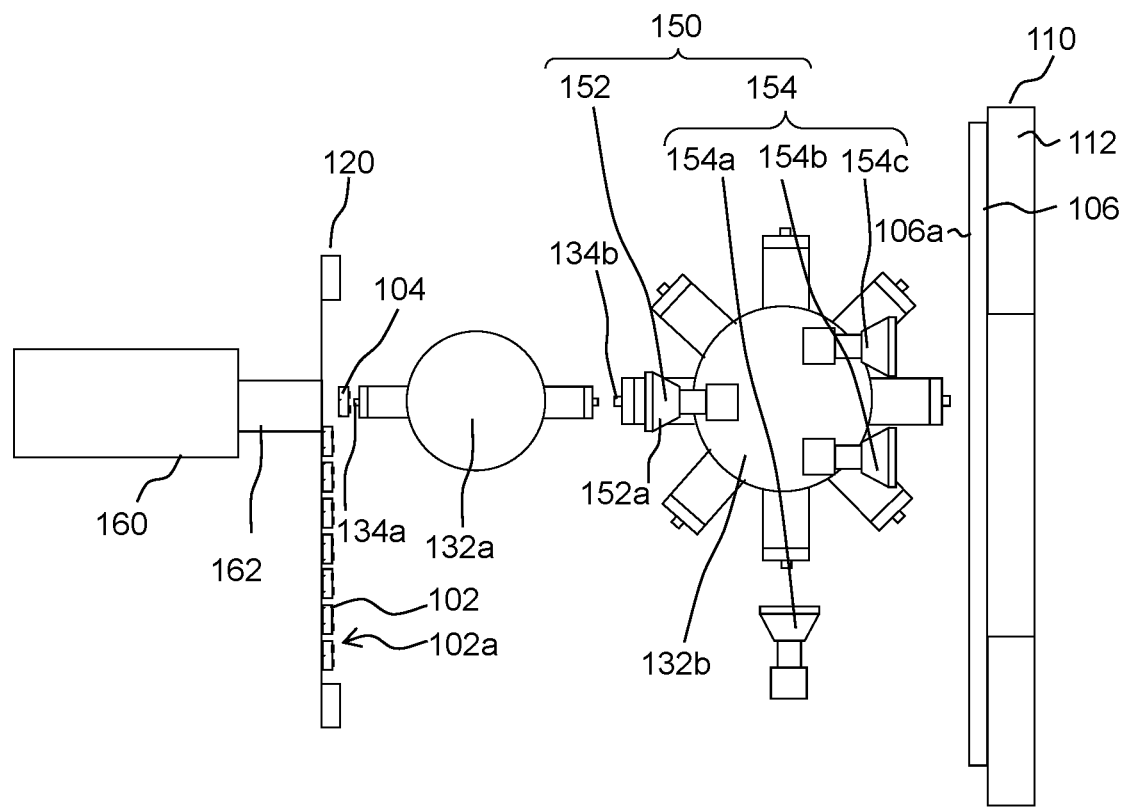
FIG. 9A to FIG. 9E shows a top view of a die bonding process using the die bonding apparatus or the die bonder as illustrated in FIG. 7A and FIG. 7B according to various embodiments.

Referring to FIG. 9A, according to various embodiments, the die bonding process may start with material loading. During material loading, the diced wafer 102 may be loaded to the wafer feed unit 120, a bar code of the diced wafer 102 may be checked, a wafer map of the diced wafer 102 may be downloaded, and referencing of a wafer centre and the first die 104 may be conducted. Subsequently, the wafer feed unit 120 may be moved so as to move the diced wafer 102 for aligning the first die 104 to the pre-determined pickup location so as to be in alignment with the ejector head 162 of the ejector 160. Accordingly, a centre of the first die 104 may be aligned to meet or coincide with a centre of the ejector head 162 of the ejector 160. Further, the carrier panel 106 may be moved into position to standby for the bonding of the first die 104 onto the bonding surface 106a of the carrier panel 106.

Figure 9B:
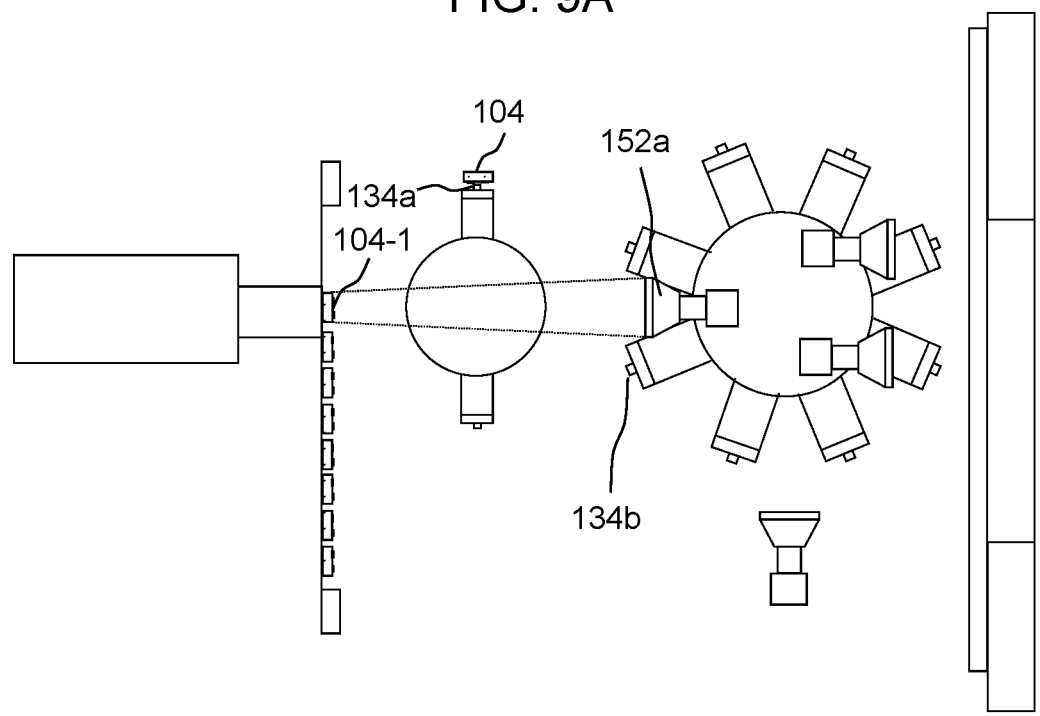

Referring to FIG. 9B, according to various embodiments, the die bonding process may proceed with the ejection of the first die 104 by the ejector head 162 of the ejector 160 and the picking up of the first die 104 by the pickup head 134a of the first pick-and-move unit 132a (or the flip unit or the flipper). The pickup head 134a of the first pick-and-move unit 132a may be rotated about the rotational axis 135a so as to move the pickup head 134a with the first die 104 along the curved path 136a. According to various embodiments, the wafer camera (i.e. the sensor 152a) of the die picking sensing arrangement 152 may be directed towards the wafer side 102a of the diced wafer 102 for detecting the dies 104 on the diced wafer 102 (for example, see the fine-dotted lines projecting from the sensor 152a). Accordingly, the camera (i.e. the sensor 152a) may capture images of the diced wafer 102 at the pre-determined pickup location. According to various embodiments, the pickup head 134b of the second pick-and-move unit 132a may be rotated such that the pickup head 134b clears a field of view of the camera (i.e. the sensor 152a). According to various embodiments, the wafer feed unit 120 may be moved so as to move the diced wafer 102 for aligning the next die 104-1 to the pre-determined pickup location. The camera (i.e. the sensor 152a) may then capture the image the next die 104-1 and verify the position of the next die 104-1 before being picked up. If the position of the next die 104-1 is missed aligned or out of alignment with the pre-determined pickup location (or the centre of the ejector head 162 of the ejector 160), the wafer feed unit 120 may be moved so as to move the diced wafer 102 for corrective movement to adjust the next die 104-1 for alignment with the pre-determined pickup location.

Figure 9C:
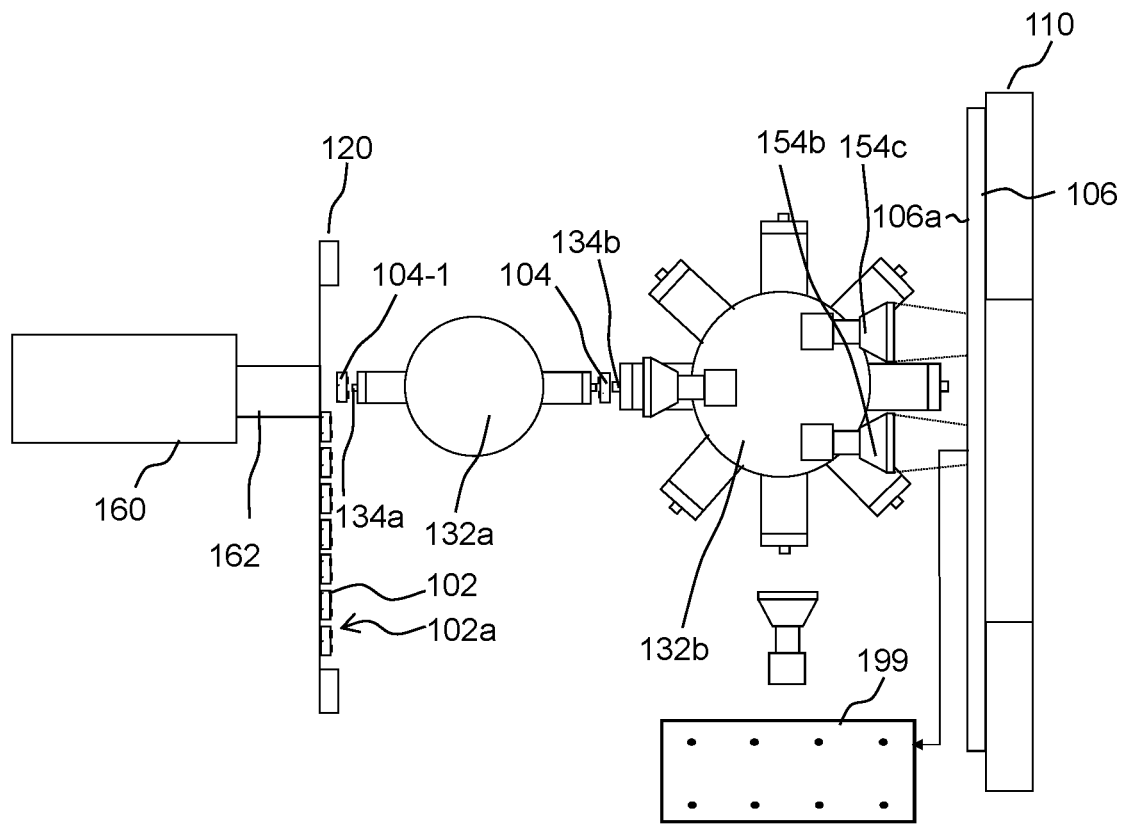

Referring to FIG. 9C, according to various embodiments, the die bonding process may continue with the first die 104 being transferred or handed over to the pickup head 134b of the second pick-and-move unit 132b (or the unflip module or the die attach unit). When the pickup head 134a of the first pick-and-move unit 132a transfers the first die 104 to the pickup head 134b of the second pick-and-move unit 132b, the other pickup head 134a-1 of the first pick-and-move unit 132a may pick up the next die 104-1. Similarly, the ejector head 162 of the ejector 160 may eject the next die 104-1 as the other pickup head 134a-1 of the first pick-and-move unit 132a picks up the next die 104-1. While the first die 104 is being transferred or handed over to the pickup head 134b of the second pick-and-move unit 132b, the second camera (i.e. the second sensor 154b) and the third camera (i.e. the third sensor 154c) of the die placement sensing arrangement 154 may capture images of the bonding surface 106a of the carrier panel 106 to capture the target placement location on the carrier panel 106 for the first die 104 (for example, see the fine-dotted lines projecting from the second sensor 154b and the third sensor 154c). A sample image capture is show as 199 in FIG. 9C. According to various embodiments, the target placement location (or bonding position) may be marked or represented by a set of four points (or holes). According to various embodiments, the carrier panel position data may be captured by the second camera (i.e. the second sensor 154b) and the third camera (i.e. the third sensor 154c).

Figure 9D:
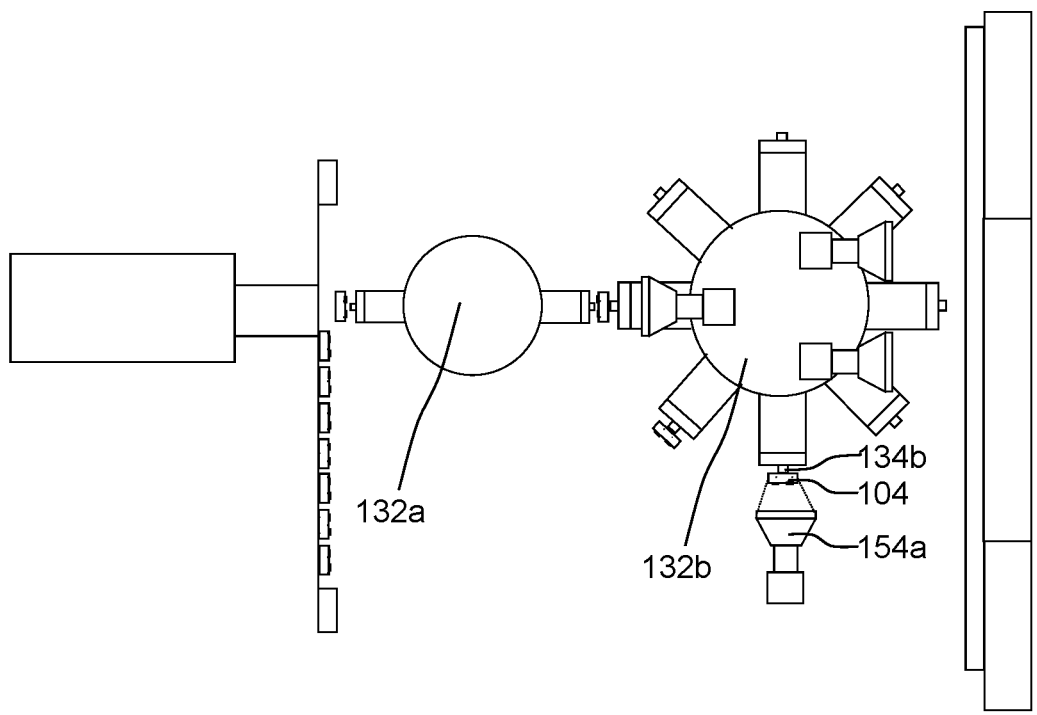

Referring to FIG. 9D, according to various embodiments, the first pick-and-move unit 132a may repeat picking of dies 104, the wafer feed unit 120 may repeat aligning of dies to the predetermined pickup location, and the first pick-and-move unit 132a may repeat transferring dies to the second pick-and-move unit 132b. The second pick-and-move unit 132b may rotate the dies 104 to a pre-set angle for aligning with the first camera (i.e. the first sensor 154a) in order for the first camera to capture the images of the dies 104 at a dynamic or static position (for example, see the fine-dotted lines projecting from the first sensor 154a).

Figure 9E:
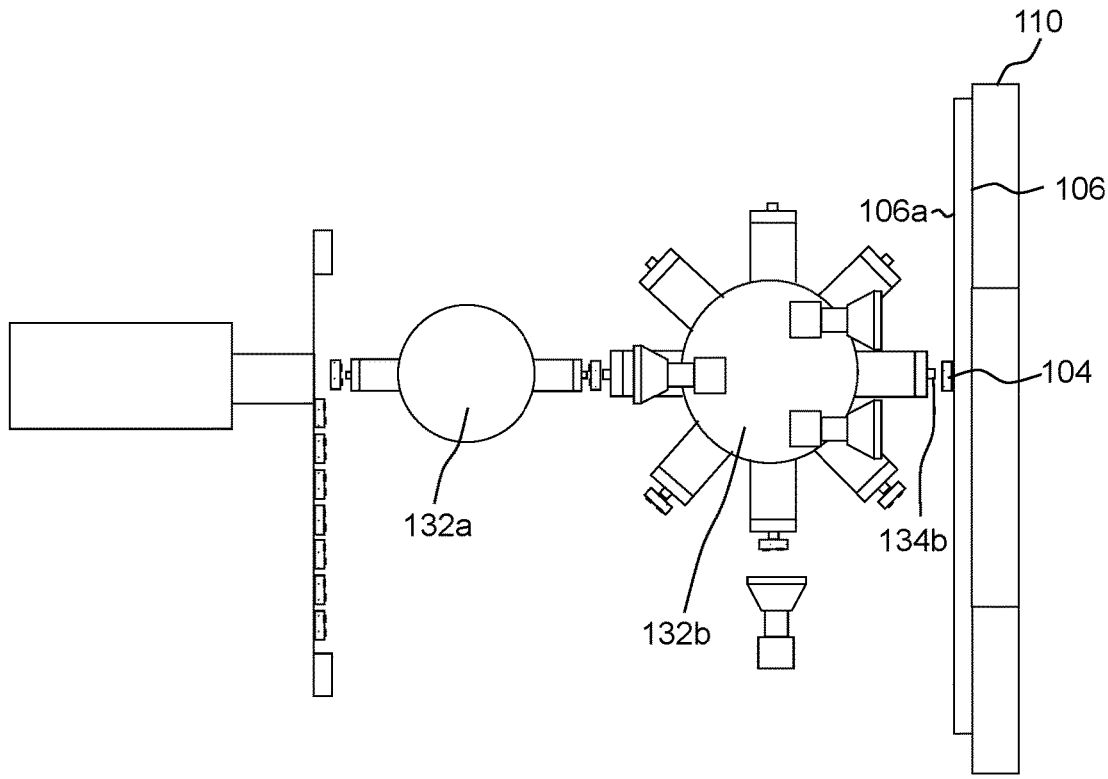

Referring to FIG. 9E, according to various embodiments, the carrier panel position data captured by the second camera (i.e. the second sensor 154b) and the third camera (i.e. the third sensor 154c), and the die position data captured by the first camera (i.e. the first sensor 154a) may be processed by a controller to calculate the relative offset. According to various embodiments, corrective motion may be performed to achieve position and orientating the die 104 to the target placement location on the carrier panel 106. According to various embodiments, the corrective motion may be performed on the carrier panel 106 via the carrier support unit 110, or the die 104 via the pickup head 134b of the second pick-and-move unit 132b, or a combination of both. For example, according to various embodiments, an orientation or angle correction of the first die 104 may be performed by the pickup head 134b of the second pick-and-move unit 132b, and the position correction may be performed by moving the carrier panel 106 via the carrier support unit 110. According to various embodiments, the second pick-and-move unit 132b may respectively rotate the dies 104 to the target placement location. Subsequently, the second pick-and-move unit 132b may respectively place and bond the die 104 to the bonding surface 106a of the carrier panel 106.

Figure 10A:
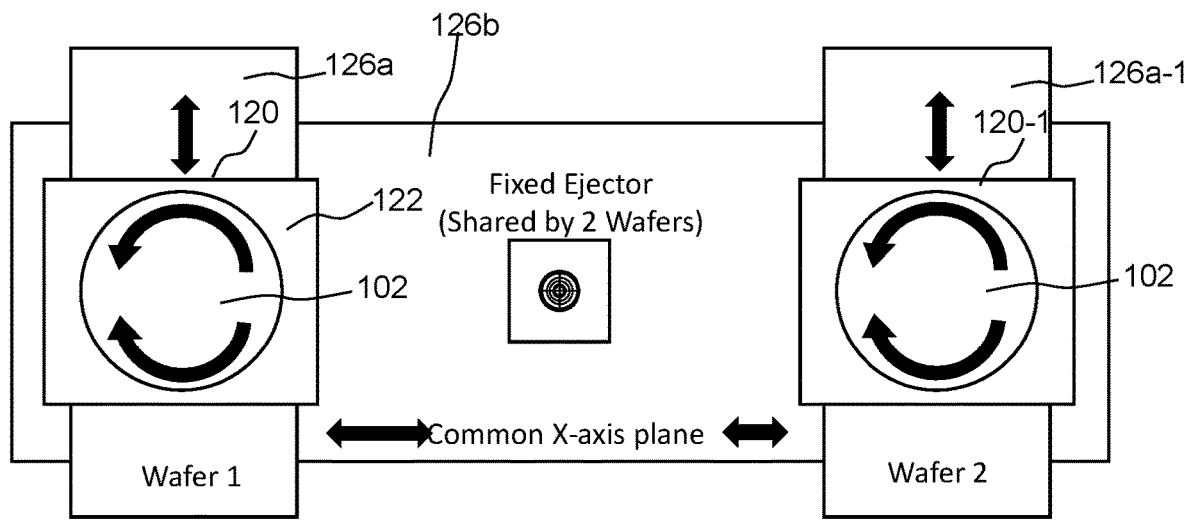
FIG. 10A shows a front view of a dual wafer exchange arrangement (or a dual wafer exchange station) for the die bonding apparatus or the die bonder according to various embodiments.

FIG. 10A shows a front view of a dual wafer exchange arrangement (or a dual wafer exchange station) for the die bonding apparatus 100 or the die bonder according to various embodiments. According to various embodiments, the dual wafer exchange arrangement may include a first wafer feed unit 120 and a second wafer feed unit 120-1. According to various embodiments, the first wafer feed unit 120 and the second wafer feed unit 120-1 may be independently moveable. According to various embodiments, each of the first wafer feed unit 120 and the second wafer feed unit 120-1 may be mounted or fitted to an independent two-axes Cartesian movement mechanism 126, 126-1. According to various embodiments, each of the two axes Cartesian movement mechanism 126, 126-1 may include two links 126a, 126b, 126a-1 (or beams) arranged perpendicular to each other. According to various embodiments, a linear actuator may be coupled to each links 126a, 126a-1, 126b in a manner so as to actuate the respective wafer feed unit 120, 120-1 for moving linearly along a longitudinal axis of a respective first link 126a, 126a-1 (e.g. independent Z-axis) and to actuate the respective first link 126a, 126a-1 for moving linearly along a longitudinal axis of a common second link 126b (e.g. common X-axis). Accordingly, the two-axes Cartesian movement mechanism 126, 126-1 for the first wafer feed unit 120 and the second wafer feed unit 120-1 may share the common second link 126b. In this manner, the first wafer feed unit 120 and the second wafer feed unit 120-1 may be interchangeable such that when one is in operation for die bonding, the other may be on standby or undergoing loading and preparation. According to various embodiments, the ejector 160 may be fixed along the common second link 126b such that the first wafer feed unit 120 or the second wafer feed unit 120-1 may move to the location of the ejector 160 for the die bonding operation.

According to various embodiments, each of the first wafer feed unit 120 and the second wafer feed unit 120-1 may also be operable to rotate the diced wafer 102 about a center of the diced wafer 102. Accordingly, the diced wafer 102 may be respectively rotatable about a corresponding rotational axis passing through the center of the respective diced wafer 102 and perpendicular to the diced wafer 102.

According to various embodiments, each of the first wafer feed unit 120 and the second wafer feed unit 120-1 may include a wafer stretcher 124 (for example, see FIG. 11A to FIG. 11B) for stretching the dicing tape 105 of the diced wafer 102 so as to facilitate ejection of the die 104 via the ejector 160.

According to various embodiments, the die picking sensing arrangement 152 having the at least one sensor 152a (for example in the form of a camera) may provide feedback for the first wafer feed unit 120 and/or the second wafer feed unit 120-1 to perform the following, including but not limited to, finding the center of the die 104, determining an orientation of the die 104, locating a reference die 104, locating the first die 104 and matching the wafer map.

Figure 10B:
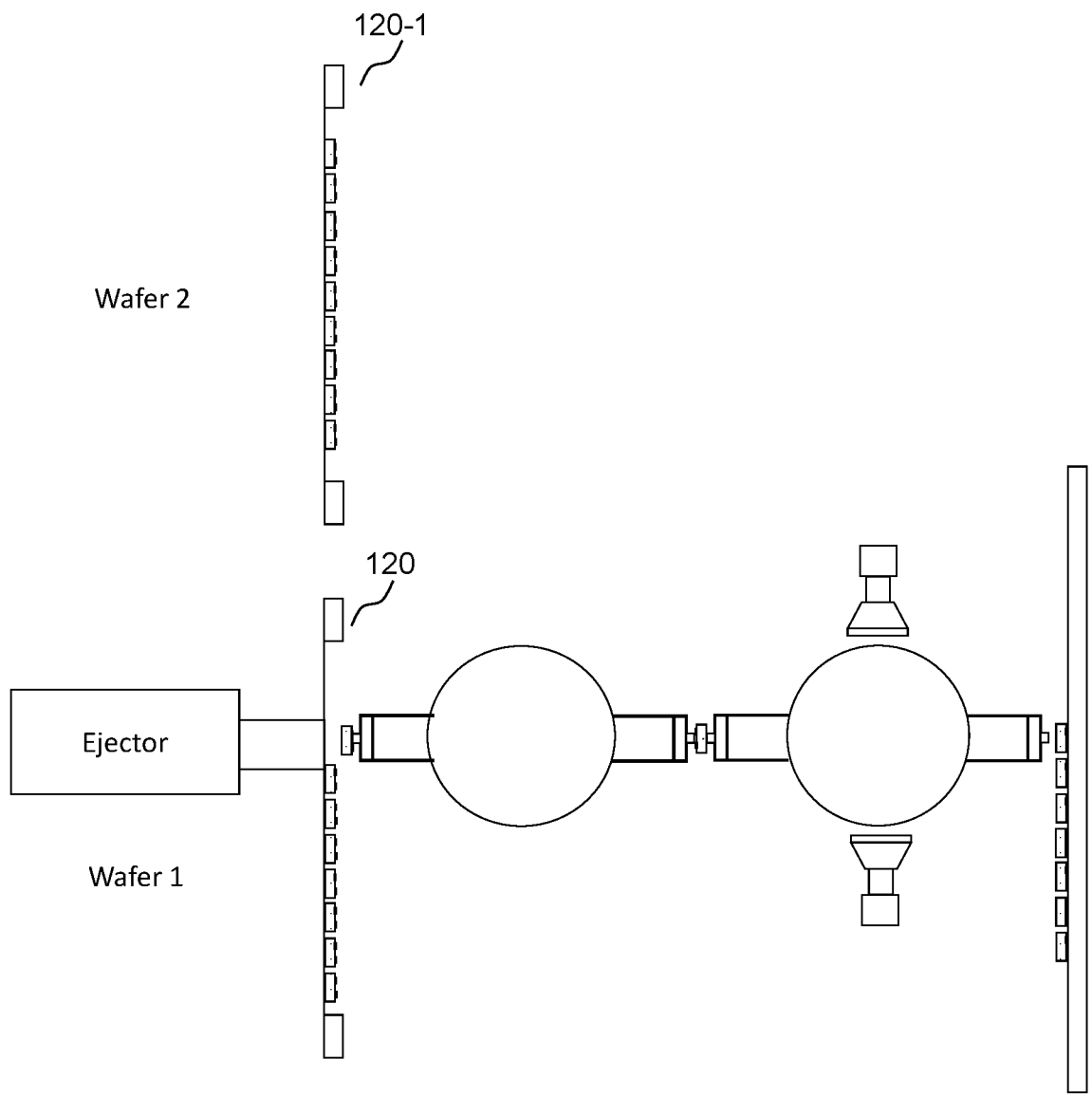
FIG. 10B shows a side view of a first wafer feed unit of the dual wafer exchange arrangement of FIG. 10A being in operation for the die bonding process according to the various embodiments.
Figure 10C:
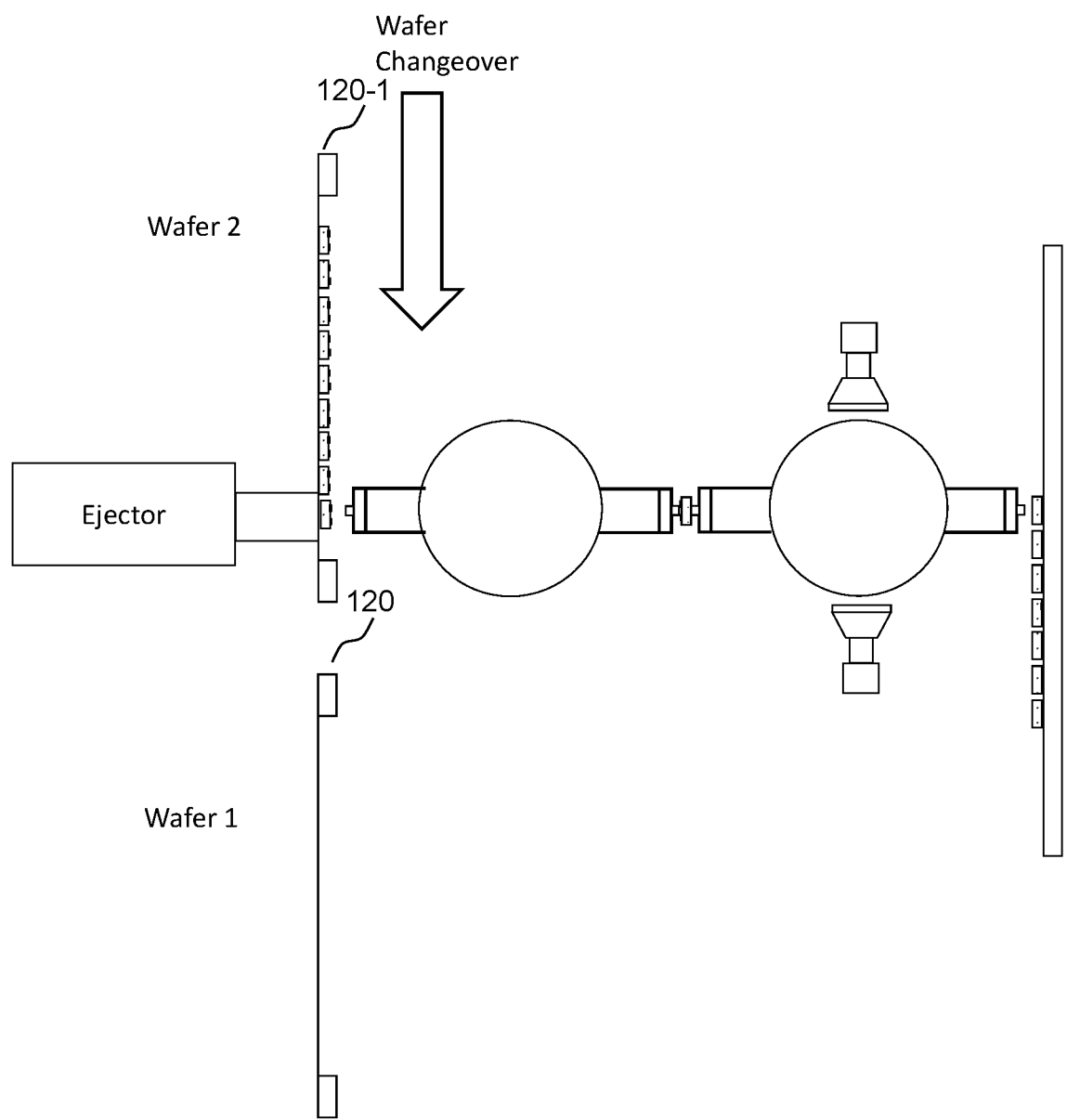
FIG. 10C shows a side view of the second wafer feed unit of the dual wafer exchange arrangement of FIG. 10A being in operation for the die bonding process according to the various embodiments.

FIG. 10B shows a side view of the first wafer feed unit 120 being in operation for the die bonding process according to the various embodiments. FIG. 10C shows a side view of the second wafer feed unit 120-1 being in operation for the die bonding process according to the various embodiments. As shown in FIG. 10B, the first wafer feed unit 120 may be in operation for the die bonding process according to the various embodiments. The second wafer feed unit 120-1 may be undergoing loading and preparation. According to various embodiments, the second wafer feed unit 120-1 may be undergoing loading of wafer 102, scanning of bar code, downloading of wafer map, stretching of the dicing tape 105 of the diced wafer 102, locating a reference die 104, locating the first die 104, and being put on standby. As shown in FIG. 10C, the second wafer feed unit 120-1 may be interchanged with the first feed unit 120 after the first feed unit 120 has completed the die bonding process according to the various embodiments. Accordingly, the first wafer feed unit 120 may proceed to undergo loading and preparation. According to various embodiments, the second wafer feed unit 120-1 may commence with the die bonding process and the first wafer feed unit 120 may proceed for loading of wafer 102, scanning of bar code, downloading of wafer map, stretching of the dicing tape 105 of the diced wafer 102, locating a reference die 104, locating the first die 104, and being put on standby.

According to various embodiments, dual wafer exchange arrangement (or a dual wafer exchange station) for the die bonding apparatus 100 or the die bonder may greatly reduce time loss during wafer exchange. Accordingly, while the first wafer feed unit 120 is working or in operation, the second wafer feed unit 120-1 may be loaded and prepared. After the second wafer feed unit 120-1 is loaded and prepared, the second wafer feed unit 120-1 may be put on stand-by for swapping/exchanging position with the first wafer feed unit 120 after all the dies are picked from the first wafer feed unit 120. Hence, die bonding operation may be continued quickly with minimum stoppage.

Figure 11A:
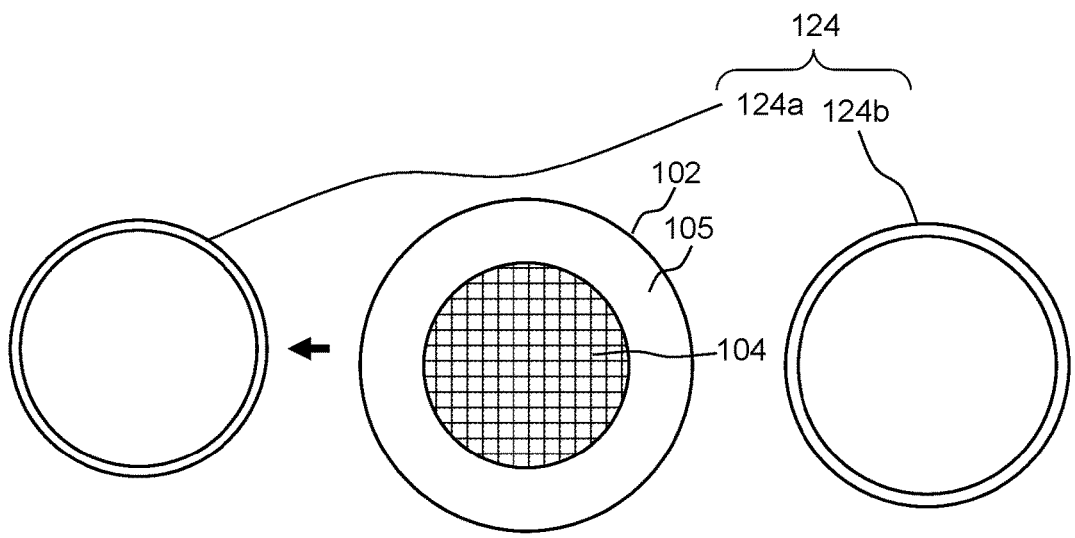
FIG. 11A to FIG. 11C show a sequence of schematic figures illustrating fitting of a diced wafer to a wafer holder of the wafer feed unit according to various embodiments.
Figure 11B:
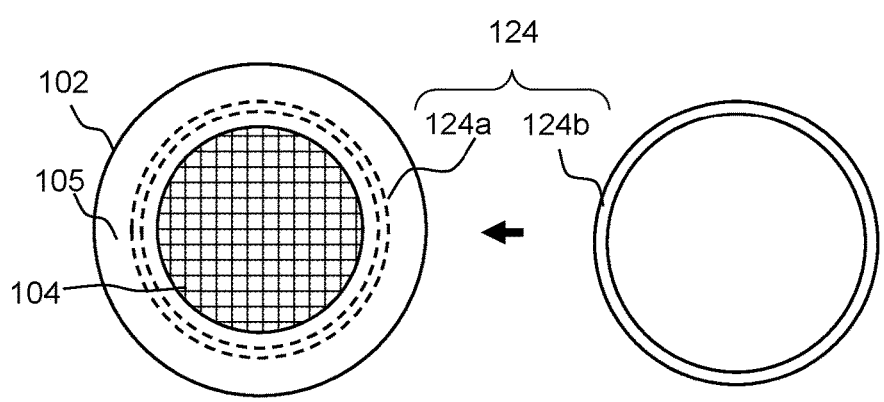
Figures 11C, 11D:
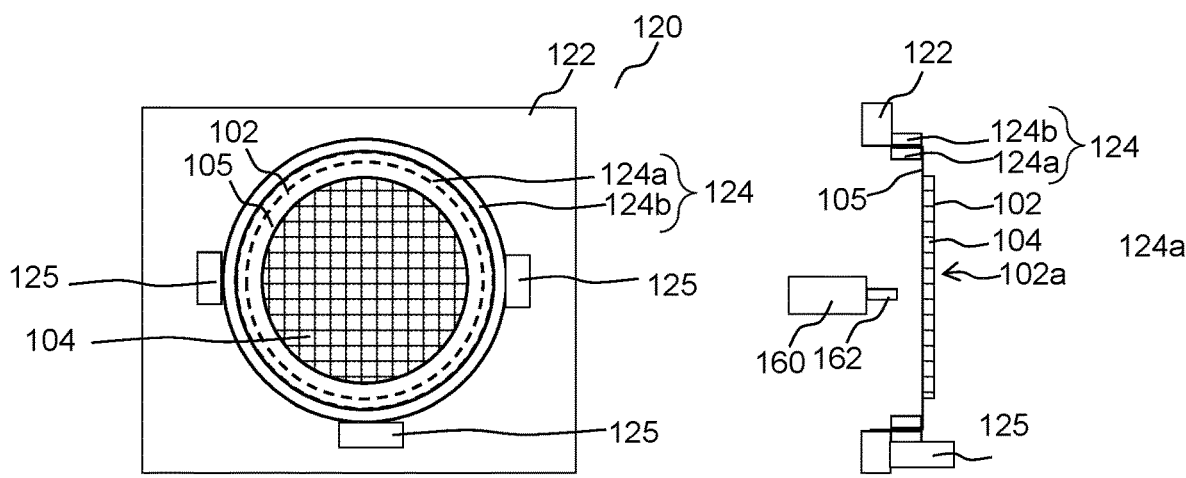
FIG. 11D shows a side cross-section of FIG. 11C according to various embodiments.

FIG. 11A to FIG. 11C shows a sequence of schematic figures illustrating the fitting of the diced wafer 102 to the wafer holder 122 of the wafer feed unit 120 according to various embodiments. FIG. 11D shows a side cross-section of FIG. 11C according to various embodiments. According to various embodiments, the wafer holder 122 of the wafer feed unit 120 may include a wafer stretcher 124 (or a wafer expander). According to various embodiments, the wafer stretcher 124 may include an inner ring 124a and an outer ring 124b. According to various embodiments, the diced wafer 102 may be placed over the inner ring 124a such that the dicing tape 105 of the diced wafer 102 may be resting on the inner ring 124a with a backing surface of the dicing tape 105 abutting the inner ring 124a and the wafer side 102a of the diced wafer 102 (i.e. the plurality of dies 104) may be directed away from the inner ring 124a (for example, see FIG. 11B whereby the inner ring 124a being underneath the dicing tape 105 is represented by a pair of dash lines.). Subsequently, the outer ring 124b of the wafer stretcher 124 may be placed over the diced wafer 102 such that the outer ring 124b may be abutting a sticky surface of the dicing tape 105 (which is opposite the backing surface) to which the plurality of dies is attached, aligned to the inner ring 124a, and be fitted to surround the inner ring 124a with the dicing tape 105 stretched backwards away from the wafer side 102a of the diced wafer 102. According to various embodiments, with the dicing tape 105 stretched by the wafer stretcher 124, the saw lines between the plurality of dies 104 may be loosen and the stretched condition of the dicing tape 105 may enable easy picking up of the die 104 off the dicing tape 105 as the die transfer module 130 picks up the die 104 from the diced wafer 102.

Referring to FIG. 11C, the wafer holder 122 of the wafer feed unit 120 may include one or more stoppers 125 for holding the outer ring 124b of the wafer stretcher 124 in place so as to retain the diced wafer on the wafer feed unit 120. For example, according to various embodiments, the wafer holder 122 of the wafer feed unit 120 may include three stoppers 125 for abutting two opposite lateral sides of the outer ring 124b and a bottom side of the outer ring 124b. In this manner, the plurality of dies 104 of the diced wafer 102 may be completely exposed from the wafer side 102a of the diced wafer 102 and a portion of the dicing tape 105 within the inner ring 124a may be accessible by the ejector 160 for die ejection (for example, see FIG. 11D).

Figure 12:
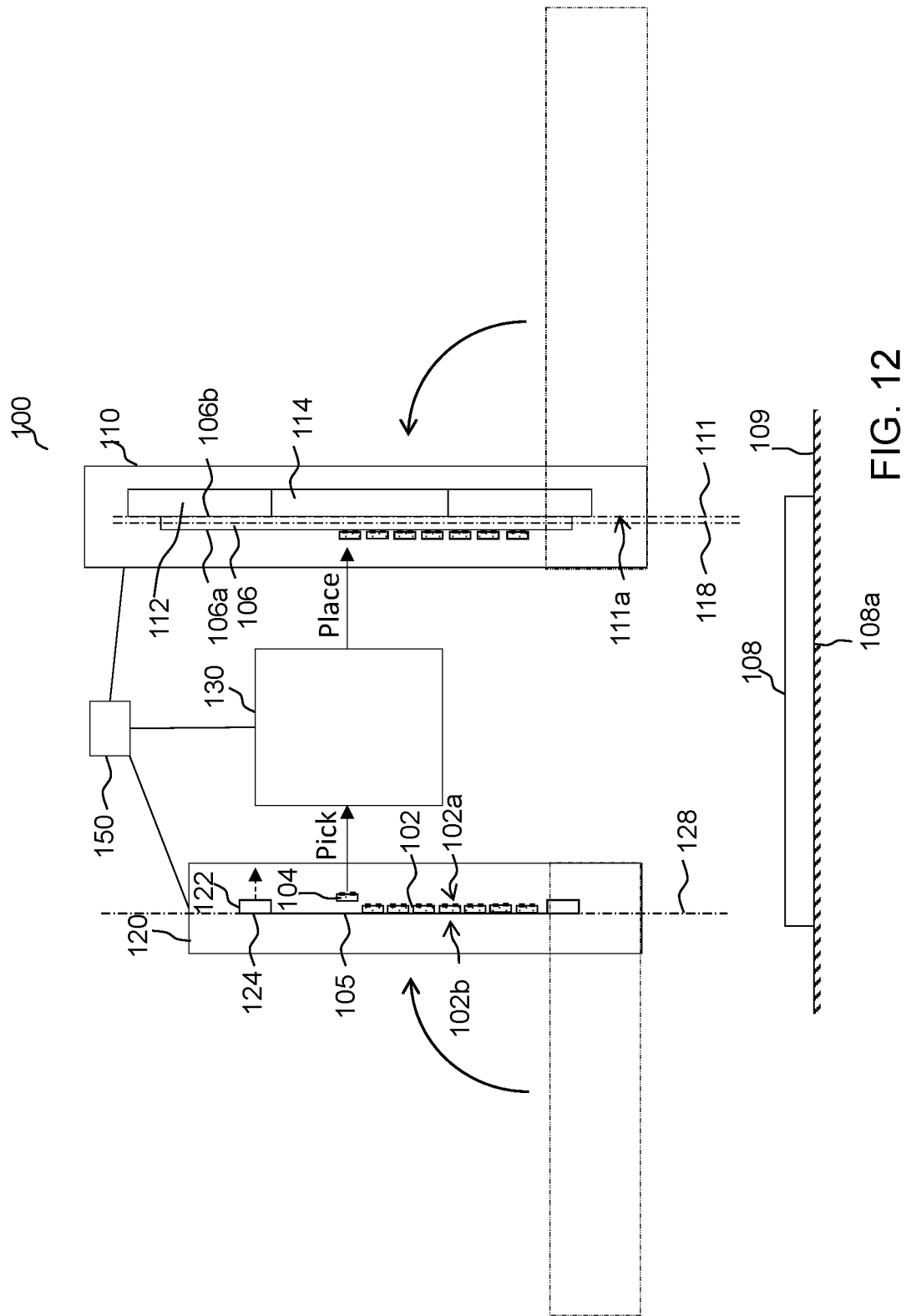
FIG. 12 shows a side view of the die bonding apparatus or the die bonder according to various embodiments.

FIG. 12 shows a side view of the die bonding apparatus 100 or the die bonder according to various embodiments. As shown in FIG. 12, each of the wafer feed unit 120 and the carrier support unit 110 may be rotatable between a horizontal disposition (represented by a dash-double-dots line) and a vertical disposition (represented by solid lines) with respect to the ground (or the surface 109). According to various embodiments, each of the wafer feed unit 120 and the carrier support unit 110 may be actuated by an actuating mechanism including, but not limited to, a hydraulic actuator, a pneumatic actuator, an electric actuator or a mechanical actuator for rotating from the horizontal disposition to the vertical disposition. According to various embodiments, in the horizontal disposition, the diced wafer 102 may be loaded onto the wafer feed unit 120 and the carrier panel 106 may be loaded to the carrier support unit 110. According to various embodiments, after the diced wafer 102 and the carrier panel 106 have been respectively loaded, the wafer feed unit 120 and the carrier panel 106 may be operable to be erected from the horizontal disposition to the vertical disposition. According to various embodiments, the wafer feed unit 120 and the carrier panel 106 may also be operable to align the diced wafer 102 and the carrier panel 106 to each other in the vertical disposition.

Figures 13A, 13B:
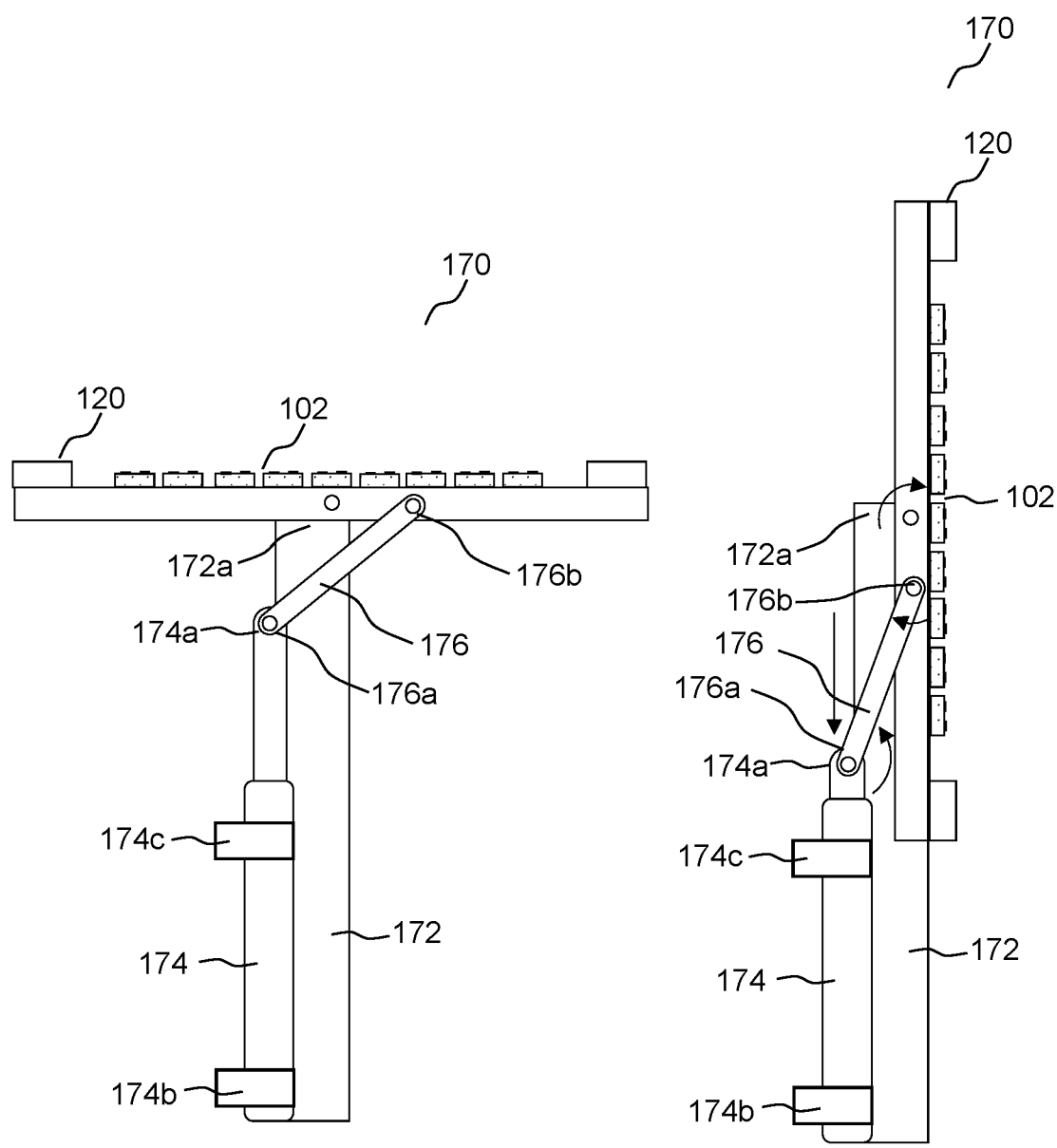
FIG. 13A shows a side view of a wafer erection arrangement holding the wafer feed unit of the die bonding apparatus or the die bonder in the horizontal disposition according to various embodiments.
FIG. 13B shows the side view of the wafer erection arrangement of FIG. 13A holding the wafer feed unit of the die bonding apparatus or the die bonder in the vertical disposition according to various embodiments.

FIG. 13A shows a side view of a wafer erection arrangement 170 holding the wafer feed unit 120 of the die bonding apparatus 100 or the die bonder in the horizontal disposition according to various embodiments. FIG. 13B shows the side view of the wafer erection arrangement 170 holding the wafer feed unit 120 of the die bonding apparatus 100 or the die bonder in the vertical disposition according to various embodiments. According to various embodiments, the wafer erection arrangement 170 may include a vertical support 172. According to various embodiments, the wafer feed unit 120 may be pivotably coupled to the vertical support 172. For example, the wafer feed unit 120 may be pivotably coupled to a tip 172a of the vertical support 172. According to various embodiments, the wafer erection arrangement 170 may include a linear actuator 174 and a link member 176 interconnecting the linear actuator 174 to the wafer feed unit 120. According to various embodiments, a first end 176a of the link member 176 may be pivotably coupled to an extendable end 174a of the linear actuator 174, and a second end 176b of the link member 176 may be pivotably coupled to the wafer feed unit 120. According to various embodiments, the linear actuator 174, the link member 176, the wafer feed unit 120 and the vertical support 172 may be coupled in a manner such that the wafer feed unit 120 is in the horizontal disposition when the linear actuator 174 is extended, and the wafer feed unit 120 is in the vertical disposition when the linear actuator 174 is retracted. Accordingly, the wafer feed unit 120 may be pivoted between the horizontal disposition and the vertical disposition via operating the linear actuator 174 to extend or retract respectively. For example, according to various embodiments, the linear actuator 174 may be a pneumatic actuator having a first air inlet 174b and a second air inlet 174c. According to various embodiments, air pressure from an external compressor may be supplied to the first air inlet 174b for moving an internal piston of the pneumatic actuator to extend the extendable end 174a of the linear actuator 174. According to various embodiments, an air pressure from an external compressor may be supplied to the second air inlet 174c for moving the internal piston of the pneumatic actuator to retract the extendable end 174a of the linear actuator 174. Accordingly, the pneumatic actuator may be operated to extend or retract the extendable end 174a by supplying air to the first air inlet 174b or the second air inlet 174c.

Figure 14A:
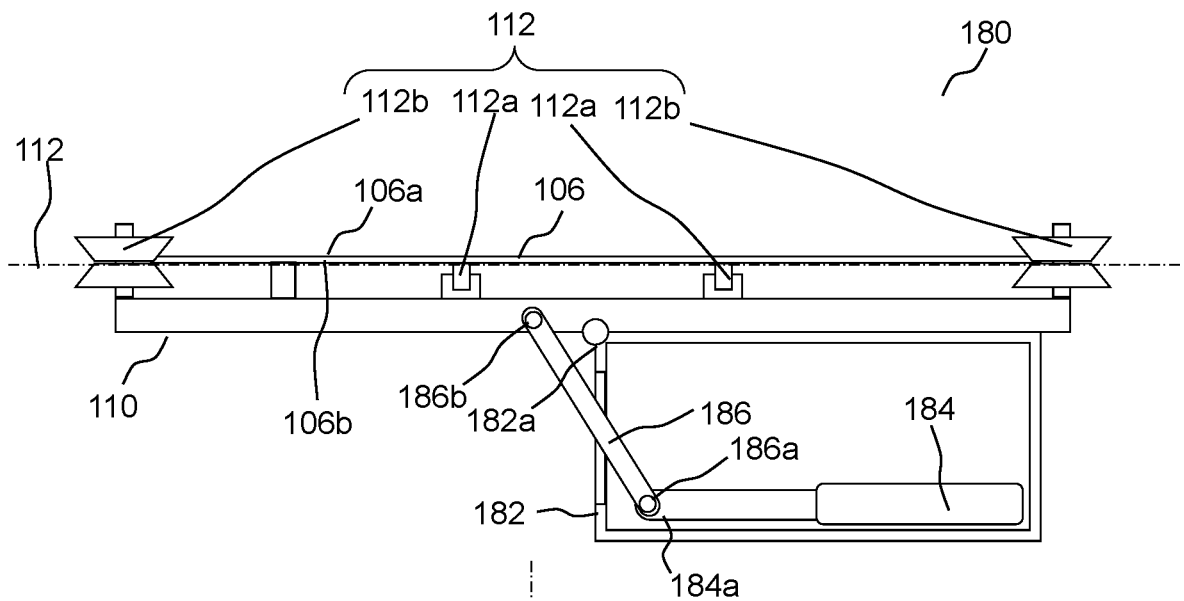
FIG. 14A shows a side view of a carrier erection arrangement holding the carrier support unit of the die bonding apparatus or the die bonder in the horizontal disposition according to various embodiments.
Figure 14B:
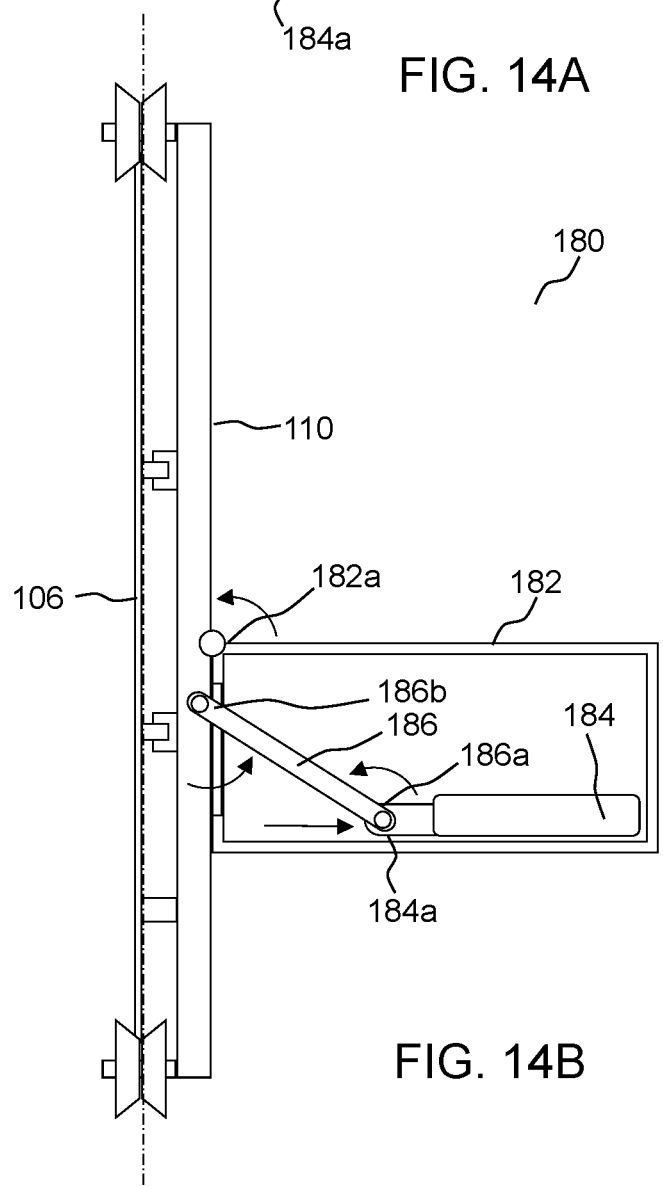
FIG. 14B shows the side view of the carrier erection arrangement of FIG. 14A holding the carrier support unit of the die bonding apparatus or the die bonder in the vertical disposition according to various embodiments.

FIG. 14A shows a side view of a carrier erection arrangement 180 holding the carrier support unit 110 of the die bonding apparatus 100 or the die bonder in the horizontal disposition according to various embodiments. FIG. 14B shows the side view of the carrier erection arrangement 180 holding the carrier support unit 110 of the die bonding apparatus 100 or the die bonder in the vertical disposition according to various embodiments. According to various embodiments, the carrier erection arrangement 180 may include a support frame 182. For example, the support frame 182 may be in the form of a box structure. According to various embodiments, the carrier support unit 110 may be pivotably coupled to the support frame 182. For example, the carrier support unit 110 may be pivotably coupled to a top edge 182a of the support frame 182. According to various embodiments, the carrier erection arrangement 180 may include a linear actuator 184 and a link member 186 interconnecting the linear actuator 184 to the carrier support unit 110. According to various embodiments, a first end 186a of the link member 186 may be pivotably coupled to an extendable end 184a of the linear actuator 184, and a second end 186b of the link member 186 may be pivotably coupled to the carrier support unit 110. According to various embodiments, the linear actuator 184, the link member 186, the carrier support unit 110 and the support frame 182 may be coupled in a manner such that the carrier support unit 110 is in the horizontal disposition when the linear actuator 184 is extended, and the carrier support unit 110 is in the vertical disposition when the linear actuator 184 is retracted. Accordingly, the carrier support unit 110 may be pivoted between the horizontal disposition and the vertical disposition via operating the linear actuator 184 to extend or retract respectively.

Referring to FIG. 14A and FIG. 14B, a more detailed example of the carrier support unit 110 of the die bonding apparatus 100 or the die bonder according to various embodiments is also shown. As shown, according to various embodiments, the at least one support element 112 of the carrier support unit 110 may include a plurality of support rollers 112a. According to various embodiments, each support roller 112a may be a cylindrical roller. According to various embodiments, each support roller 112a may abut the back surface 106b of the carrier panel 106. Accordingly, at least a portion of a cylindrical surface of each support roller 112a may abut the back surface 106b of the carrier panel 106. According to various embodiments, the portions of the plurality of support rollers 112a in abutment with the back surface 106b of the carrier panel 106 may define the supporting plane 111. According to various embodiments, a rotational axis of each support roller 112a may be parallel to the supporting plane 111. According to various embodiments, the rotational axes of the plurality of support rollers 112a may be parallel to each other. Accordingly, the plurality of support rollers 112a may be rotatable in a same direction. According to various embodiments, the plurality of support rollers 112a may serve as a roller conveyor arrangement for the carrier panel 106 to be easily loaded and unloaded by conveying the carrier panel 106 along the supporting plane 111 over the plurality of support rollers 112a as the carrier panel 106 rotates the plurality of support rollers 112a when the carrier panel 106 is moved over the plurality of support rollers 112a. According to various embodiments, the carrier panel 106 may be loaded with the bonding surface 106a of the carrier panel 106 directed away from the plurality of the support rollers 112a. According to various embodiments, the plurality of support rollers 112a may be parallel rollers arranged in a line. According to various embodiments, there may be one or more lines of support rollers 112a.

As shown, according to various embodiments, the at least one support element 112 of the carrier support unit 110 may include a plurality of guide rollers 112b. According to various embodiments, each guide roller 112b may be a groove roller having a continuous endless groove around a circumference and between a pair of flanges. According to various embodiments, each guide roller 112b may be orthogonal to the plurality of support rollers 112a. Accordingly, a rotational axis of each guide roller 112b may be perpendicular to the rotational axes of the plurality of support rollers 112a. According to various embodiments, the plurality of guide rollers 112b may be for guiding an edge of the carrier panel 106. According to various embodiments, the plurality of guide rollers 112b may be arranged into two spaced apart lines for guiding two opposite edges of the carrier panel 106. According to various embodiments, the grooves of the plurality of guide rollers 112b may be aligned to the portions of the plurality of support rollers 112a in abutment with the back surface 106b of the carrier panel 106 for defining the supporting plane 111. Accordingly, the plurality of support rollers 112 and the plurality of guide rollers 112b together may define the supporting plane 111.

Various embodiments have provided an effective and efficient apparatus and method to bond a plurality of dies on a carrier panel for a panel level packaging process. In various embodiments, by performing die bonding with the diced wafer 102 and the carrier panel 106 facing each other, a distance that is required for transferring the die from the diced wafer 102 and the carrier panel 106 may be minimized to as short as possible as the die no longer has to travel across a width of the diced wafer 102 and/or the carrier panel 106 for die bonding. In various embodiments, by performing die bonding with the diced wafer 102 and the carrier panel 106 vertical to the ground, the diced wafer 102 and the carrier panel 106 are free from any mechanism moving over them. Hence, the risk of silicon dust, particles and dusts from cables, cables chains, lubricant, etc. falling onto the surfaces of the carrier panel 106 via gravity is eliminated or reduced significantly.

While the invention has been particularly shown and described with reference to specific embodiments, it should be understood by those skilled in the art that various changes, modification, variation in form and detail may be made therein without departing from the scope of the invention as defined by the appended claims. The scope of the invention is thus indicated by the appended claims and all changes which come within the meaning and range of equivalency of the claims are therefore intended to be embraced.

REFERENCE NUMERAL LIST

100—die bonding apparatus or a die bonder
   102—diced wafer
      102a—wafer side
      102b—tape side
   104—die
      104a—die-movement-plane
      104-1—next die
      104-2—further die
   106—carrier panel
      106a—bonding surface
      106b—back surface
   108—support structure
      108a—base support surface
   109—surface (e.g. ground)
   110—carrier support unit
   111—supporting plane 111a—side (of the supporting plane to which the carrier panel is supported)
112—support element
   112a—support roller
   112b—guide roller
114—carrier holder
116, 126, 126-1—two-axes Cartesian movement mechanism
   116a, 126a, 126a-1—first link
   116b, 126b—second link
117a, 117b—linear actuator
118—carrier-movement plane
120, 120-1—wafer feed unit
122—wafer holder
123—predetermined front-loading direction
124—wafer stretcher
   124a—inner ring
   124b—outer ring
125—stopper
128—wafer-movement plane
130—die transfer module
   130a—first side
   130b—second side
131a, 131b—pickup position
132a, 132b—pick-and-move unit
133a, 133b—release position
134a, 134a-1, 134b, 134b-1—pickup heads
135a, 135b—rotational axis
136a, 136b—curved path
150—sensing arrangement
152—die picking sensing arrangement
   152a—sensor
154—die placement sensing arrangement
   154a—first sensor
   154b—second sensor
   154c—third sensor
   154a-1—first die camera
   154b-1—second die camera
   154c-1—panel camera
160—ejector
162—ejector head
170—wafer erection arrangement
172—vertical support
180—carrier erection arrangement
182—support frame
174, 184—linear actuator
   174a, 184a—extendable end
176, 186—link member
   176a, 186a—first end
   176b, 186b—second end
199—sample image

The invention claimed is:

1. A die bonding apparatus, comprising
a carrier support unit having
   at least one support element defining a supporting plane and
   a carrier holder operable to hold a carrier panel against the at least one support element to support the carrier panel on a side of the supporting plane with the carrier panel being parallel to the supporting plane;
a wafer feed unit having
   a wafer holder operable to hold a diced wafer in a manner so as to space the diced wafer apart from the supporting plane defined by the at least one support element of the carrier support unit and orient the diced wafer with an exposed surface of the diced wafer substantially parallel to and facing the side of the supporting plane defined by the at least one support element of the carrier support unit and to which the carrier panel is supported; and
a die transfer module disposed between the carrier support unit and the wafer feed unit, the die transfer module operable to pick up a die from the diced wafer held by the wafer feed unit and place the die on the carrier panel held by the carrier support unit for bonding the die to the carrier panel.

2. The apparatus as claimed in claim 1, wherein the wafer feed unit is movable along a wafer-movement plane parallel to the supporting plane defined by the at least one support element of the carrier support unit.

3. The apparatus as claimed in claim 2, wherein the carrier support unit is movable along a carrier-movement plane parallel to the supporting plane defined by the at least one support element of the carrier support unit.

4. The apparatus as claimed in claim 3 further comprising a die picking sensing arrangement having at least one sensor to determine a position of the die with respect to a predetermined pick-up location for controlling the movement of the wafer feed unit along the wafer-movement plane to align the die to the predetermined pick-up location, and
a die placement sensing arrangement having at least one sensor to determine a position of the die picked up by the die transfer module with respect to a target placement location on the carrier panel held by the carrier support unit for controlling a movement of the carrier support unit to move the carrier panel and a movement of the die transfer module in order to move the die and the carrier panel relative to each other in a manner so as to align the target placement location on the carrier panel and the die for the die transfer module to place the die on the carrier panel.

5. A die bonding apparatus, comprising:
a carrier support unit having
   at least one support element defining a supporting plane and
   a carrier holder operable to hold a carrier panel against the at least one support element to support the carrier panel on a side of the supporting plane with the carrier panel being parallel to the supporting plane;
a wafer feed unit having
   a wafer holder operable to hold a diced wafer in a manner so as to space the diced wafer apart from the supporting plane defined by the at least one support element of the carrier support unit and orient the diced wafer with an exposed surface of the diced wafer facing the side of the supporting plane to which the carrier panel is supported; and
a die transfer module disposed between the carrier support unit and the wafer feed unit, the die transfer module operable to pick up a die from the diced wafer held by the wafer feed unit and place the die on the carrier panel held by the carrier support unit for bonding the die to the carrier panel;
wherein the die transfer module comprises a pick-and-move unit having at least one pickup head movable between a pickup position and a release position,
wherein, when the at least one pickup head is in the pickup position, the at least one pickup head is directed towards the diced wafer held by the wafer feed unit and aligned to the die for picking up the die from the diced wafer held by the wafer feed unit, and wherein, when the at least one pickup head is in the release position, the at least one pickup head is directed away from the diced wafer held by the wafer feed unit and directed towards the carrier panel held by the carrier support unit.

6. The apparatus as claimed in claim 5, wherein the at least one pickup head turns over the die with respect to an original orientation of the die on the diced wafer held by the wafer feed unit when the at least one pickup head is moved from the pickup position to the release position.

7. The apparatus as claimed in claim 5, wherein, when the at least one pickup head is in the release position, the at least one pickup head is operable to urge the die towards the carrier panel held by the carrier support unit so as to apply a bonding force to bond the die to the carrier panel.

8. The apparatus as claimed in claim 5, wherein the at least one pickup head is rotatable about a rotational axis parallel to the supporting plane defined by the at least one support element of the carrier support unit so as to move and rotate the pickup head along a curved path from the pickup position to the release position, wherein a radial distance of the pickup position with respect to the rotational axis is equal to a radial distance of the release position with respect to the rotational axis.

9. The apparatus as claimed in claim 5, wherein the pick-and-move unit of the die transfer module comprises
 a first pick-and-move unit having a pickup head movable between a pickup position and a release position, and
 a second pick-and-move unit having a pickup head movable between a pickup position and a release position,
 wherein the first pick-and-move unit and the second pick-and-move unit are arranged in series in a manner such that the first pick-and-move unit picks up the die at the pickup position of the first pick-and-move unit from the diced wafer held by the wafer feed unit and moves the die to the release position of the first pick-and-move unit for transferring to the second pick-and-move unit, and the second pick-and-move unit receives the die at the pickup position of the second pick-and-move unit from the first pick-and-move unit and moves the die to the release position of the second pick-and-move unit for placing the die on the carrier panel held by the carrier support unit in order to bond the die to the carrier panel.

10. A method of bonding a plurality of dies to a carrier panel with a die bonder, comprising
 picking a die, via a die transfer module of the die bonder, from a diced wafer held by a wafer feed unit of the die bonder having a wafer holder holding the diced wafer in a manner so as to space the diced wafer apart from a carrier panel held by a carrier support unit of the die bonder and orient the diced wafer with an exposed surface of the diced wafer facing a bonding surface of the carrier panel;
 placing the die, via the die transfer module, on the bonding surface of the carrier panel held by the carrier support unit for bonding the die to the bonding surface of the carrier panel, and
 moving the wafer feed unit along a wafer-movement plane parallel to the diced wafer based on determination of a position of the die with respect to a predetermined pick-up location via a die picking sensing arrangement having at least one sensor,
 wherein the die transfer module is disposed between the carrier support unit and the wafer feed unit.

11. The method as claimed in claim 10, further comprising
 turning over, via a pickup head of the die transfer module, the die with respect to an original orientation of the die on the diced wafer held by the wafer feed unit as the pickup head is moved from a pickup position to a release position,
 wherein, when the pickup head is in the pickup position, the pickup head is directed towards the diced wafer held by the wafer feed unit and aligned to the die for picking of the die from the diced wafer held by the wafer feed unit, and wherein, when the pickup head is in the release position, the pickup head is directed away from the diced wafer held by the wafer feed unit and directed towards the bonding surface of the carrier panel held by the carrier support unit.

12. The method as claimed in claim 10, further comprising
 turning over, via a pickup head of a first pick-and-move unit of the die transfer module, the die with respect to an original orientation of the die on the diced wafer held by the wafer feed unit when the pickup head of the first pick-and-move unit moves the die from a pickup position of the first pick-and-move unit to a release position of the first pick-and-move unit; and
 turning over, via a pickup head of a second pick-and-move unit of the die transfer module, the die subsequently with respect to the diced wafer when the pickup head of the second pick-and-move unit moves the die from a pickup position of the second pick-and-move unit to a release position of the second pick-and-move unit in a manner so as to return the die back with respect to the diced wafer such that the orientation of the die at the release position of the second pick-and-move unit with respect to the diced wafer corresponds to the original orientation of the die when the die is on the diced wafer held by the wafer feed unit,
 wherein, when the pickup head of the first pick-and-move unit is in the pickup position of the first pick-and-move unit, the pickup head of the first pick-and-move unit is directed towards the diced wafer held by the wafer feed unit and aligned to the die for picking up of the die from the diced wafer held by the wafer feed unit,
 wherein, when the pickup head of the first pick-and-move unit is in the release position of the first pick-and-move unit, the pickup head of the first pick-and-move unit is directed away from the diced wafer held by the wafer feed unit and directed towards the carrier panel held by the carrier support unit,
 wherein, when the pickup head of the first pick-and-move unit is in the release position of the first pick-and-move unit and the pickup head of the second pick-and-move unit is in the pickup position of the second pick-and-move unit, the pickup head of the second pick-and-move unit is directed towards the diced wafer held by the wafer feed unit and aligned to the pickup head of the first pick-and-move unit,
 wherein, when the pickup head of the second pick-and-move unit is in the release position of the second pick-and-move unit, the pickup head of the second pick-and-move unit is directed away from the diced wafer held by the wafer feed unit and directed towards the carrier panel held by the carrier support unit.

13. A method of bonding a plurality of dies to a carrier panel with a die bonder, comprising
 picking a die, via a die transfer module of the die bonder, from a diced wafer held by a wafer feed unit of the die bonder having a wafer holder holding the diced wafer in a manner so as to space the diced wafer apart from a carrier panel held by a carrier support unit of the die bonder and orient the diced wafer with an exposed surface of the diced wafer facing a bonding surface of the carrier panel;

placing the die, via the die transfer module, on the bonding surface of the carrier panel held by the carrier support unit for bonding the die to the bonding surface of the carrier panel, and moving the carrier support unit along a carrier-movement plane parallel to the carrier panel based on determination of a position of the die picked up by the die transfer module with respect to a target placement location on the carrier panel held by the carrier support unit to align the target placement location on the carrier panel and the die picked up by the die transfer module, wherein the die transfer module is disposed between the carrier support unit and the wafer feed unit.

14. The method as claimed in claim 13, further comprising turning over, via a pickup head of the die transfer module, the die with respect to an original orientation of the die on the diced wafer held by the wafer feed unit as the pickup head is moved from a pickup position to a release position, wherein, when the pickup head is in the pickup position, the pickup head is directed towards the diced wafer held by the wafer feed unit and aligned to the die for picking of the die from the diced wafer held by the wafer feed unit, and wherein, when the pickup head is in the release position, the pickup head is directed away from the diced wafer held by the wafer feed unit and directed towards the bonding surface of the carrier panel held by the carrier support unit.

15. The method as claimed in claim 13, further comprising turning over, via a pickup head of a first pick-and-move unit of the die transfer module, the die with respect to an original orientation of the die on the diced wafer held by the wafer feed unit when the pickup head of the first pick-and-move unit moves the die from a pickup position of the first pick-and-move unit to a release position of the first pick-and-move unit; and turning over, via a pickup head of a second pick-and-move unit of the die transfer module, the die subsequently with respect to the diced wafer when the pickup head of the second pick-and-move unit moves the die from a pickup position of the second pick-and-move unit to a release position of the second pick-and-move unit in a manner so as to return the die back with respect to the diced wafer such that the orientation of the die at the release position of the second pick-and-move unit with respect to the diced wafer corresponds to the original orientation of the die when the die is on the diced wafer held by the wafer feed unit, wherein, when the pickup head of the first pick-and-move unit is in the pickup position of the first pick-and-move unit, the pickup head of the first pick-and-move unit is directed towards the diced wafer held by the wafer feed unit and aligned to the die for picking up of the die from the diced wafer held by the wafer feed unit, wherein, when the pickup head of the first pick-and-move unit is in the release position of the first pick-and-move unit, the pickup head of the first pick-and-move unit is directed away from the diced wafer held by the wafer feed unit and directed towards the carrier panel held by the carrier support unit, wherein, when the pickup head of the first pick-and-move unit is in the release position of the first pick-and-move unit and the pickup head of the second pick-and-move unit is in the pickup position of the second pick-and-move unit, the pickup head of the second pick-and-move unit is directed towards the diced wafer held by the wafer feed unit and aligned to the pickup head of the first pick-and-move unit, wherein, when the pickup head of the second pick-and-move unit is in the release position of the second pick-and-move unit, the pickup head of the second pick-and-move unit is directed away from the diced wafer held by the wafer feed unit and directed towards the carrier panel held by the carrier support unit.

* * * * *